(12) United States Patent
Ikegami et al.

(10) Patent No.: US 12,211,567 B2
(45) Date of Patent: Jan. 28, 2025

(54) MEMORY SYSTEM WITH VERIFY OPERATIONS OF ODD AND EVEN WORD LINES

(71) Applicant: Kioxia Corporation, Tokyo (JP)

(72) Inventors: Kazutaka Ikegami, Inagi (JP); Takashi Maeda, Kamakura (JP); Reiko Sumi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 162 days.

(21) Appl. No.: 17/816,836

(22) Filed: Aug. 2, 2022

(65) Prior Publication Data

US 2023/0197177 A1    Jun. 22, 2023

(30) Foreign Application Priority Data

Dec. 21, 2021   (JP) .................... 2021-207376

(51) Int. Cl.

| G11C 16/34 | (2006.01) |
|---|---|
| G11C 16/04 | (2006.01) |
| G11C 16/10 | (2006.01) |
| G11C 16/24 | (2006.01) |
| G11C 16/26 | (2006.01) |
| G11C 16/30 | (2006.01) |

(52) U.S. Cl.
CPC ...... *G11C 16/3481* (2013.01); *G11C 16/0483* (2013.01); *G11C 16/10* (2013.01); *G11C 16/24* (2013.01); *G11C 16/26* (2013.01); *G11C 16/30* (2013.01)

(58) Field of Classification Search
CPC . G11C 16/3481; G11C 16/0483; G11C 16/10; G11C 16/24; G11C 16/26; G11C 16/30
See application file for complete search history.

(56) References Cited

U.S. PATENT DOCUMENTS

| RE46,264 | E | * | 1/2017 | Hemink | G11C 16/3418 |
|---|---|---|---|---|---|
| 9,721,671 | B2 | * | 8/2017 | Chu | G11C 7/12 |
| 10,811,105 | B2 | * | 10/2020 | Futatsuyama | H10B 43/35 |
| 11,139,037 | B2 | * | 10/2021 | Maeda | G11C 16/08 |
| 2017/0236595 | A1 | | 8/2017 | Maejima et al. | |
| 2017/0271021 | A1 | | 9/2017 | Futatsuyama et al. | |
| 2018/0277565 | A1 | | 9/2018 | Futatsuyama et al. | |

FOREIGN PATENT DOCUMENTS

| JP | 2017-142874 A | 8/2017 |
|---|---|---|
| JP | 2017-168163 A | 9/2017 |
| JP | 2018-164070 A | 10/2018 |

* cited by examiner

*Primary Examiner* — Vanthu T Nguyen
(74) *Attorney, Agent, or Firm* — Oblon, McClelland, Maier & Neustadt, L.L.P.

(57) ABSTRACT

A memory system according to an embodiment includes a first bit line, a source line, a first word line, a second word line, a first memory pillar and a control circuit. The control circuit performs a first verify operation to first and second memory cells, a second verify operation to the first memory cell, a third verify operation to the second memory cell and a write operation or a read operation with a lower voltage in accordance with a request from an external device.

12 Claims, 40 Drawing Sheets

MEMORY SYSTEM WITH VERIFY OPERATIONS OF ODD AND EVEN WORD LINES

CROSS REFERENCE TO RELATED APPLICATIONS

This application claims the benefit of priority to Japanese Patent Application No. 2021-207376, filed on Dec. 21, 2021, the entire contents of which are incorporated herein by reference.

FIELD

An embodiment of the invention relates to a memory system with a storage device.

BACKGROUND

A memory system comprising a NAND flash memory as a semiconductor storage device and a controller for controlling the NAND flash memory is known.

DESCRIPTION OF EMBODIMENTS

Figure 1:
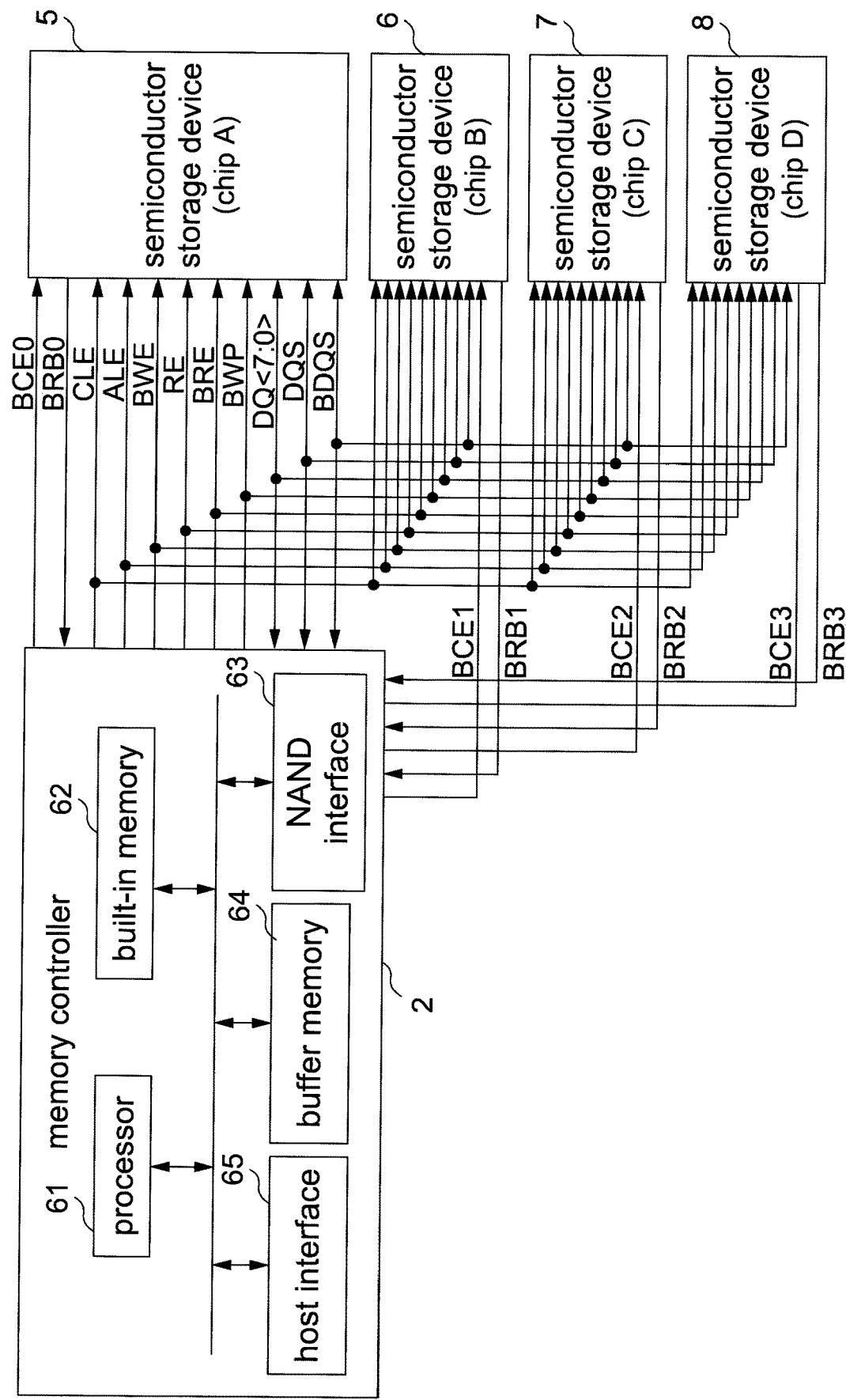
FIG. 1 is a block diagram for explaining a configuration of a signal system of a memory system according to an embodiment.

The accuracy of a read operation and a write operation of a memory system is improved.

A memory system according to an embodiment includes: a first bit line; a source line extending in a first direction and a second direction intersecting the first direction; i-layers (i is an integer equal to or larger than 2) of first word lines adjacent to the source line in a third direction intersecting the first direction and the second direction, the first word lines being stacked in the third direction; i-layers of second word lines adjacent to the source line in the third direction, the second word lines being stacked in the third direction, positions of i-layers of the second word lines being the same as positions of i-layers of the first word lines in the third direction, respectively; a first memory pillar between the first word lines and the second word lines, the first memory pillar extending in the third direction, a first semiconductor layer connected to the first bit line and the source line; and a control circuit. The first memory pillar includes a first string provided in a first side of the first memory pillar and a second string provided in a second side of the first memory pillar. The first string is provided between the first bit line and the source line, and includes a first transistor, a second transistor closer to the source line than the first transistor and i-first memory cells. The i-first memory cells are provided between the first transistor and the second transistor. The first transistor, the second transistor and the i-first memory cells are electrically connected in series. The i-first memory cells are electrically connected in series, are arranged along the third direction, and are connected to the i-first word lines, respectively. The second string is provided between the first bit line and the source line, and includes a third transistor, a fourth transistor and i-second memory cells. The i-second memory cells are provided between the third transistor and the fourth transistor. The third transistor, the fourth transistor and the i-second memory cells are electrically connected in series. The i-second memory cells are electrically connected in series, are arranged along the third direction, and are connected to the i-second word lines, respectively. The i-first memory cells and the i-second memory cells share the first semiconductor layer. The control circuit is configured to perform a first verify operation to one of the first memory cells and one of the second memory cells corresponding thereto while supplying a first voltage to the source line after a first program operation is performed to the one of the first memory cells and the one of the second memory cells, perform a second verify operation to the one of the first memory cells while supplying a second voltage to the source line after a second program operation is performed to the one of the first memory cells, perform a third verify operation to the one of the second memory cells while supplying a third voltage to the source line after a third program operation is performed to the one of the second memory cells, and perform, in accordance with a request from an external device, the write operation or the read operation to the one of the first memory cells or the one of the second memory cells while supplying a fourth voltage lower than the first voltage, the second voltage and the third voltage to the source line.

Hereinafter, a memory system according to the present embodiments is described in detail by referring to the drawings. In the following description, elements having substantially the same functions and configurations are denoted by the same reference numerals and are described redundantly only when necessary. Each of the embodiments described below exemplifies a device and a method for embodying the technical idea of this embodiment. The technical idea of the embodiment is not limited as the material, shape, structure, arrangement and the like of the constituent parts described below. Various modifications may be made to the technical idea of the embodiment in addition to the scope of the claims.

Further, in the following description, signals X<n:0> ("n" is a natural number) are made up of (n+1)-bit signals, and mean a group of signals X<0>, X<1>, . . . , and X<n>, each of which is a 1-bit signal. In addition, elements Y<n:0> mean a group of elements Y<0>, Y<1>, . . . , and Y<n>, which correspond to the input or output of the signals X<n:0> in a one-to-one relationship.

In the following description, a signal BZ indicates that it is an inverted signal of a signal Z. Alternatively, when the signal Z is a control signal, the signal Z is a positive logic and the signal BZ is a negative logic. That is, the "H" level of the signal Z corresponds to assertion, and the "L" level of the signal Z corresponds to negation. The "L" level of the signal BZ corresponds to assertion, and the "H" level of the signal Z corresponds to negation.

1. First Embodiment

A memory system according to a first embodiment will be described with reference to FIG. 1 to FIG. 20.

1-1. Overall Configuration of Memory System

FIG. 1 is a block diagram for explaining a configuration of a signal system of the memory system according to an embodiment. As shown in FIG. 1, the memory system 1 according to the first embodiment includes a memory controller 2 and semiconductor memory devices 5 to 8. The memory controller 2 is connected to the semiconductor memory devices 5 to 8 by a bus. A nonvolatile memory such as NAND flash memory is used as the semiconductor memory devices 5 to 8. The memory controller 2 controls the operation of the semiconductor memory devices 5 to 8.

The memory controller 2 communicates, for example, with an external host device (not shown). The memory controller 2 performs a write operation to the semiconductor memory devices 5 to 8 and a read operation from the semiconductor memory devices 5 to 8 in response to a write request and a read request received from the host device. When the read operation is executed, the memory controller 2 transmits the data stored in the semiconductor memory devices 5 to 8 to the host device.

The semiconductor memory devices 5 to 8 include a plurality of memory cells and store data in a nonvolatile manner. The semiconductor memory devices 5 to 8 are semiconductor chips capable of identifying an individual. For example, the semiconductor memory devices 5 to 8 are identified by individual chip enable signals. Alternatively, the semiconductor memory devices 5 to 8 are identified by assigning individual chip addresses to the respective semiconductor memory devices in advance. Accordingly, the semiconductor memory devices 5 to 8 are independently controlled by instructions from the memory controller 2.

The memory controller 2 transmits various signals to the semiconductor memory devices 5 to 8 via the bus, and receives various signals from the semiconductor memory devices 5 to 8. The bus includes a plurality of signal lines, and transmits and receives the signals in accordance with instructions transmitted from the memory controller 2.

FIG. 1 illustrates the signals transmitted and received between the memory controller 2 and the semiconductor memory device 5. BCE0 to 3 are the chip enable signals and operate with negative logics. BRB0 to 3 are ready busy signals and operate with negative logics. CLE is a command latch enable signal and operates with positive logics. ALE is an address latch enable signal and operates with positive logics. BWE is a write enable signal and operates with negative logics. RE and BRE are read enable signals, and these logics have mutually inverted relationships. For example, BRE is an inverted signal of RE. For example, RE and BRE function as an output instruction signal. BWP is a write protect signal and operates with negative logics.

DQ<7:0> is a data signal. The data signal DQ<7:0> is input and output via the input/output terminal (I/O port). For example, signals DQS and BDQS are data strobe signals, and their logics are inversely related to each other. For example, the strobe signal (DQS/BDQS) is a signal pair having opposite phases. The strobe signal is a signal defining timing of transmitting and receiving the data signal DQ<7:0>.

The signals BCE0 to BCE3 are transmitted independently from the memory controller 2 to each of the semiconductor memory devices 5 to 8, respectively. The signals BRB0 to BRB3 are transmitted independently from each of the semiconductor memory devices 5 to 8 to the memory controller 2, respectively. The signals CLE, ALE, BWE, RE, BRE and BWP are commonly transmitted from the memory controller 2 to the semiconductor memory devices 5 to 8.

The signals BCE0 to BCE3 are signals for enabling the semiconductor memory devices 5 to 8, respectively. The signal CLE notifies the semiconductor memory devices 5 to 8 that the data signals DQ<7:0> flowing to the semiconductor memory devices 5 to 8 are commands while the signal CLE is at the "high (H)" level. The signal ALE notifies the semiconductor memory devices 5 to 8 that the data signals DQ<7:0> flowing to the semiconductor memory devices 5 to 8 are addresses while the signal ALE is at the "H" level. The signal BWE instructs the semiconductor memory devices 5 to 8 to write the data signals DQ<7:0> flowing to the semiconductor memory devices 5 to 8 while the signal BWE is at the "low (L)" level.

The signals RE and BRE are signals for instructing the semiconductor memory devices 5 to 8 to output the data signals DQ<7:0>. For example, the signals RE and BRE are signals for controlling the operation timing of the semiconductor memory devices 5 to 8 when the data signal DQ<7:0> is output. The signal BWP is a signal for instructing the semiconductor memory devices 5 to 8 to inhibit the data write operation and the data erase operation. The signals BRB0 to BRB3 are signals for indicating whether the semiconductor memory devices 5 to 8 are in a ready state (a state in which the semiconductor memory device is operating) or in a busy state (a state in which the semiconductor memory device is not operating), respectively.

The data signals DQ<7:0> are, for example, 8-bit signals. The data signals DQ<7:0> are data signals transmitted and received between the semiconductor memory devices 5 to 8 and the memory controller 2, and include commands, addresses, and data to be stored. The signals DQS and BDQS may be generated, for example, based on the signals RE and BRE, and are used to control the operation timing of the semiconductor memory devices 5 to 8 in response to the data signals DQ<7:0>.

The memory controller 2 includes a processor 61, a built-in memory 62, a NAND interface circuit 63, a buffer memory 64 and a host interface circuit 65.

The processor 61 is, for example, a central processing unit (CPU), and controls operations of the entire memory controller 2. For example, the processor 61 issues a write instruction to the semiconductor memory devices 5 to 8 via the NAND interface circuit 63 in response to a request for writing data received from the outside. This function is common to not only the write operation mentioned above but also a read operation, an erase operation, a calibration operation, and the like.

The built-in memory 62 is, for example, a semiconductor memory such as, Random Access Memory (RAM), Dynamic RAM (DRAM), and is used as a work area of the processor 61. The built-in memory 62 holds, for example, firmware and various management tables for managing the semiconductor memory devices 5 to 8.

The NAND interface circuit 63 is connected to the semiconductor memory devices 5 to 8 via the above-described bus, and executes communication with the semiconductor memory devices 5 to 8. The NAND interface circuit 63 transmits commands, addresses, and write data to the semiconductor memory devices 5 to 8 in response to an instruction of the processor 61. In addition, the NAND interface circuit 63 receives statuses and read data from the semiconductor memory devices 5 to 8.

The buffer memory 64 temporarily holds, for example, data received by the memory controller 2 from the semiconductor memory devices 5 to 8 and the outside.

The host interface circuit 65 is connected to an external host device (not illustrated), and executes communication with the host device. The host interface circuit 65 transfers, for example, commands (instruction) and data, received from the host device to the processor 61 and the buffer memory 64, respectively.

1-2. Configuration of the Semiconductor Memory Device

The configuration of the semiconductor memory device according to the first embodiment is described with reference to FIG. 2. The semiconductor memory devices 5 to 8 have, for example, the same configuration. Therefore, in the following description, a configuration of the semiconductor memory device 5, among the semiconductor memory devices 5 to 8, is described, and a description related to a configuration of the semiconductor memory devices 6 to 8 is omitted.

Figure 2:
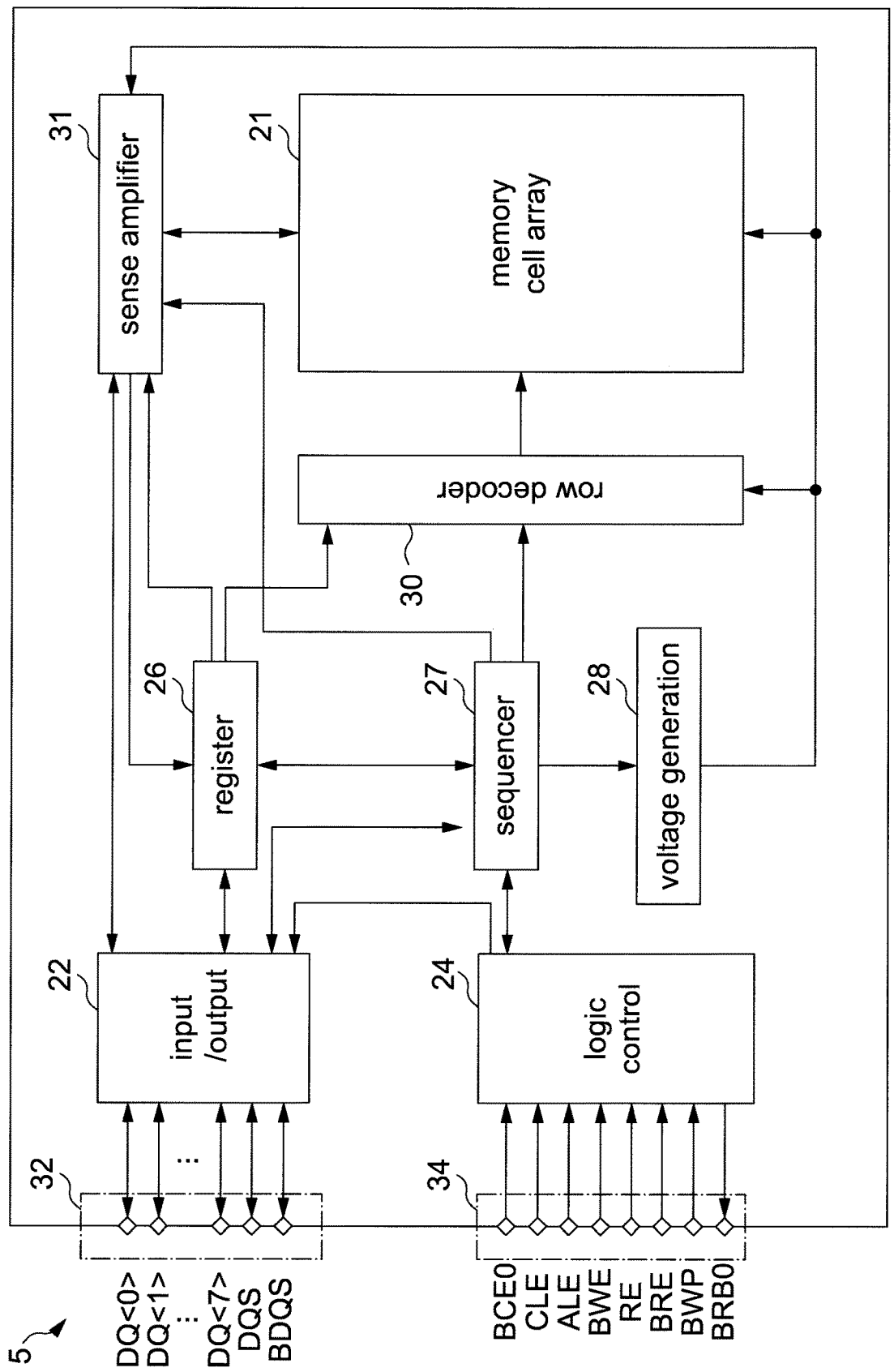
FIG. 2 is a block diagram for explaining a configuration of a semiconductor memory device according to an embodiment.

As illustrated in FIG. 2, the semiconductor memory device 5 includes a memory cell array 21, an input/output circuit 22, a logic control circuit 24, a register 26, a sequencer 27, a voltage generation circuit 28, a row decoder 30, a sense amplifier 31, an input/output pad group 32, a ZQ calibration pad 33 and a logic-control pad group 34.

As will be described in detail later, the memory cell array 21 includes a plurality of nonvolatile memory cells (not illustrated) associated with word lines and bit lines.

The input/output circuit 22 transmits and receives the data signals DQ<7:0> to and from the memory controller 2. The input/output circuit 22 transfers commands and addresses in the data signals DQ<7:0> to the register 26. The input/output circuit 22 transmits and receives write data and read data to and from the sense amplifier 31.

The logic control circuit 24 receives the signals BCE0, CLE, ALE, BWE, RE, BRE and BWP from the memory controller 2. In addition, the logic control circuit 24 transfers the signal BRB0 to the memory controller 2 and notifies the state of the semiconductor memory device 5 to the memory controller 2.

The register 26 holds commands and addresses. The register 26 transfers the addresses to the row decoder 30 and the sense amplifier 31, and transfers the commands to the sequencer 27. The sequencer 27 receives the commands, and controls the entire semiconductor memory device 5 according to the sequence based on the received commands. The sequencer 27 may be referred as a "control circuit".

The voltage generating circuit 28 generates a voltage necessary for the write operation of the data, the read operation of the data, and erase operation of the data or the like based on an instruction from the sequencer 27. The voltage generating circuit 28 includes a plurality of drivers, and supplies the generated voltage to the row decoder 30 and the sense amplifier 31 under the control of the sequencer 27. For example, the voltage generating circuit 28 supplies the voltage generated in the corresponding row decoder 30 based on the row address included in the indicated address.

The row decoder 30 selects the memory cells in the row based on the row address included in the indicated address in accordance with the control by the sequencer 27. Then, the voltages provided from the driver set 29 are applied to the memory cells in the selected row via the row decoder 30.

At the time of the read operation, the sense amplifier 31 senses the read data that is read from the memory cells to the bit lines, and transfers the sensed read data to the input/output circuit 22. At the time of the write operation, the sense amplifier 31 transfers the write data via the bit lines to the memory cells. In addition, the sense amplifier 31 transmits data corresponding to a column address included in the indicated address to the input/output circuit 22 in accordance with the control by the sequencer 27.

The input/output pad group 32 transfers the data signal DQ<7:0>, the signal DQS and the signal BDQS, received from the memory controller 2, to the input/output circuit 22. In addition, the input/output pad group 32 transfers the data signal DQ<7:0> received from the input/output circuit 22 to the memory controller 2.

The logic control pad group 34 transfers the signals BCE0, CLE, ALE, BWE, RE, BRE and BWP received from the memory controller 2 to the logic control circuit 24. The logic control pad group 34 transfers BRB0 received from the logic control circuit 24 to the memory controller 2.

1-3. Configuration of Memory Cell Array 21

Figure 3:
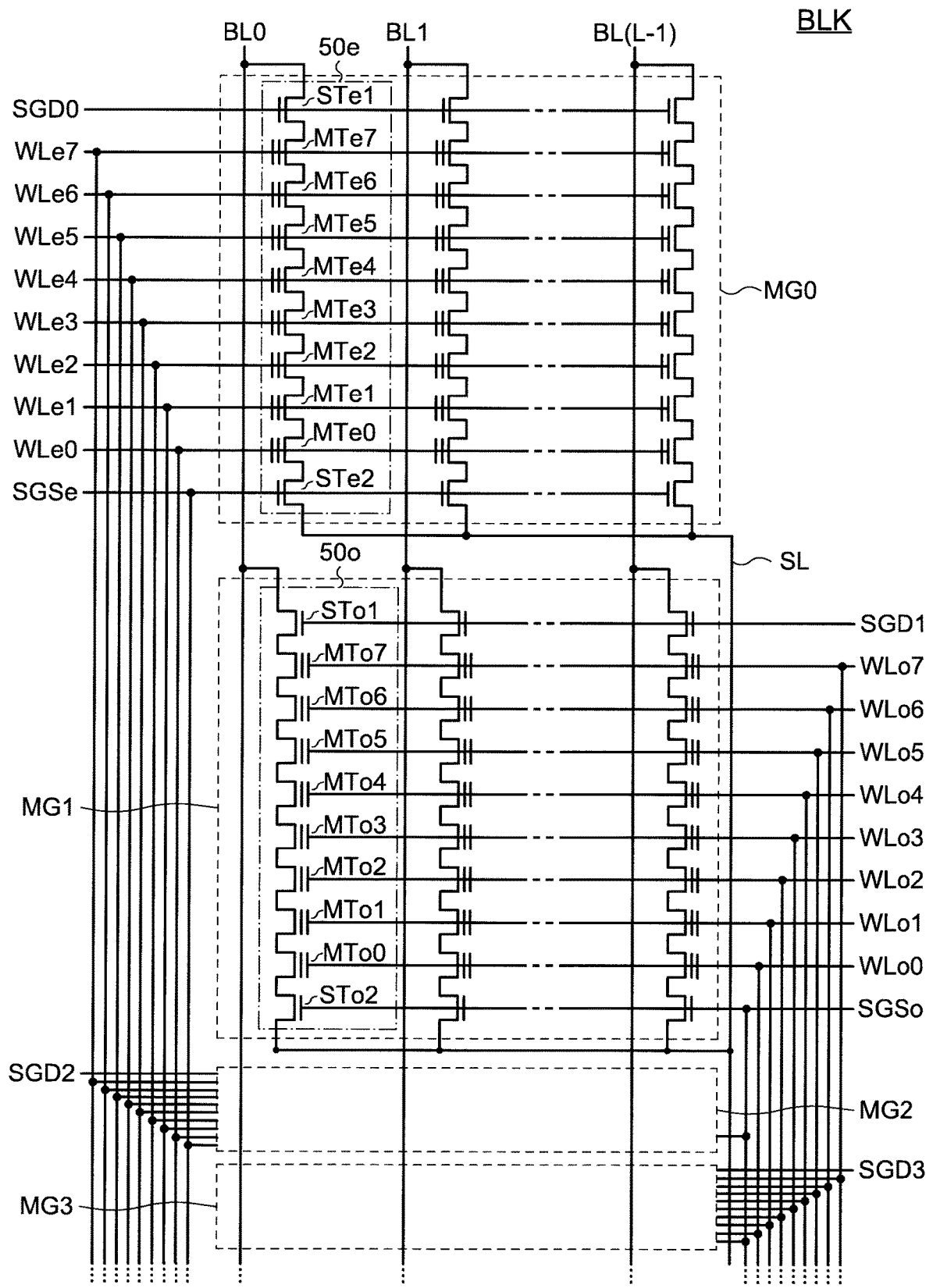
FIG. 3 is a diagram showing a circuit configuration of a memory cell array of a semiconductor memory device according to an embodiment.

The circuit configuration of the memory cell array 21 will be described with reference to FIG. 3. FIG. 3 is an equivalent circuit diagram of a block BLK. As shown in the figure, the block BLK includes a plurality of memory groups MG (MG0, MG1, MG2, ... ). The memory group MG includes a plurality of strings 50. In the following description, a string of an even-numbered memory group MGe (MG0, MG2, MG4, ... ) is referred to as a string 50e. A string of an odd-numbered memory group MGo (MG1, MG3, MG5, ... ) is referred to as a string 50o.

The strings 50 includes, for example, eight memory cell transistors MT (MT0 to MT7) and select transistors ST1 and ST2. The memory cell transistor MT includes a control gate and a charge storage layer. The memory cell transistor MT has a threshold voltage and is in a conductive state (ON state) when a voltage equal to or higher than the threshold voltage is applied to the control gate. When the write operation to the memory cell transistor MT is performed, the threshold voltage of the memory cell transistor MT varies.

That is, the threshold voltage of the memory cell transistor MT varies when electrons are injected into the charge storage layer of the memory cell transistor MT. The threshold voltage of the memory cell transistor MT in a state where electrons are injected into the charge storage layer is higher than the threshold voltage of the memory cell transistor MT in a state where no electrons are injected into the charge storage layer. The memory cell transistor MT holds data in a non-volatile manner by variations of the threshold voltage due to the injection of electrons into the charge storage layer. The eight memory cell transistors MT are connected in series between a source of the select transistor ST1 and a drain of a select transistor ST2.

The memory cell transistor and the selection transistor belonging to the string 50e are referred to as a memory cell transistor MTe (MTe0 to MTe7), and a selection transistor STe (STe1, STe2), respectively. The memory cell transistor and the selection transistor belonging to the string 50o are referred to as a memory cell transistor MTo (MTo0 to MTo7), and a selection transistor STo (STo1, STo2), respectively. In the case where it is not necessary to distinguish the memory cell transistors MTe and MTo from each other in particular, the memory cell transistor is simply referred to as the memory cell transistor MT as described above. In the case where it is not necessary to distinguish the selection transistor STe and STo in particular, the selection transistor is simply referred to as the selection transistor ST as described above.

Gates of the select transistor ST1 in the memory groups MG are connected to select gate lines SGD (SGD0, SGD1, ... ) respectively. The select gate line SGD is independently controlled by the row decoder 30. The gate of the select transistor ST2 in the even-numbered memory groups MGe (MG0, MG2, ... ) are commonly connected to a select gate line SGSe. The gate of the select transistor ST2 in the odd-numbered memory groups MGo (MG1, MG3, ... ) are commonly connected to a select gate line SGSo. The select gate lines SGSe and SGSo may be commonly controllable or independently controllable.

The control gates of the memory cell transistors MTe (MTe0 to MTe7) connected to different bit lines BL and included in the memory group MGe in the same block BLK are commonly connected to word lines WLe (WLe0 to WLe7), respectively. On the other hand, the control gates of the memory cell transistors MTo (MTo0 to MTo7) connected to different bit lines BL and included in the memory group MGo are commonly connected to word lines WLo (WLo0 to WLo7), respectively. The word lines WLe and WLo are independently controlled by the row decoder 30.

The block BLK is, for example, an erasure unit of data. That is, data held by the memory cell transistors MT included in the same block BLK are collectively erased. The threshold voltage of the memory cell transistor MT in a state in which data has been erased (an erased state) is lower than the threshold voltage of the memory cell transistor MT in a state in which data has been written (a written state).

In the memory cell array 21, the drains of the select transistors ST1 included in the plurality of strings 50 provided in the same column are commonly connected to a common bit line BL (BL0 to BL(L−1)). L is a natural number of 3 or more. In the memory cell array 21, the sources of the plurality of select transistors ST2 are commonly connected to a source line SL.

In other words, the plurality of strings 50 included in the memory group MG are connected to different bit lines BL and connected to the common select gate line SGD. The plurality of memory groups MG included in the block BLK are connected to the common word line WL. The plurality of blocks BLK included in the memory cell array 21 are connected to the common bit line BL. In the memory cell array 21, the select gate line SGS, the word line WL, and the select gate line SGD are stacked above a semiconductor substrate so that the memory cell transistor MT is stacked in three dimensions.

<Planar Layout of Memory Cell Array>

Figure 4:
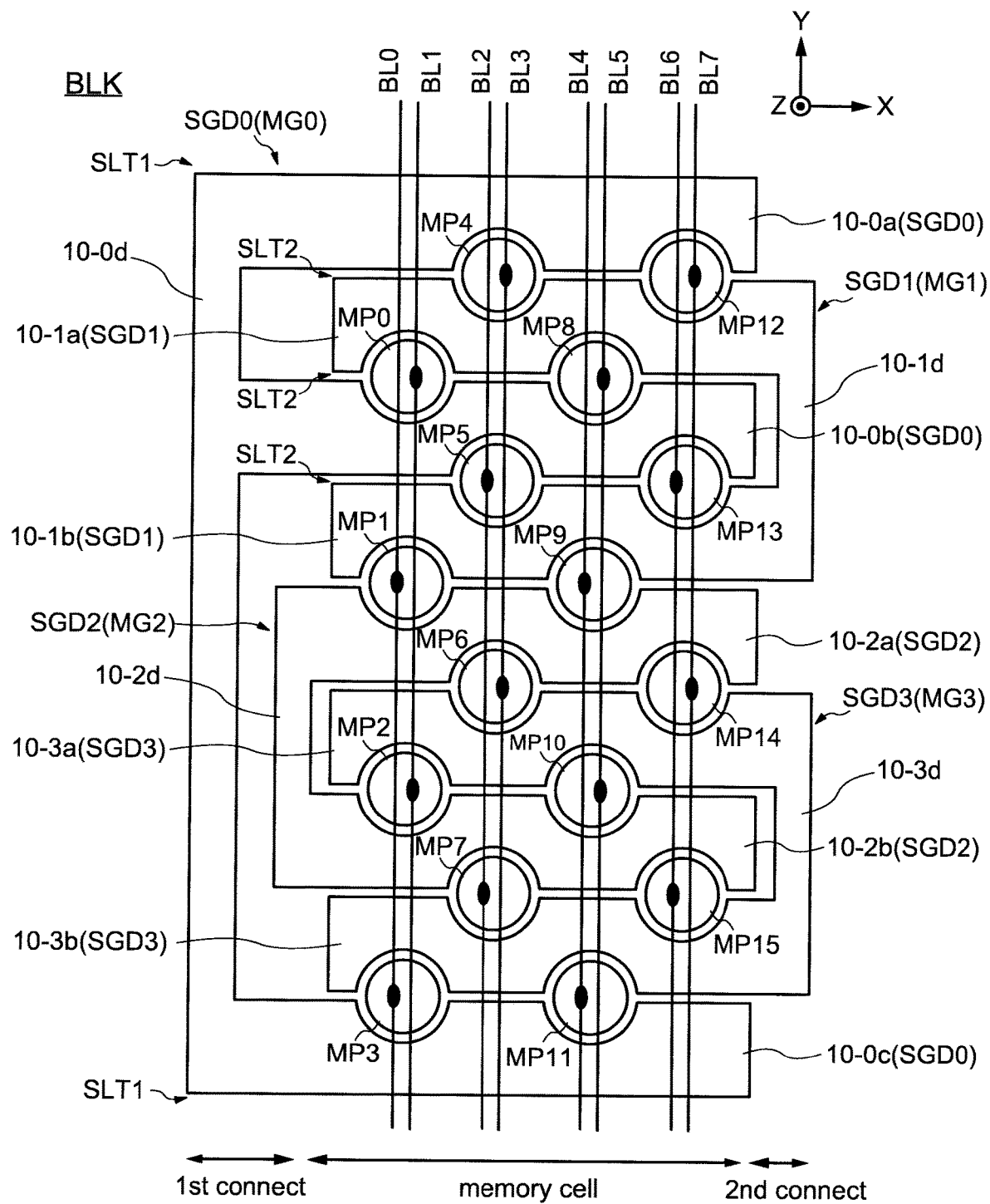
FIG. 4 is a diagram showing a layout of a select gate line, a bit line, and a memory pillar of a semiconductor memory device according to an embodiment.

A planar configuration of the memory cell array 21 will be described with reference to FIG. 4. FIG. 4 shows a planar layout of the select gate line SGD, the bit line BL and the memory pillar MP in a semiconductor substrate plane (X-Y plane) of a certain block BLK. In the present embodiment, a configuration in which four select gate lines SGD0-SGD3 are included in one block BLK is described.

As shown in FIG. 4, wiring layers 10-0a, 10-0b, 10-0c having a longitudinal in the X-direction are connected by a first connecting section 10-0d (a 1st connect) having a longitudinal in the Y-direction. The two wiring layers 10-0a, 10-0c are connected to both ends of the first connecting section 10-0d in the Y-direction. The wiring layers 10-0a, 10-0b are adjacent to each other in the Y-direction with the other one wiring layer (a wiring layer 10-1a) interposed therebetween. The first connecting section 10-0d is connected to each of the first end of the wiring layers 10-0a, 10-0b, 10-0c in the X-direction. Three wiring layers 10-0a, 10-0b, 10-0c function as the select gate line SGD0.

The wiring layers 10-1a, 10-1b having the longitudinal in the X-direction are connected by a second connecting section 10-1d (a 2nd connect) having the longitudinal in the Y-direction. The two wiring layers 10-1a, 10-1b are connected to both ends of the second connecting section 10-1d in the Y-direction. The wiring layer 10-1a is connected between the wiring layers 10-0a, 10-0b. The wiring layer 10-1b is provided between the wiring layer 10-0b and the other one wiring layer (a wiring layer 10-2a). The second connecting section 10-1d is connected to each second end (an end at opposite side where the first connecting section 10-0d is provided with respect to the wiring layers 10-1a, 10-1b) of wiring layers 10-1a, 10-1b in the X-direction. The two wiring layers 10-1a, 10-1b function as the select gate line SGD1.

The wiring layers 10-2a, 10-2b each having a longitudinal in the X-direction are connected by a first connecting section 10-2d having a longitudinal in the Y-direction. The two wiring layers 10-2a, 10-2b are connected to both ends of the first connecting section 10-2d in the Y-direction. The wiring layer 10-2a is provided between the wiring layer 10-1b and the wiring layer 10-3a. The wiring layer 10-2b is provided between the wiring layer 10-3a and the wiring layer 10-3b. The first connecting section 10-2d is connected to the first end of each of the wiring layers 10-2a, 10-2b in the X-direction (based on the wiring layers 10-2a, 10-2b, the same side of the end on which the first connecting section 10-0d is provided). The two wiring layers 10-2a, 10-2b function as the select gate lines SGD2.

The wiring layers 10-3a, 10-3b each having a longitudinal in the X-direction are connected by a second connecting section 10-3d having a longitudinal in the Y-direction. The two wiring layers 10-3a, 10-3b are connected to both ends of the second connecting section 10-3d in the Y-direction. The wiring layer 10-3a is provided between the wiring layer 10-2a and the wiring layer 10-2b. The wiring layer 10-3b is provided between the wiring layer 10-2b and the wiring layer 10-0c. The second connecting section 10-3d is connected to the second end of the wiring layers 10-3a, 10-3b in the X-direction (based on the wiring layers 10-3a, 10-3b, the opposite side of the end on which the first connecting section 10-0d is provided). The two wiring layers 10-3a, 10-3b function as the select gate lines SGD3.

In the present embodiment, a configuration in which wiring layers mentioned above are connected by the first connecting sections 10-0d, 10-2d, or the second connecting sections 10-1d, 10-3d is exemplified but is not limited to this configuration. For example, these wiring layers may be independent and controlled so that the same voltage is supplied to the wiring layers 10-0a, 10-0b, 10-0c, the same voltage is supplied to the wiring layers 10-1a, 10-1b, the same voltage is supplied to the wiring layers 10-2a, 10-2b, and the same voltage is supplied to the wiring layers 10-3a, 10-3b.

The wiring layers 10 adjacent to each other in the Y-direction in the block BLK are insulated. An area that insulates the adjacent wiring layers 10 is referred to as a slit SLT2. In the slit SLT2, for example, an insulation layer is embedded in an area from a surface of the semiconductor substrate to a layer where at least the wiring layer 10 is provided. In the memory cell array 21, for example, the plurality of blocks BLK which are the same as the blocks BLK shown in FIG. 4 is arranged, in the Y-direction. The blocks BLK adjacent to each other in the Y-direction are also insulated in the same manner as described above. An area that insulates the adjacent blocks BLK is referred to as a slit SLT1. The slit SLT1 has the same configuration as the slit SLT2.

A plurality of memory pillars MP (MP0 to MP15) is provided between the wiring layers 10 adjacent to each other in the Y-direction. The plurality of memory pillars MP has the longitudinal in a Z-direction. The Z-direction is a direction orthogonal (or intersecting) to the X-Y direction, that is, a direction orthogonal to the surface of the semiconductor substrate. The plurality of memory pillars MP is provided in a memory cell area.

Specifically, the memory pillars MP4, MP12 are provided between the wiring layers 10-0a, 10-1a. The memory pillars MP0, MP8 are provided between the wiring layers 10-1a, 10-0b. The memory pillars MP5, MP13 are provided between the wiring layers 10-0b, 10-1b. The memory pillars MP1, MP9 are provided between the wiring layers 10-1b, 10-2a. The memory pillars MP6, MP14 are provided between the wiring layers 10-2a, 10-3a. The memory pillars MP2, MP10 are provided between the wiring layers 10-3a, 10-2b. The memory pillars MP7, MP15 are provided between the wiring layers 10-2b, 10-3b. The memory pillars MP3, MP11 are provided between the wiring layers 10-3b, 10-0c.

The memory pillar MP is a structure body in which the select transistors ST1, ST2, and the memory cell transistor MT are configured. A detailed structure of the memory pillar MP will be described later.

The memory pillars MP0 to MP3 are arranged along the Y-direction. The memory pillars MP8 to MP11 are arranged along the Y-direction at positions adjacent to the memory pillars MP0 to MP3 in the X-direction. In other words, the memory pillars MP0 to MP3 and the memory pillars MP8 to MP11 are arranged in parallel.

The memory pillars MP4 to MP7 and MP12 to MP15 are arranged along the Y-direction. The memory pillars MP4 to MP7 are located between the memory pillars MP0 to MP3 and the memory pillars MP8 to MP11 in the X-direction. The memory pillars MP12 to MP15 are arranged along the Y-direction at positions adjacent to the memory pillars MP4 to MP7 in the X-direction. In other words, the memory pillars MP4 to MP7 and the memory pillars MP12 to MP15 are arranged in parallel.

A plurality of memory pillars MP0 to MP15 belong to a plurality of memory groups MG0 to MG3 as follows.

The memory group MG0 includes the memory pillars MP (MP0, MP3, MP4, MP5, MP8, MP11, MP12, MP13) adjacent to the wiring layers 10-0a, 10-0b, 10-0c (the select gate line SGD0).

The memory group MG1 includes the memory pillars MP (MP0, MP1, MP4, MP5, MP8, MP9, MP12, MP13) adjacent to the wiring layers 10-1a, 10-1b (the select gate line SGD1).

The memory group MG2 includes the memory pillars MP (MP1, MP2, MP6, MP7, MP9, MP10, MP14, MP15) adjacent to the wiring layers 10-2a, 10-2b (the select gate line SGD2).

The memory group MG3 includes the memory pillars MP (MP2, MP3, MP6, MP7, MP10, MP11, MP14, MP15) adjacent to the wiring layers 10-3a, 10-3b (the select gate line SGD3).

The two bit lines BL0, BL1 are provided above the memory pillars MP0 to MP3. The bit line BL0 is commonly connected to the memory pillars MP1, MP3. The bit line BL1 is commonly connected to the memory pillars MP0, MP2.

Two bit lines BL2, BL3 are provided above the memory pillars MP4 to MP7. The bit line BL2 is commonly connected to the memory pillars MP5, MP7. The bit line BL3 is commonly connected to the memory pillars MP4, MP6.

Two bit lines BL4, BL5 are provided above the memory pillars MP8 to MP11. The bit line BL4 is commonly connected to the memory pillars MP9, MP11. The bit line BL5 is commonly connected to the memory pillars MP8, MP10.

Two bit lines BL6, BL7 are provided above the memory pillars MP12 to MP15. The bit line BL6 is commonly connected to the memory pillars MP13, MP15. The bit line BL7 is commonly connected to the memory pillars MP12, MP14.

In the present embodiment, in the Y-direction, the positions of the memory pillars MP0 to MP3, MP8 to MP11 are shifted by ½ of a distance between the memory pillars MP with respect to the positions of the memory pillars MP4 to MP7, MP12 to MP15. The memory pillars MP are provided between two adjacent wiring layers 10 in the Y-direction and embedded in a portion of the slit SLT2. The slit SLT2 exists between adjacent memory pillars (for example, between MP0 and MP1) in the Y-direction.

The memory pillar MP is not provided in an area between the wiring layers 10-0a and 10-0c adjacent to each other with the slit SLT1 interposed therebetween, that is, between the blocks BLK adjacent to each other, in the present embodiment. However, from the viewpoint of process stability, the area may be provided with a dummy memory pillar MP which is not connected to the bit line BL.

Figure 5:
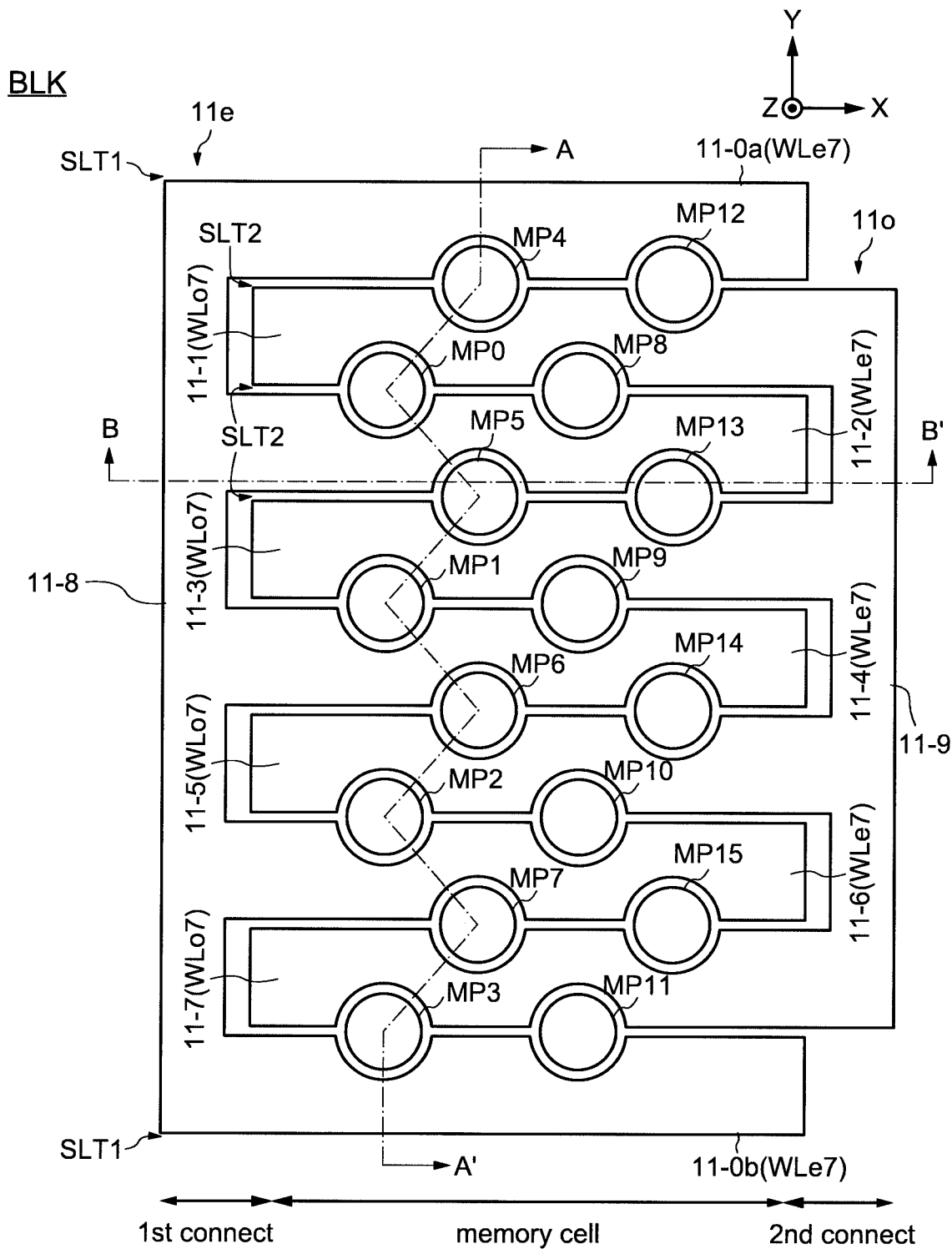
FIG. 5 is a diagram showing a layout of word lines and memory pillars of a semiconductor memory device according to an embodiment.

FIG. 5 shows a planar layout of the word lines WL in the X-Y plane, similar to FIG. 4. FIG. 5 is a planar layout of one block BLK and a planar layout of the wiring layer 11 provided in a lower layer than the wiring layer 10 described in FIG. 4, similar to FIG. 4.

As shown in FIG. 5, the wiring layers 11 (11-0a, 11-1 to 11-7, 11-0b) extending in the X-direction are arranged along the Y-direction. The wiring layer 11-0a, 11-1 to 11-7, 11-0b is provided in the lower layer of the wiring layers 10-0 to 10-7 via an insulation layer shown in FIG. 4.

The wiring layer 11 shown in FIG. 5 functions as a word line WL7. Other word lines WL0 to WL6 also have the same configuration and function as the word line WL7. The wiring layer 11 includes a wiring layer 11e (11-0a, 11-2, 11-4, 11-6, 11-0b, and a following first connecting section 11-8) that functions as a word line WLe7, and a wiring layer 11o (11-1, 11-3, 11-5, 11-7, and a following second connecting section 11-9) that functions as a word line WLo7.

The wiring layers 11-0a, 11-2, 11-4, 11-6, 11-0b having the longitudinal in the X-direction are connected by the first connecting section 11-8 (the 1st connect) having the longitudinal in the Y-direction. The first connecting section 11-8 is connected to each first end of the wiring layers 11-0a, 11-2, 11-4, 11-6, 11-0b in the X-direction. The wiring layers 11-0a, 11-2, 11-4, 11-6, 11-0b are connected to the row decoder 30 via the first connecting section 11-8.

The wiring layers 11-1, 11-3, 11-5, 11-7 having the longitudinal in the X-direction are connected by the second connecting section 11-9 (the 2nd connect) having the longitudinal in the Y-direction. The second connecting section 11-9 is connected to each second end of the wiring layers 11-1, 11-3, 11-5, 11-7 (based on the wiring layers 11-1, 11-3, 11-5, 11-7, the opposite side of the end on which the first connecting section 11-8 is provided) in the X-direction. The wiring layers 11-1, 11-3, 11-5, 11-7 are connected to the row decoder 30 via the second connecting section 11-9.

The plurality of memory pillars MP (MP0 to MP15) are provided in the memory cell area between the first connection section 11-8 and the second connection section 11-9. In the memory cell area, the memory cell is provided at a position where the memory pillar MP and the wiring layer 11 face each other. That is, a memory cell facing the wiring layer 11e and a memory cell facing the wiring layer 11o are provided in one memory pillar MP. In the memory cell area, the wiring layers 11 adjacent in the Y-direction are isolated by the slit SLT2 in the same manner as in FIG. 4. The wiring layers 11 between the blocks BLK adjacent to the Y-direction are also isolated by the slit SLT1 as shown in FIG. 4.

The select gate line SGS and the word lines WL0 to WL6 have the same configuration as the word line WL7 of FIG. 5.

<Cross-Sectional Structure of Memory Cell Array>

Figure 6:
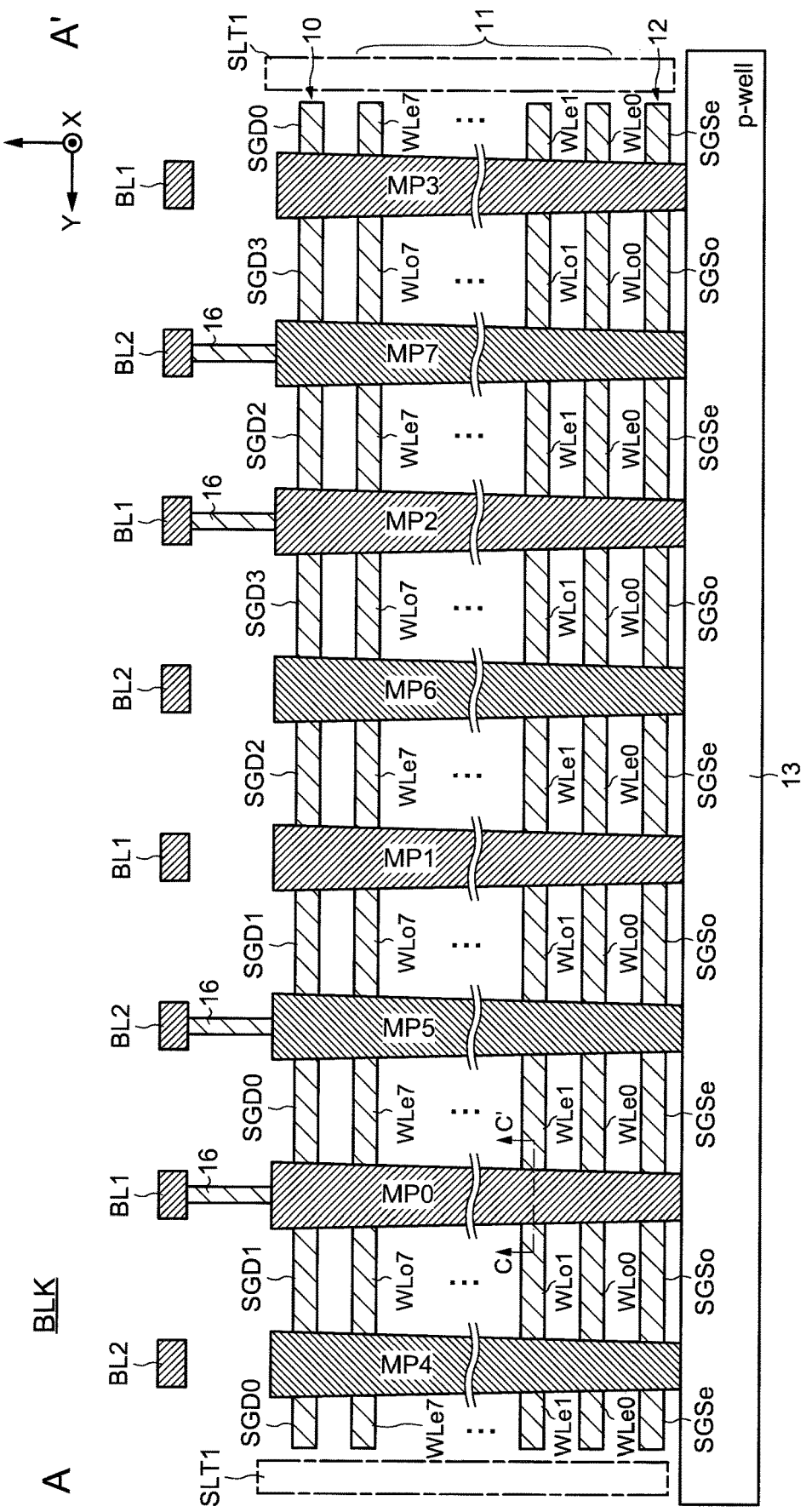
FIG. 6 is a cross-sectional view from A to A' of the semiconductor memory device shown in FIG. 5.

The cross-sectional structure of the memory cell array 21 will be described with reference to FIG. 6. FIG. 6 is a cross-sectional view from A to A' of the semiconductor memory device shown in FIG. 5.

As shown in FIG. 6, above a p-type well area (p-well) of a semiconductor substrate 13, a wiring layer 12 functioning as the select gate line SGS is provided. Above the wiring layer 12, eight wiring layers 11 functioning as the word lines WL0 to WL7 are stacked along the Z-direction. The planar layout of the wiring layers 11, 12 is similar to the layout shown in FIG. 5. Above the wiring layer 11, the wiring layer 10 functioning as the select gate line SGD is provided. The planar layout of the wiring layer 10 is the layout shown in FIG. 4.

The wiring layer 12 functions as the select gate line SGSo and the select gate line SGSe. The select gate lines SGSo, SGSe are alternately arranged in the Y-direction. The memory pillar MP is provided between the select gate lines SGSo, SGSe adjacent to each other in the Y-direction. A select transistor STo is provided in an area facing the select gate line SGSo in the memory pillar MP. A select transistor STe is provided in an area facing the select gate line SGSe in the memory pillar MP.

The wiring layer 11 functions as the word line WLo and the word line WLe. The word lines WLo and WLe are alternately arranged in the Y-direction. The memory pillar MP is provided between the word lines WLo, WLe adjacent to each other in the Y-direction. A memory cell described later is provided between the memory pillar MP and the word line WLo and between the memory pillar MP and the word line WLe. The memory cell transistor MTo is provided in an area facing the word line WLo in the memory pillar MP. The memory cell transistor MTe is provided in an area facing the word line WLe in the memory pillar MP.

The slit SLT1 is provided between the blocks BLK adjacent to each other in the Y-direction. As described above, the slit SLT1 is provided with an insulation layer. However, a contact plug or the like for supplying a voltage to an area provided in the semiconductor substrate 13 may be provided in the slit SLT1. For example, a contact plug or groove-shaped conductor for connecting the source of the select transistor ST2 to the source line may be provided in the slit SLT1.

The bit lines BL1, BL2 are provided on the memory pillar MP. A contact plug 16 for connecting each memory pillar MP and the bit line BL is provided between the memory pillar MP0 and the bit line BL1 and between the memory pillar MP2 and the bit line BL1. Similarly, the contact plug 16 for connecting each memory pillar MP and the bit line BL is provided between the memory pillar MP5 and the bit line BL2 and between the memory pillar MP7 and the bit line BL2. The other memory pillars MP are connected to the bit line BL1 or the bit line BL2 through the contact plug 16 in an area other than the cross section shown in FIG. 6.

Figure 7:
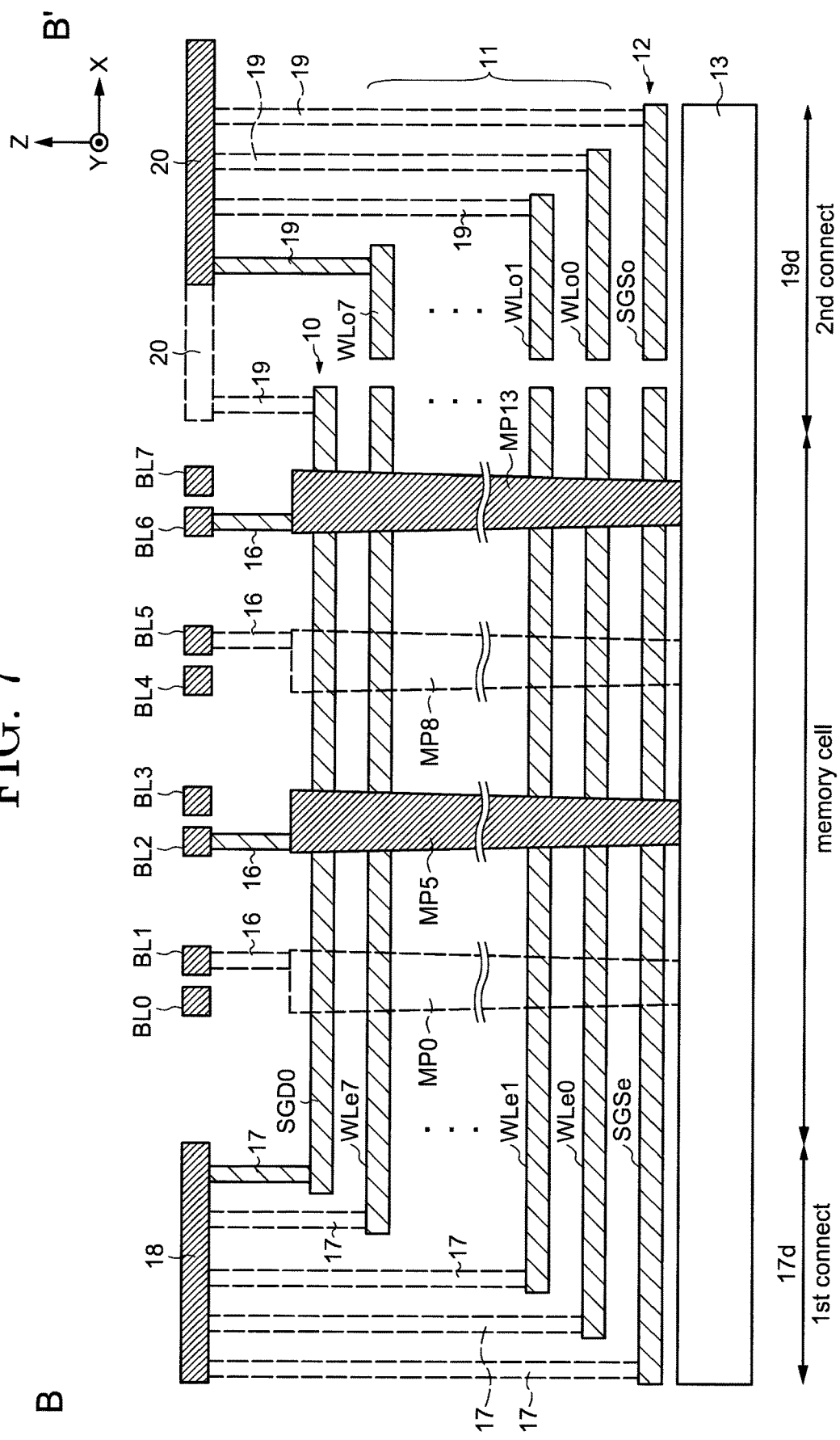
FIG. 7 is a cross-sectional view from B to B' of the semiconductor memory device shown in FIG. 5.

FIG. 7 is a cross-sectional view from B to B' of the semiconductor memory device shown in FIG. 5. As described in an explanation of FIG. 6, the wiring layers 12, 11, 10 are provided sequentially above the semiconductor substrate 13. In FIG. 7, the configuration existing in the depth direction of the cross-sectional view from B to B' is drawn by a dotted line.

In the first connecting area (the 1st connect) 17d, the wiring layers 10 to 12 are provided in a stepped shape. When the wiring layers 10 to 12 are viewed through the insulating layers from above the XY plane (the Z direction), the upper surface of the end portion of each of the eight wiring layers 11 and the upper surface of the end portion of one wiring layer 12 are exposed from the wiring layer provided thereon. The contact plugs 17 are connected to each of the exposed upper surface of the end portion mentioned above. The contact plugs 17 are connected to a metal wiring layer 18.

Although FIG. 7 illustrates a configuration in which the even select gate line SGD0 is connected to the metal wiring layer 18 through the contact plug 17, the even select gate lines SGD2, SGD4, SGD6, the even word lines WLe0 to WLe7, and the even select gate line SGSe are connected to the metal wiring layer 18 different from the metal wiring layer 18 shown in FIG. 7 through the contact plug 17 at positions different from that of FIG. 7 in the depth direction (Y-direction) of FIG. 7.

With the construction described above, the wiring layers 10 to 12 functioning as the even select gate lines SGD0, SGD2, SGD4, SGD6, even word lines WLe0 to WLe7, and even select gate line SGSe are electrically connected to the row decoder 30 via the metal wiring layers 18.

In the second connecting area (the 2nd connect) 19d, the wiring layers 10 to 12 are provided in a stepped shape in the same manner as described above. When the wiring layers 10 to 12 are viewed through the insulating layers from above the XY plane (the Z direction), the upper surface of the end portion of each of eight wiring layers 11 and the upper surface of the end portion of one wiring layer 12 are exposed from the wiring layer provided thereon. The contact plugs 19 are connected to the exposed upper surface of the end portion mentioned as described above. The contact plugs 19 are connected to a metal wiring layer 20.

Although FIG. 7 illustrates a configuration in which the word line WLo7 is connected to the metal wiring layer 20 through the contact plug 19, at a position different from that of FIG. 7 in the depth direction (Y-direction) of FIG. 7, the odd select gate lines SGD1, SGD3, SGD5, SGD7, the odd word lines WLo0 to WLo6, and the odd select gate line SGSo are connected to the metal wiring layer 20 different from the metal wiring layer 20 shown in FIG. 7 through the contact plug 19, respectively.

With the construction described above, the wiring layers 10 to 12 functioning as the odd select gate lines SGD1, SGD3, SGD5, SGD7, the odd word lines WLo0 to WLo7, and the odd select gate line SGSo are electrically connected to the row decoder 30 via the metal wiring layer 20.

The wiring layer 10 may be electrically connected to the row decoder 30 via the metal wiring layer 20 provided in the second connection region 19d instead of the metal wiring layer 18 provided in the first connection region 17d, or may be electrically connected to the row decoder 30 via both the metal wiring layer 18 provided in the first connection region 17d and the metal wiring layer 20 provided in the second connection region 19d.

<Structure of Memory Pillar and Memory Cell Transistor>

The structures of the memory pillar MP and the memory cell transistor MT will be described with reference to FIG. 8 and FIG. 9.

1-4. First Example

The configurations of the memory pillar MP and the memory cell transistor MT according to a first example will be described with reference to FIG. 8 and FIG. 9. FIG. 8 is a cross-sectional view from C to C' of the memory cell shown in FIG. 6. FIG. 9 is a cross-sectional view from D to D' of the memory cell shown in FIG. 8. In the first example, a floating gate type memory cell transistor MT is shown in which a conductive layer is used as the charge storage layer of the memory cell transistor MT.

Figure 8:
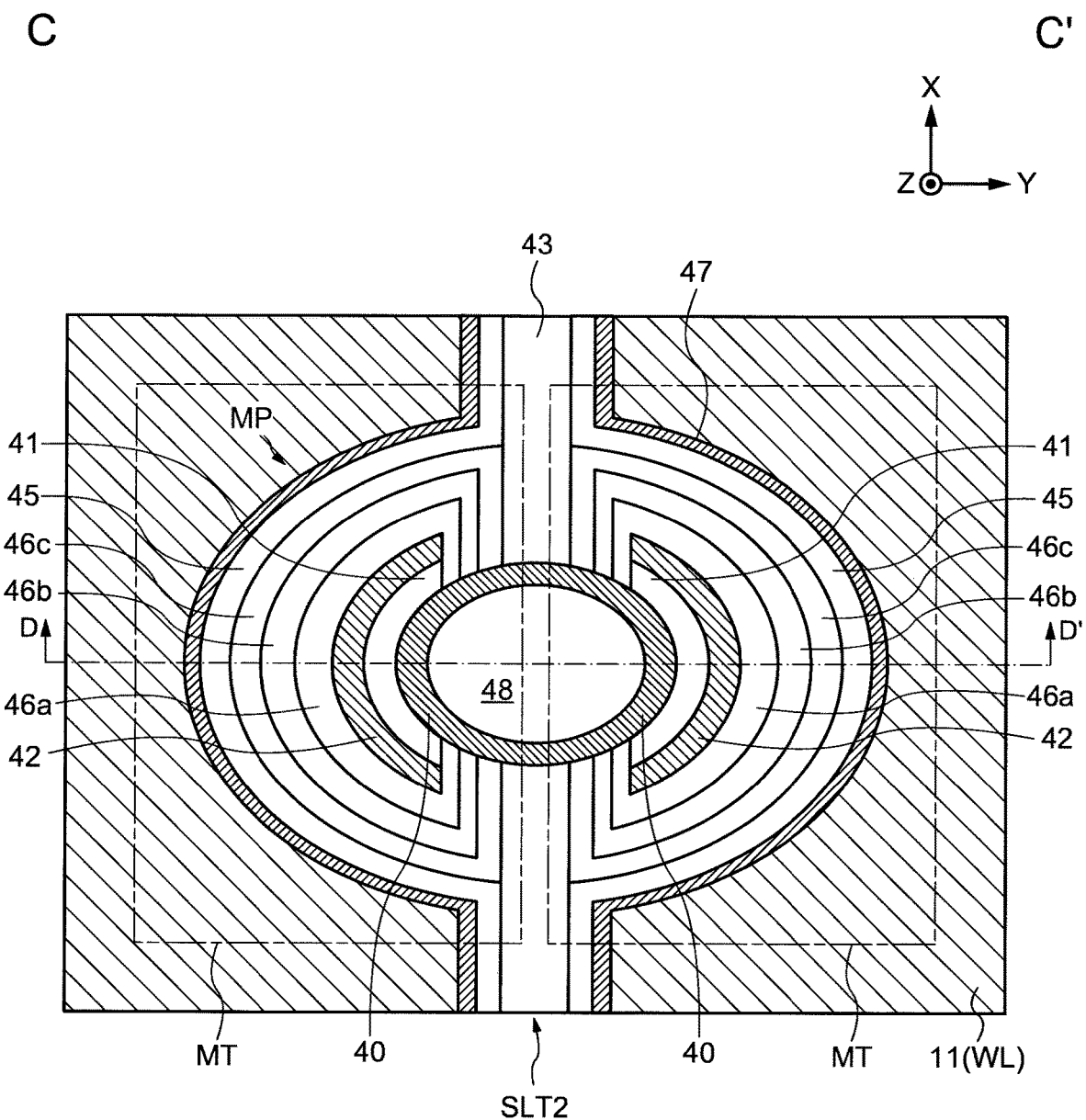
FIG. 8 is a cross-sectional view from C to C' of the memory cell shown in FIG. 6.
Figure 9:
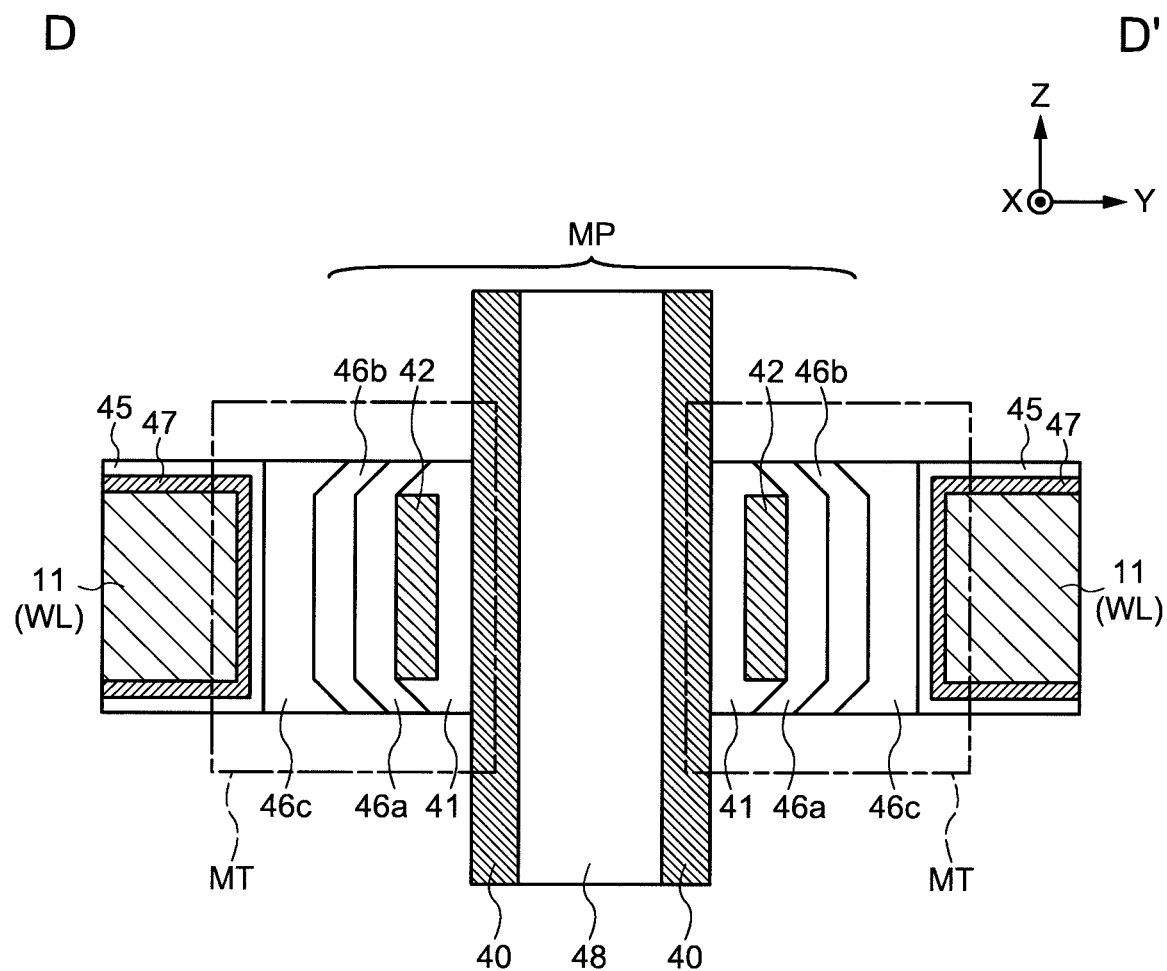
FIG. 9 is a cross-sectional view from D to D' of the memory cell shown in FIG. 8.

As shown in FIG. 8 and FIG. 9, the memory pillars MP include insulation layers 48, 43, a semiconductor layer 40, an insulation layer 41, a conductive layer 42, and insulation layers 46a to 46c provided along the Z-direction. The insulation layer 48 is, for example, an insulating layer including silicon and oxygen. The semiconductor layer 40 is provided to surround the periphery of the insulation layer 48 in the cross-sectional view from C to C'. The semiconductor layer 40 is, for example, a semiconductor layer including polycrystalline silicon. The semiconductor layer 40 functions as a channel of the memory cell transistor MT. The semiconductor layer 40 is provided continuously between the two memory cell transistors MT included in one memory pillar MP and is not separated for each memory cell transistor MT.

As described above, the semiconductor layer 40 is continuous between the two memory cell transistors MT facing each other. Therefore, the two channels formed in the two memory cell transistors MT share a part of the memory pillar MP. Specifically, in FIG. 8, in the memory cell transistor MT on the left side and the memory cell transistor MT on the right side facing each other, the channel formed in the memory cell transistor MT on the left side and the channel formed in the memory cell transistor MT on the right side share a part of the memory pillar MP. The two channels share a part of the memory pillar MP means that the two channels are formed in the same memory pillar MP and that the two channels partially overlap. The above configuration may be referred to as that the two memory cell transistors MT share the channel or the two memory cell transistors MT face each other.

The insulating layer 41 is provided around the semiconductor layer 40 and functions as a gate insulating layer of the memory cell transistor MT. The insulating layer 41 is separated into two regions by an insulating layer 43 in the XY plane shown in FIG. 8. The two separated insulating layers 41 function as the gate insulating layers of the two memory cell transistors MT facing each other. The insulating layer 41 is a stacked-layer structure with an insulating layer containing, for example, silicon and oxygen and an insulating layer containing silicon and nitrogen.

The conductive layer 42 is provided around the insulating layer 41 and functions as a charge storage layer of the memory cell transistor MT. The conductive layer 42 is separated into two regions by the insulating layer 43 in the XY plane shown in FIG. 8. The two separated conductive layers 42 function as the charge storage layers of the two memory cell transistors MT facing each other. The conductive layer 42 is, for example, a layer comprising polycrystalline silicon having conductivity.

For example, the insulating layer 43 is an insulating layer containing silicon and oxygen. Around the conductive layer 42, the insulating layers 46a, 46b, 46c are sequentially provided. The insulating layers 46a and 46c are, for example, insulating layers containing silicon and oxygen. The insulating layer 46b is, for example, an insulating layer containing silicon and nitrogen. These insulating layers function as block insulating layers of the memory cell transistor MT. These insulating layers 46a to 46b are also separated into two regions by an insulating layer 43 in the XY plane shown in FIG. 8. The insulating layers 43 are buried in the slits SLT2 except for the memory pillars MP. The insulating layer 43 is, for example, an insulating layer containing silicon and oxygen.

Around the memory pillar MP, an AlO layer 45 is provided, for example. Around the AlO layer 45, a barrier metal layer 47 (TiN layer or the like) is provided, for example. Around the barrier metal layer 47, the wiring layer 11 functioning as the word line WL is provided. The wiring layer 11 is, for example, tungsten.

According to the above configuration, two memory cell transistors MT are provided in one memory pillar MP along the Y-direction. The select transistors ST1 and ST2 also have the same configuration as described above. An insulation layer (not shown) is provided between the memory cell transistors adjacent to each other in the Z-direction. By the insulation layer and the insulation layers 43, 46, the conductive layer 42 is insulated for each individual memory cell transistor.

1-5. Example 2

Figure 10:
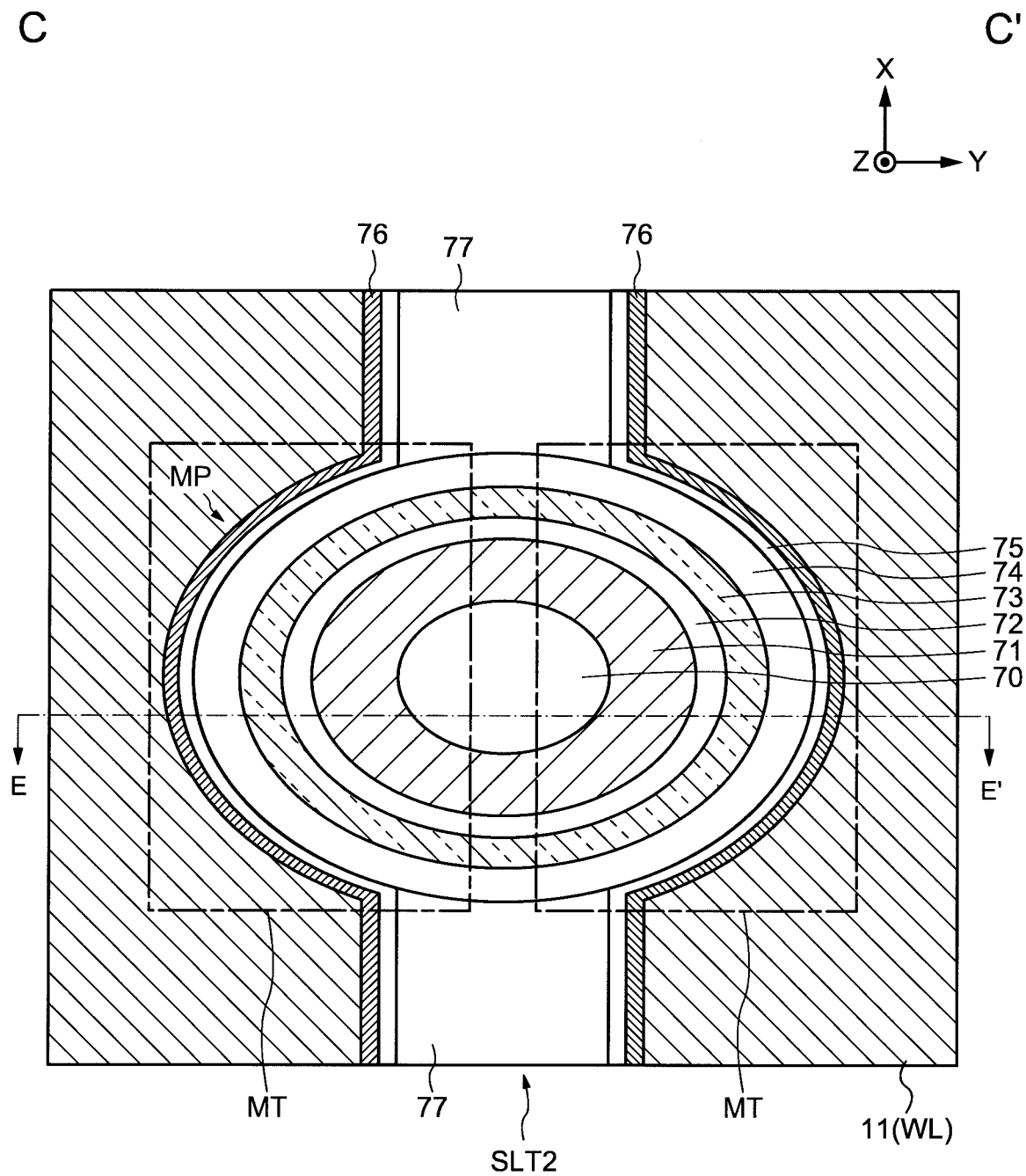
FIG. 10 is a modification of the memory cell shown in FIG. 8.
Figure 11:
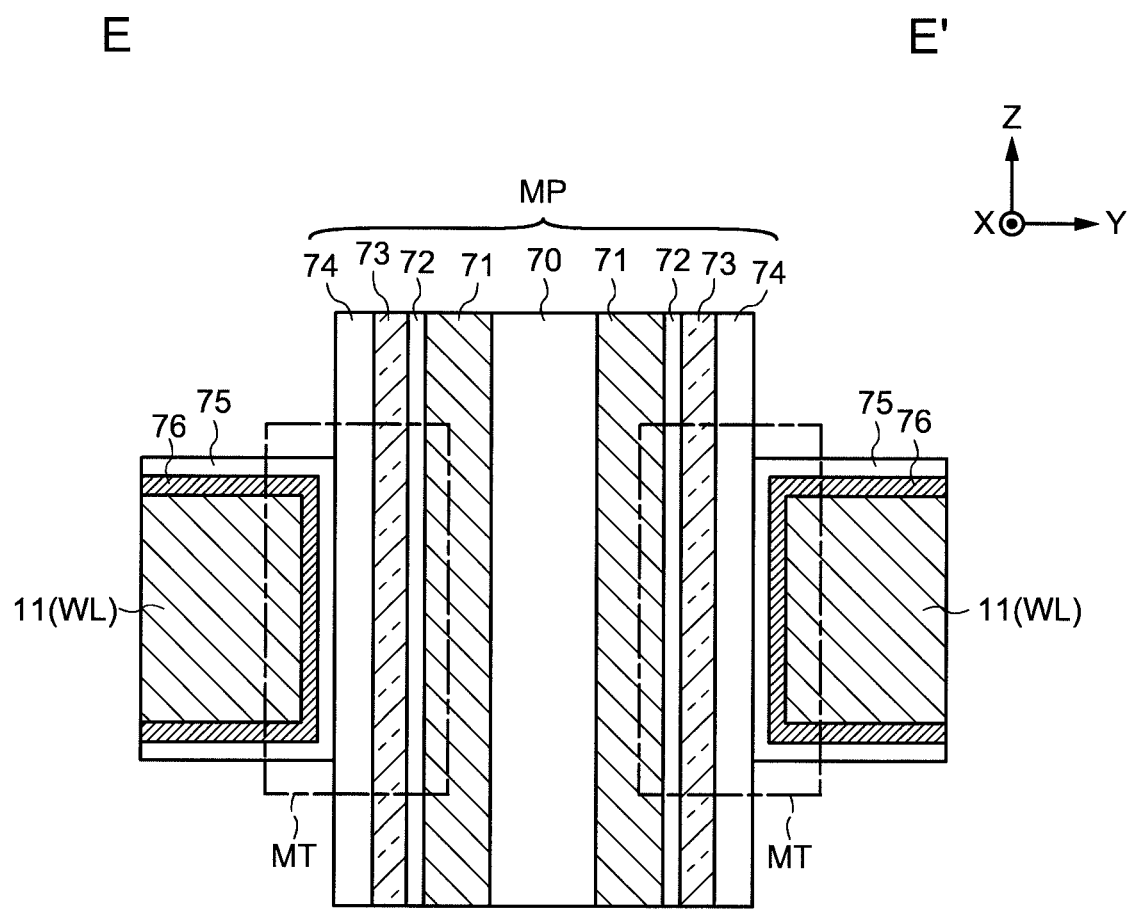
FIG. 11 is a cross-sectional view from E to E' of the memory cell shown in FIG. 10.

The configurations of the memory pillar MP and the memory cell transistor MT according to a second example will be described with reference to FIG. 10 and FIG. 11. FIG. 10 is a modification of the memory cell shown in FIG. 8. FIG. 11 is a cross-sectional view from E to E' of the memory cell shown in FIG. 10. In the second example, a MONOS type memory cell transistor MT is used for the memory cell transistor MT.

As shown in FIG. 10 and FIG. 11, the memory pillar MP includes an insulation layer 70, a semiconductor layer 71, and insulation layers 72 to 74 provided along the Z-direction. The insulation layer 70 is, for example, an insulating layer including silicon and oxygen. The semiconductor layer 71 is provided to surround the periphery of the insulation layer 70. The semiconductor layer 71 functions as the channel of the memory cell transistor MT in the cross-sectional view from C to C'. The semiconductor layer 71 is, for example, a semiconductor layer including a polycrystalline silicon layer. The semiconductor layer 71 is continuously provided between the two memory cell transistors MT included in one memory pillar MP. Therefore, the channels formed in each of the two memory cell transistors MT share a part of the memory pillar MP.

The insulation layer 72 is provided to surround the periphery of the semiconductor layer 71 in the cross-sectional view from C to C', and functions as the gate insulation layer of the memory cell transistor MT. The insulation layer 72 is, for example, a stacked structure of an insulating layer including silicon and oxygen, and an insulating layer including silicon and nitrogen. The insulation layer 73 is provided to surround the periphery of the semiconductor layer 71 in the cross-sectional view from C to C', and functions as the charge storage layer of the memory cell transistor MT. The insulation layer 73 is, for example, an insulating layer including silicon and nitrogen. The insulation layer 74 is provided to surround the periphery of the insulation layer 73 in the cross-sectional view from C to C', and functions as the block insulation layer of the memory cell transistor MT. The insulation layer 74 is, for example, an insulating layer including silicon and oxygen. An insulation layer 77 is embedded in the slit SLT2 except for the memory pillar MP portion. The insulation layer 77 is, for example, an insulating layer including silicon and oxygen.

For example, around the memory pillar MP having the above-described configuration, an AlO layer 75 is provided. For example, around the AlO layer 75, a barrier metal layer 76 (TiN layer or the like) is provided. Around the barrier metal layer 76, the wiring layer 11 functioning as the word line WL is provided. The wiring layer 11 is, for example, tungsten.

According to the above configuration, two memory cell transistors MT are provided in one memory pillar MP along the Y-direction. The select transistors ST1 and ST2 also have the same configuration as described above.

1-6. Equivalent Circuit

Figure 12:
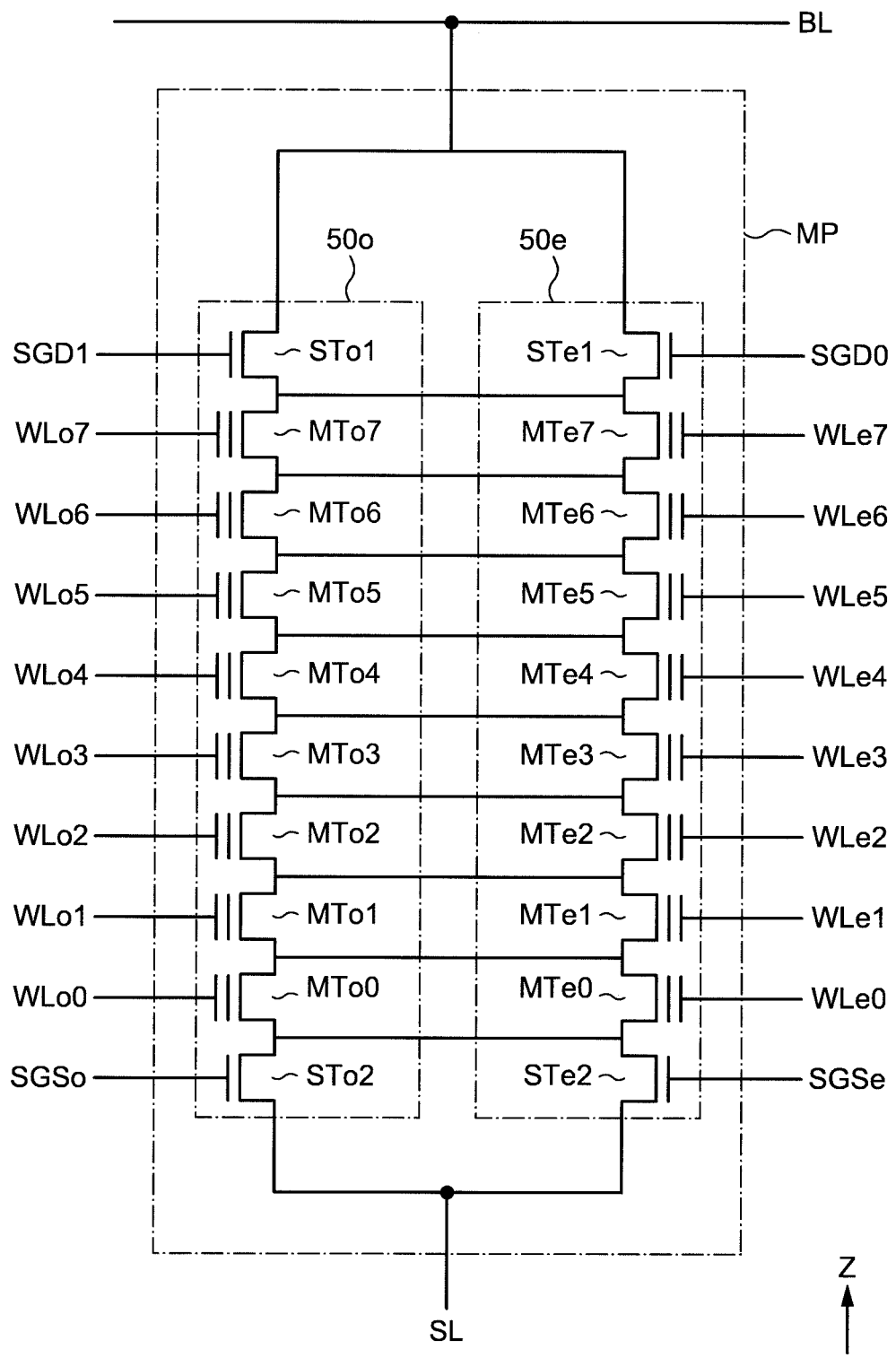
FIG. 12 is a diagram showing adjacent strings in a semiconductor memory device according to an embodiment.

FIG. 12 is a diagram for explaining an equivalent circuit of the adjacent strings in the semiconductor memory device according to an embodiment. As shown in FIG. 12, the two strings 50o, 50e are formed in one memory pillar MP. The string 50o (second string) is provided in a first side of the memory pillar MP. The string 50e (first string) is provided in a second side of the memory pillar MP. The second side is an opposite side of the first side with respect to the memory pillar MP.

The string 50e is provided between the bit line BL and the source line SL. The string 50e has a selection transistor STe1 (the first transistor), i (i is an integer of 2 or more) memory cell transistors MTe (the first memory cells), and a selection transistor STe2 (the second transistor) connected in series. In this embodiment, "i" is 8, and memory cell transistors MTe0 to MTe7 are provided. The i-memory cell transistors MTe (the first memory cells) are provided between the selection transistor STe1 (the first transistor) and the selection transistor STe2 (the second transistor). The i-memory cell transistors MTe (the first memory cells) are electrically connected in series and are arranged along the Z direction.

The string 50o is provided between the bit line BL and the source line SL. The string 50o has a selection transistor STo1

(the third transistor), i (i is an integer of two or more) memory cell transistors MTo (the second memory cells), and a selection transistor STo2 (the fourth transistor) connected in series. In this embodiment, "i" is 8, and memory cell transistors MTo0 to MTo7 are provided. The i-memory cell transistors MTo (the second memory cells) are provided between the selection transistor STo1 (the third transistor) and the selection transistor STo2 (the fourth transistor). The i-memory cell transistors MTo (the second memory cell) are electrically connected in series and are arranged along the Z direction.

The source line SL is provided on the main surface of the semiconductor substrate 13 (see FIG. 6 and FIG. 7). The source line SL may have a configuration wherein a conductive layer which is not patterned spreads over a region of the memory cell array 21, or may have a configuration wherein a linearly patterned conductive layer spreads over the region. In other words, the source line SL extends in the X-direction (the first direction) and the Y-direction (the second direction).

The word lines WLe0 to WLe7 are provided in the Z-direction with respect to the source line SL. The word lines WLe0 to WLe7 may be referred to as the "first word line", respectively. In the present embodiment, although a configuration in which eight word lines WLe0 to WLe7 are stacked in the Z-direction is exemplified, the present invention is not limited to this configuration. For example, the word lines WLe to be stacked may be i-layers (i is an integer of two or more).

Similarly, the word lines WLo0 to WLo7 are provided in the Z-direction with respect to the source line SL. The word lines WLo0 to WLo7 may be referred to as the "second word line", respectively. In the present embodiment, although a configuration in which eight word lines WLo0 to WLo7 are stacked in the Z-direction is exemplified, the present invention is not limited to this configuration. For example, the word lines WLo to be stacked may be i-layers (i is an integer of two or more).

In this case, the positions of the word line WLo of the i-layers and the word line WLe of the i-layers in the Z direction are the same, as shown in FIG. 6 and FIG. 12. That is, the positions of the i-th word line WLo and the i-th word line WLe in the Z direction are the same. Specifically, in the Z-direction, the word line WLo0 is provided at the same position as the word line WLe0. The i-memory cell transistors MTe (the first memory cells) are connected to i-layers word lines WLe, respectively. The i-memory cell transistors MTo (the second memory cells) are connected to i-layers word lines WLo, respectively.

The select transistor STo1 is connected to the select gate line SGD1. The select transistor STe1 is connected to the select gate line SGD0. The select transistor STo2 is connected to the select gate line SGSo. The select transistor STe2 is connected to the select gate line SGSe.

The memory pillar MP is provided between the word line WLe (the first word line) and the word line WLo (the second word line) (see FIG. 5 and FIG. 6). The memory pillar MP extends in the Z direction, and the semiconductor layer 40 provided in the memory pillar MP (see FIG. 9) is connected to the bit line BL and the source line SL. The i-memory cell transistors MTe (the first memory cells) and the i-memory cell transistors MTo (the second memory cell) share the semiconductor layer 40. The semiconductor layer 40 may be referred to as the first semiconductor layer.

For example, as shown in FIG. 4, regarding the adjacent bit lines BL0 and BL1, the bit line BL0 may be referred to as a "first bit line" and the bit line BL1 may be referred to as a "second bit line". In this case, the memory pillar MP shown in FIG. 12 is connected to each of the first bit line and the second bit line. In this case, among the word lines belonging to the second bit line, the word line corresponding to the word lines WLe0 to WLe7 may be referred to as a "third word line," and the word line corresponding to the word lines WLo0 to WLo7 may be referred to as a "fourth word line." A memory pillar MP provided between the third word line and the fourth word line may be referred to as a second memory pillar. In the second memory pillar, a semiconductor layer corresponding to the semiconductor layer 40 may be referred to as a second semiconductor layer. Among the strings provided in the second memory pillar, a string corresponding to the string 50e may be referred to as a "third string", and a string corresponding to the string 50o may be referred to as a "fourth string". A transistor corresponding to the selection transistor STe1 provided in the third string is referred to as a "fifth transistor", a memory cell corresponding to the memory cell transistor MTe is referred to as a "third memory cell", and a transistor corresponding to the selection transistor STe2 may be referred to as a "sixth transistor". A transistor corresponding to the selection transistor STo1 provided in the fourth string is referred to as a "seventh transistor", a memory cell corresponding to the memory cell transistor MTo is referred to as a "fourth memory cell", and a transistor corresponding to the selection transistor STo2 may be referred to as an "eighth transistor".

The sources of the select transistors STo1 and STe1 facing each other are electrically connected. The drains of the select transistors STo1 and STe1 are electrically connected. The sources of each of the memory cell transistors MTo0 to MTo7 and MTe0 to MTe7 facing each other are electrically connected. The drains of each of the memory cell transistors MTo0 to MTo7 and MTe0 to MTe7 facing each other are electrically connected. The sources of the select transistors STo2 and STe2 facing each other are electrically connected. The drains of the select transistors STo2 and STe2 facing each other are electrically connected. The electrical connection described above is due to the channels formed in the transistors facing each other sharing a part of the memory pillar MP.

The two strings 50o, 50e in the same memory pillar MP are connected to the same bit line BL and the same source line SL.

1-7. Threshold Voltage Distribution of Memory Cell Transistor

Figure 13:
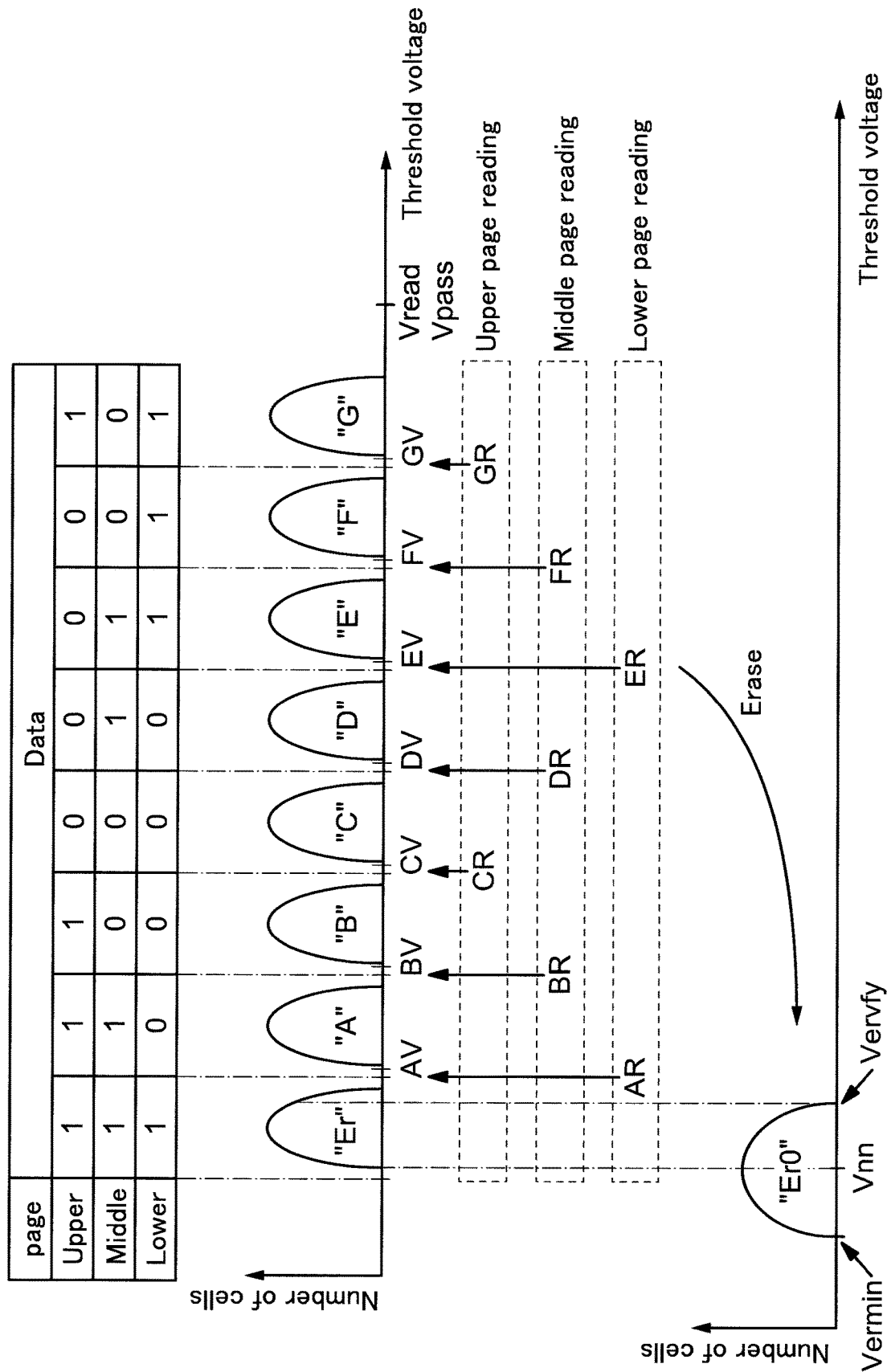
FIG. 13 is a diagram showing a threshold voltage distribution of a memory cell transistor according to an embodiment.

FIG. 13 is a diagram showing a threshold voltage distribution of a transistor (memory cell transistor) used as the memory cell according to an embodiment. In FIG. 13, although Triple Level Cell (TLC) is described as an example of the threshold voltage distribution of the memory cell transistor, Quad Level Cell (QLC), Multi Level Cell (MLC), and Single Level Cell (SLC) may be used in the memory system 1.

FIG. 13 shows an example of the threshold voltage distribution, a data allocation, a read voltage, and a verify voltage of the memory cell transistor, respectively. The vertical axis of the threshold voltage distribution shown in FIG. 13 corresponds to the number of memory cell transistors (Number of cells), and the horizontal axis corresponds to a threshold voltage Vth (Threshold voltage) of the memory cell transistor.

As shown in FIG. 13, in the TLC method, a plurality of memory cell transistors may form eight threshold voltage distributions. The eight threshold voltage distributions may be referred to as write levels. The write levels are referred to as "Er" level, "A" level, "B" level, "C" level, "D" level, "E" level, "F" level, and "G" level in order from the lower threshold voltage. For example, different three-bit data are allocated to these write levels, as described below. These 3-bit data are called a lower bit (Lower), a middle bit (Middle), and an upper bit (Upper).

"Er" level: "111" data
"A" level: "110" data
"B" level: "100" data
"C" level: "000" data
"D" level: "010" data
"E" level: "011" data
"F" level: "001" data
"G" level: "101" data The above data are presented in the order of Upper, Middle, Lower.

A group of Lower bits held by the memory cell transistors connected to the same word line is referred to as a Lower page. A group of Middle bits held by the memory cell transistors is referred to as a Middle page. A group of Upper bits held by the memory cell transistors is referred to as an Upper page. The data write operation and read operation are performed in the above page units.

In the write operation, the program operation and the verify operation are repeatedly performed. The program operation is an operation of increasing the voltage by every threshold voltage of the memory cell transistor MT a predetermined voltage (hereinafter, referred to as a "voltage step width"). Every time the program operation is executed, the verify operation is executed, the threshold voltage of the memory cell transistor MT after the program operation is read, and it is evaluated whether or not the threshold voltage has reached a desired threshold voltage. If it is determined by the verify operation that the desired threshold voltage has not been reached, the program operation will be executed again.

Between the adjacent threshold voltage distributions, a verify voltage used as a standard for judgement in the verify operation is set. Specifically, the verify voltages AV, BV, CV, DV, EV, FV, and GV are set corresponding to each of the levels "A" level, "B" level, "C" level, "D" level, "E" level, "F" level, and "G" level.

For example, the verify voltage AV is set between the maximum threshold voltage in the "Er" level and the minimum threshold voltage in the "A" level. When the verify voltage AV is applied to the memory cell transistor, the memory cell transistor whose threshold voltage is included in the "Er" level is turned ON, and the memory cell transistor whose threshold voltage is included in the "A" to "G" levels (threshold voltage distributions whose threshold voltages are equal to or higher than the threshold voltage of the "A" level) is turned to an OFF state (non-conductive state).

Other verify voltages BV, CV, DV, EV, FV, and GV are also set in the same manner as the verify voltage AV. The verify voltage BV is set between the "A" level and the "B" level. The verify voltage CV is set between the "B" level and the "C" level. The verify voltage DV is set between the "C" level and the "D" level. The verify voltage EV is set between the "D" level and the "E" level. The verify voltage FV is set between the "E" level and the "F" level. The verify voltage GV is set between the "F" level and the "G" level.

For example, the verify voltage AV may be set to 0.8V, the verify voltage BV may be set to 1.6V, the verify voltage CV may be set to 2.4V, the verify voltage DV may be set to 3.1V, the verify voltage EV may be set to 3.8V, the verify voltage FV may be set to 4.6V, and the verify voltage GV may be set to 5.6V. However, these verify voltages AV to GV are not limited to the above voltage values. The verify voltages AV to GV may be set, for example, in the range of 0.0V to 7.0V, as appropriate, step by step.

The read voltages used in the respective read operations are set between the adjacent threshold voltage distributions. For example, the read voltage AR is set between the maximum threshold voltage in the "Er" level and the minimum threshold voltage in the "A" level. The read voltage AR is a voltage for determining whether the threshold voltage of the memory cell transistor is included in the "Er" level or included in the "A" level or higher.

Other read voltages BR, CR, DR, ER, FR, and GR are also set between adjacent levels similar to the read voltage AR. For example, the read voltage BR is set between the "A" level and the "B" level. The read voltage CR is set between the "B" level and the "C" level. The read voltage DR is set between the "C" level and the "D" level. The read voltage ER is set between the "D" level and the "E" level. The read voltage FR is set between the "E" level and the "F" level. The read voltage GR is set between the "F" level and the "G" level.

A voltage Vread applied to a non-selected WL when the read operation is performed is set to a voltage value higher than the maximum threshold voltage of the highest threshold voltage distribution (for example, "G" level). The memory cell transistor whose gate is supplied with the Vread is turned ON regardless of the stored data.

The verify voltages AV, BV, CV, DV, EV, FV, and GV are set to higher voltages than the read voltages AR, BR, CR, DR, ER, FR, and GR, respectively. In other words, the verify voltages AV to GV are set in the neighborhood of the minimum thresholds (hereinafter, sometimes referred to as the "lower tail of the threshold distribution") in the threshold voltage distribution of the "A" level, "B" level, "C" level, "D" level, "E" level, "F" level, and "G" level, respectively.

When the above-described data allocation is applied, the data of one page of the lower bit (data of Lower page) in the read operation is determined by the read result using the read voltages AR and ER. The data of one page of the middle bit (data of Middle page) is determined by the read result using the read voltages BR, DR, and FR. The data of one page of the upper bit (data of Upper page) is determined by the read result using the read voltages CR and GR. As described above, since the data of the Lower page, Middle page, and Upper page are determined by 2 times, 3 times, and 2 times of a read operation, respectively, the allocation of this data is referred to as "2-3-2 code".

Next, a threshold voltage distribution immediately after the erase operation is performed on the memory cell transistor MT on which the write operation has been performed will be described.

1-8. Threshold Voltage Distribution of the Erased State

When the erase operation (Erase) is performed, all the memory cell transistors MT to be erased will be transited to an "Er0" state. The threshold voltage of the memory cell transistor MT in the "Er0" state is less than a voltage Vervfy and equal to or higher than a voltage Vermin. The voltage Vervfy is a voltage equal to or lower than the voltage AV and higher than a voltage Vnn (e.g., 0V). The voltage Vermin is the lowest threshold voltage that the memory cell transistor MT can take by the erase operation and is a voltage lower than the voltage Vnn. For example, the voltage Vnn is a negative voltage (<0V) and is the lowest voltage of the voltages that can be generated in the semiconductor memory devices 5 to 8. The "Er0" state shown in FIG. 13 includes a state that the memory cell transistor MT has the threshold voltage less than the voltage Vnn. On the other hand, the "Er" state does not include a state that the memory cell transistor MT has the threshold voltage less than the threshold voltage of the voltage Vnn. In the above point, the "Er0" state and the "Er" state are different.

The memory cell transistor MT belonging to the "Er0" state does not belong to any state of the "A" state to the "G" state because the threshold voltage is controlled to be equal to or lower than the voltage Vervfy (≤AV). On the other hand, since the memory cell transistor MT has the threshold voltage lower than the voltage Vnn, the memory cell transistor MT can be turned ON even when the lowest voltage among the voltages that can be generated in the semiconductor memory devices 5 to 8 is applied to the word line WL.

Hereinafter, the memory cell transistor MT whose threshold voltage is lower than the voltage Vnn is referred to as an "over-erased cell." The threshold voltage of the over-erased cell is lower than the lowest voltage supplied at the read operation. That is, since the over-erased cell cannot be controlled to the OFF state even if the minimum voltage is applied to the word line WL, it may cause erroneous writing and erroneous reading. A program operation is performed to increase the threshold voltage of the over-erased cell in order to reduce the number of the over-erased cell mentioned above. In the following description, the program operation performed to reduce the number of the over-erased cell is referred to as "program operation for over-erased cell (EP operation)" or "initial program operation" to distinguish it from the program operation in the normal write operation.

1-9. Verify Operation

Figure 14:
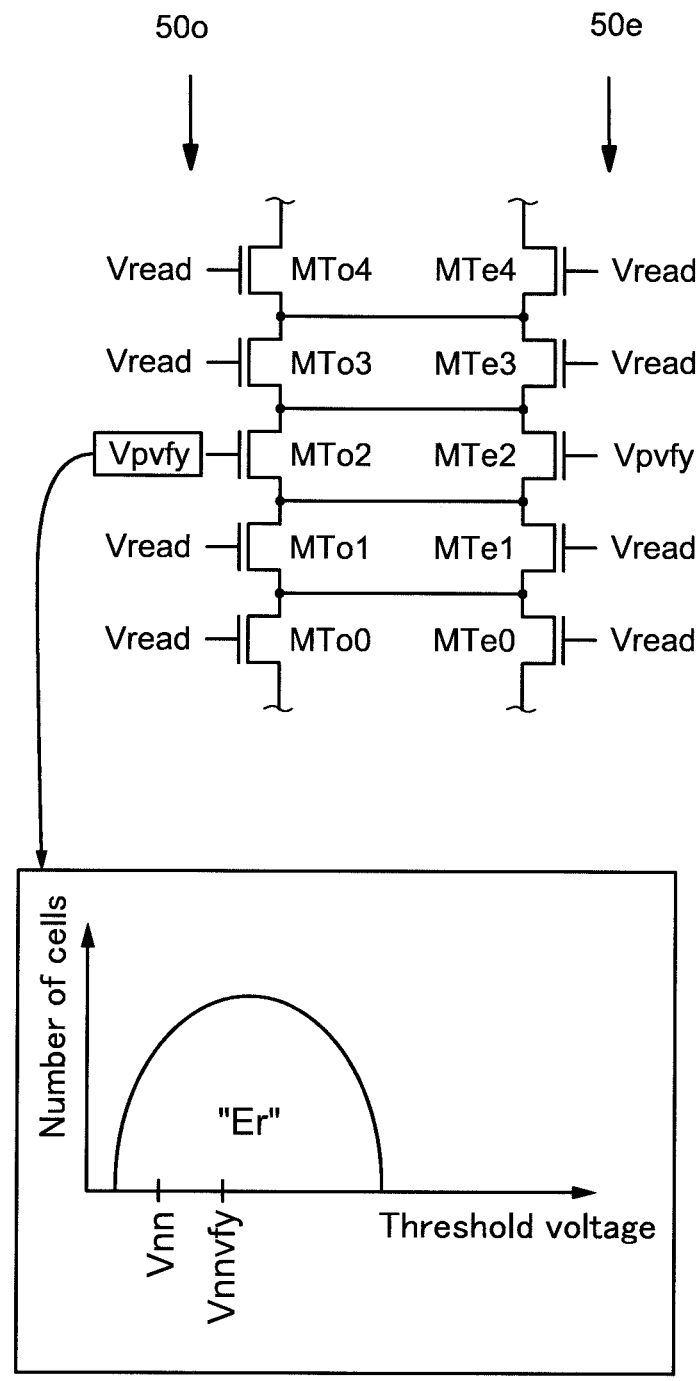
FIG. 14 is a diagram for explaining a verify operation in a semiconductor memory device according to an embodiment.

The verify operation performed during the write operation and the EP operation will be described with reference to FIG. 14. When the memory cell transistor MTo2 among the memory cell transistors MT facing each other is an over-erased cell as in the present embodiment, the memory cell transistor MTo2 cannot be turned OFF. Therefore, when the verify operation is performed on the memory cell transistor MTo2 and when the verify operation is performed on the memory cell transistor MTe2, respectively, current flows through the memory cell transistor MTo2.

Therefore, among the memory cell transistors MT facing each other, it is difficult to determine which memory cell transistor MT is an over-erased cell. Therefore, in the memory cell transistor MT as in the present embodiment, in order to solve the problem of the over-erased cell, the verify operation is performed collectively for both memory cell transistors MT facing each other. Specifically, the verify voltage Vpvfy is supplied to both memory cell transistors MT which are facing each other (for example, both MTo2 and MTe2), and the other memory cell transistors MT are supplied with the voltage Vread.

1-10. Program Operation for Over-Erased Cell in Comparative Example (EP Operation)

Figure 15:
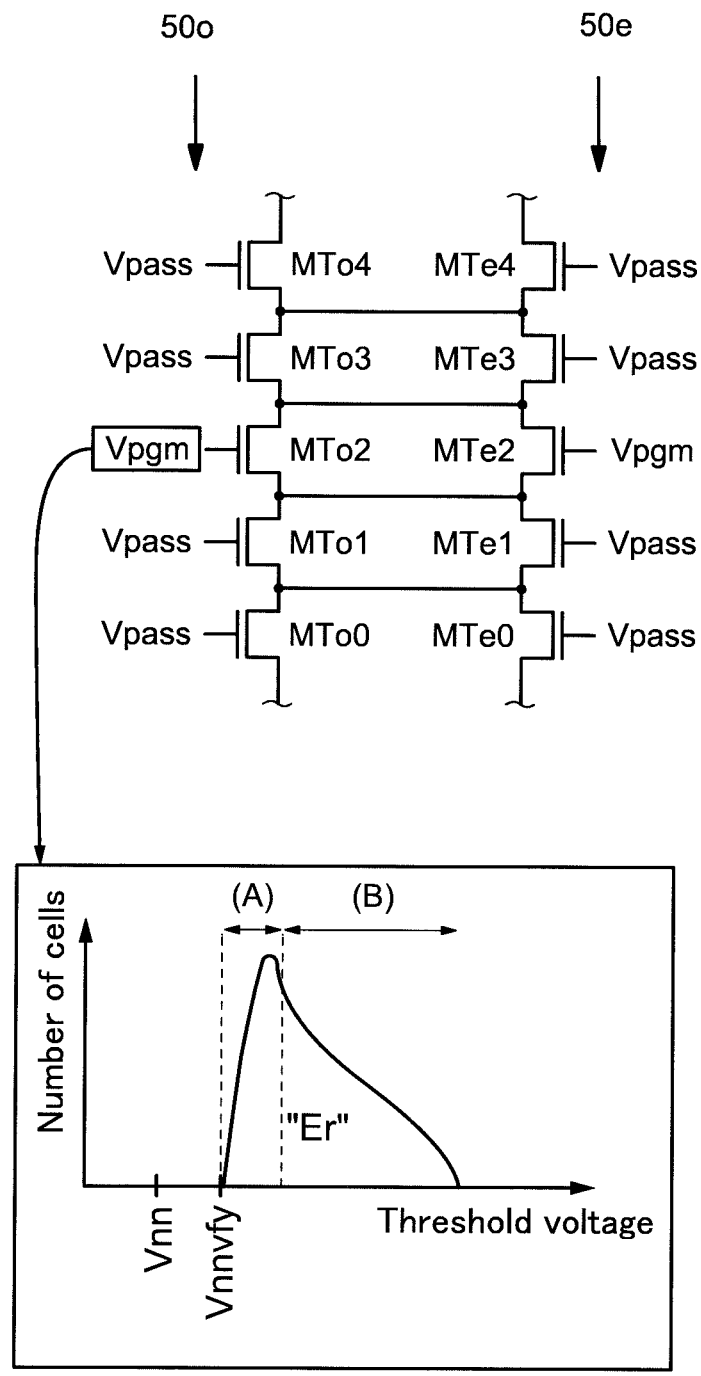
FIG. 15 is a diagram for explaining a program operation for an over-erased cell in a semiconductor memory device according to an embodiment.

The problem of the EP operation in the comparative example will be described with reference to FIG. 15. The EP operation in the comparative example is an operation of overcoming the over-erased cell by one EP operation. In the comparative example, when the over-erased cell is detected in the verify operation described above, the EP operation is performed collectively on the memory cell transistors MT facing each other. Specifically, the over erase cell program voltage (the EP voltage) Vpgm is supplied to the memory cell transistors MT on which the EP operation is performed, and a voltage Vpass is supplied to the other memory cell transistors MT.

The EP operation is a program operation to increase the threshold voltage to a high voltage for a pair of the memory cell transistors MT determined to be the over-erase cell. By the EP operation, for example, among the threshold voltage distribution of the "Er" state shown in FIG. 14, the threshold voltage of the memory cell transistor MT having a threshold voltage lower than the voltage Vnn is increased to a high voltage. Consequently, the threshold voltage profile is all higher than the voltage Vnnvfy as shown in FIG. 15.

Figure 40:
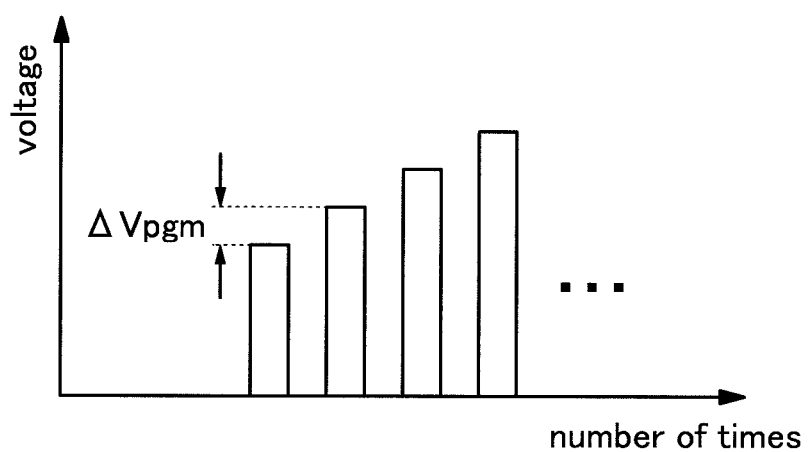
FIG. 40 is a diagram for explaining a program voltage in a program operation of a semiconductor memory device according to an embodiment.

In the EP operation, the voltage applied to the memory cell to increase the threshold voltage of the memory cell is called a program voltage. The program operation in the EP operation is performed alternately with the verify operation, and the program voltage is stepwise increased at a predetermined voltage width (ΔVpgm) every time the program operation is performed (see FIG. 40). In FIG. 40, the horizontal axis (number of times) represents the number of times the program operation is performed, and the vertical axis (voltage) represents the program voltages applied to the memory cells. Hereinafter, the program operation and the verify operation in the EP operation are referred to as an "EP program operation" and an "EP verify operation" in order to distinguish them from the program operation and the verify operation in the normal write operation.

In the EP verify operation, the verify voltages Vpvfy are simultaneously supplied to both of the memory cell transistors MT facing each other. Therefore, the threshold voltage distribution formed by the EP verify operation becomes a characteristic shape that reflects the combination of the initial threshold voltage distribution of the memory cell transistors MT facing each other.

When the threshold voltage of one memory cell transistor is equal to or higher than Vnnvfy and the threshold voltage of the other memory cell transistor is equal to or lower than Vnnvfy at a certain point in time in the repetition of the EP program operation and the EP verify operation, the Vnnvfy is applied when the EP verify operation is executed, so that the current flows through the strings 50o and 50e and the verify operation is "failed". Here, failed means that the threshold voltage of the memory cell transistor MT is determined not to be equal to or higher than the set value by the EP verify operation executed after the EP program operation. Hereinafter, failing of the verify operation may be referred to as a "verify failing".

The EP program operation and the EP verify operation are continued until the thresholds of both the memory cell transistors MT facing each other exceed Vnnvfy. That is, the threshold voltage distribution of the memory cell transistors MT, which face each other, is constrained by the memory cell transistor MT having a low threshold voltage among these memory cell transistors MT. Therefore, the shape of the threshold voltage distribution after the EP operation becomes a shape depending on the threshold voltage distribution of the Er state in addition to the voltage width in the EP program operation. In the threshold voltage distribution shown in FIG. 15, the profile in the range of (A) is a profile that depends on the voltage width in the program operation, and is a relatively small width distribution. On the other hand, the profile in the range of (B) is a profile depending on the threshold voltage distribution of the "Er" state before performing an EP operation (see FIG. 14), and is a relatively large width distribution.

As described above, since the EP operation is performed collectively for the memory cell transistors MT facing each other, the EP operation is also performed for the memory cell transistors MT that are not over-erased cells. As a result, a profile in the above range (B) is formed. Therefore, it is difficult to reduce the width of the threshold voltage distribution after the EP operation.

1-11. EP Operation of the Present Embodiment

The EP operation of the present embodiment will be described with reference to FIG. 16 to FIG. 20. The EP operation described below includes the preliminary program operation described in (1) to (4) below. In the present embodiment, at least the preliminary program operations (1) to (3) need to be executed, and the preliminary program operation (4) is executed as necessary. In this embodiment, the EP operation is performed on the memory cell transistors MTo2 and MTe2. In (1) to (4) below, the fourth voltage is a voltage lower than the first voltage to the third voltage. The fourth voltage is, for example, the same voltage as a voltage supplied to the source line SL in the read operation. The following EP operation is executed by the sequencer 27 (control circuit).

(1) The first preliminary program operation is a program operation that is executed while the first voltage ($V_{CS}+\Delta V_{CS}$) is supplied to the source line SL with respect to the memory cell transistors MTo2 and MTe2 facing each other.
(2) The second preliminary program operation is a program operation that is executed while the second voltage ($V_{CS}+\Delta V_{CS}$) is supplied to the source line SL with respect to the memory cell transistor MTe2.
(3) The third preliminary program operation is a program operation that is executed while the third voltage ($V_{CS}+\Delta V_{CS}$) is supplied to the source line SL with respect to the memory cell transistor MTo2.
(4) The fourth preliminary program operation is a program operation that is executed while the fourth voltage $V_{CS}$ is supplied to the source line SL with respect to the memory cell transistors MTo2 and MTe2 facing each other.

[1-11-1. First Preliminary Program Operation]

Figure 16:
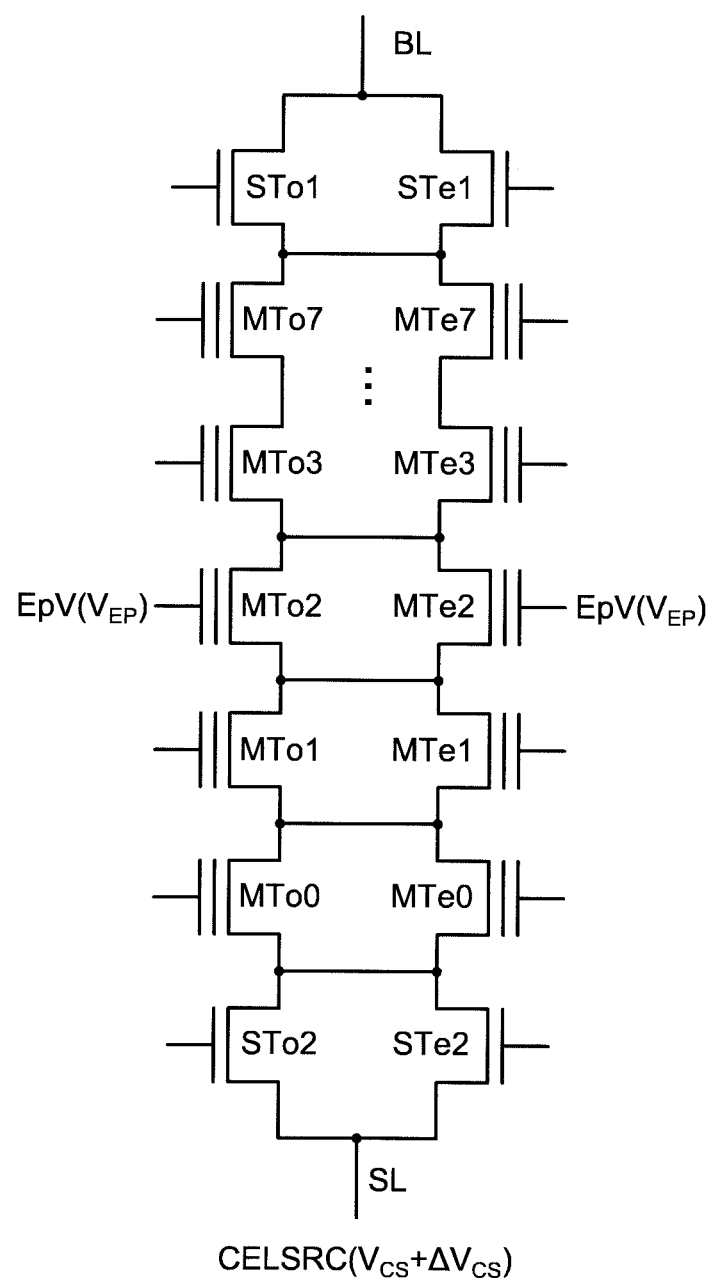
FIG. 16 is a diagram for explaining a first preliminary program operation in a semiconductor memory device according to an embodiment.

The first preliminary program operation will be described with reference to FIG. 16. FIG. 16 is a diagram for explaining a first preliminary program operation in a semiconductor memory device according to an embodiment. In the first preliminary program operation, a first EP program operation is performed collectively on the memory cell transistors MTe2 (the first memory cells) and MTo2 (the second memory cell) facing each other, and then a first EP verify operation is performed collectively. The first EP program operation and the first EP verify operation are repeatedly executed until the number of bits to be verify failing in the first EP verify operation is equal to or less than a predetermined number. FIG. 16 shows a condition in which the first EP verify operation is executed. As will be described in detail later, the widths of the threshold voltage distributions of the erase states of the memory cell transistors MTe2 (the first memory cells) and MTo2 (the second memory cell) are reduced by the first EP program operation.

As shown in FIG. 16, each gate of the memory cell transistors MTo2 and MTe2 is supplied with an EP verification voltage EpV, and the source line SL is supplied with a cell source CELSRC. In the first EP verify operation, the EP verify voltage EpV is "$V_{EP}$", and a first voltage $V_{CS}+\Delta V_{CS}$ is supplied as the cell source CELSRC. A voltage "$V_{CS}$" is a voltage supplied to the source line SL during the read operation. That is, the first voltage "$V_{CS}+\Delta V_{CS}$" is higher than the voltage supplied to the source line SL when the read operation is performed.

[1-11-2. Second Preliminary Program Operation]

Figure 17:
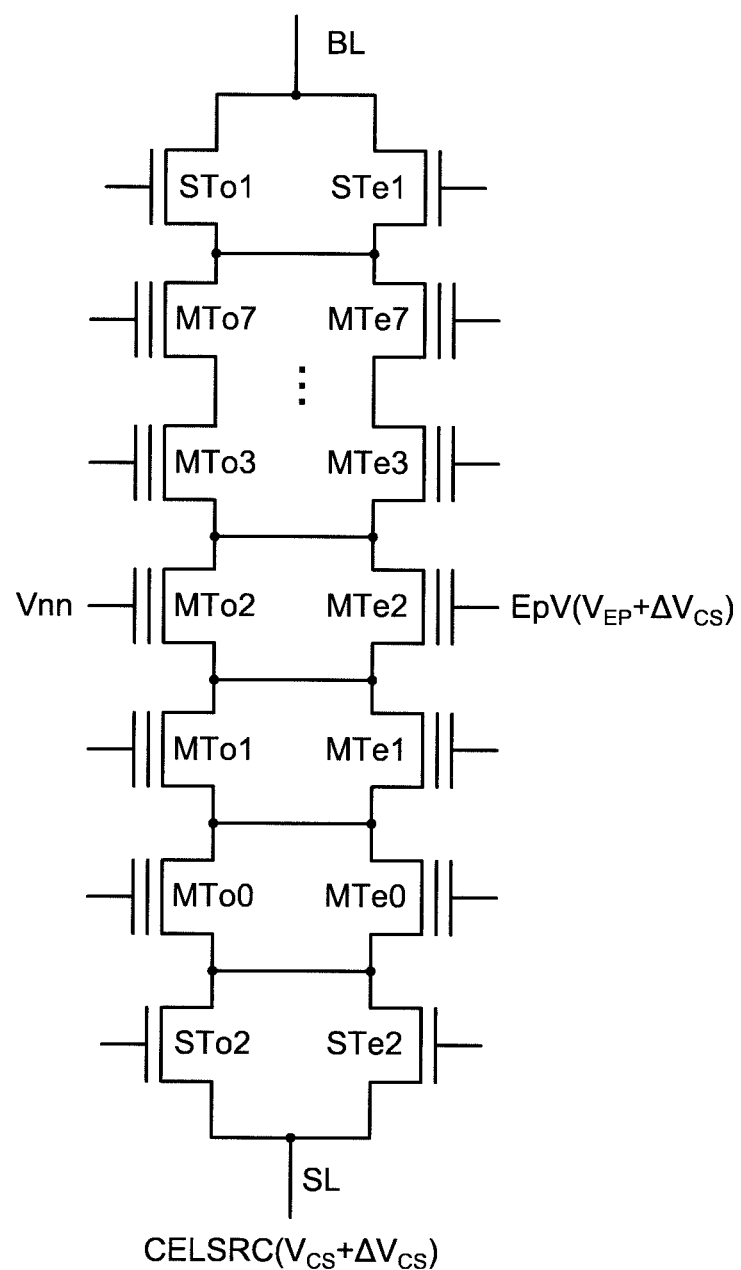
FIG. 17 is a diagram for explaining a second preliminary program operation in a semiconductor memory device according to an embodiment.

The second preliminary program operation will be described with reference to FIG. 17. FIG. 17 is a diagram for explaining a second preliminary program operation in a semiconductor memory device according to an embodiment. In the second preliminary program operation, a second EP program operation is performed on the memory cell transistor MTe2, and then a second EP verify operation is performed. The second EP program operation and the second EP verify operation are repeatedly executed until the number of bits to be verify failing in the second EP verify operation is equal to or less than a predetermined number. In the second preliminary program operation, neither the second EP program operation nor the second EP verify operation is performed on the memory cell transistor MTo2. FIG. 17 shows a condition in which the second EP verify operation is executed. As will be described in detail later, the widths of the threshold voltages of the memory cell transistors MTe2 (the first memory cells) in the erased state are reduced by the second EP program operation.

As shown in FIG. 17, the gate of the memory cell transistor MTe2 is supplied with an EP verification voltage, and the gate of the memory cell transistor MTo2 is supplied with the voltage Vnn. The voltage Vnn is a voltage for forcing the memory cell transistor MT to the OFF state regardless of the charge stored in the memory cell transistor MT, except for the over-erased cell. That is, when the voltage Vnn is supplied to the gate of the memory cell transistor MT, even if the memory cell transistor MT is in any state of the "Er" state and the "A" state to the "G" state of FIG. 13 (excluding the "Er0" state), the memory cell transistor MT is turned OFF. The cell source CELSRC is supplied to the source line SL. In the second verify operation, the EP verify voltage is "$V_{EP}+\Delta V_{CS}$" and the second voltage "$V_{CS}+\Delta V_{CS}$" is supplied as the cell source CELSRC. In the present embodiment, the second voltage is the same voltage as the first voltage, but they may be different voltages.

[1-11-3. Third Preliminary Program Operation]

Figure 18:
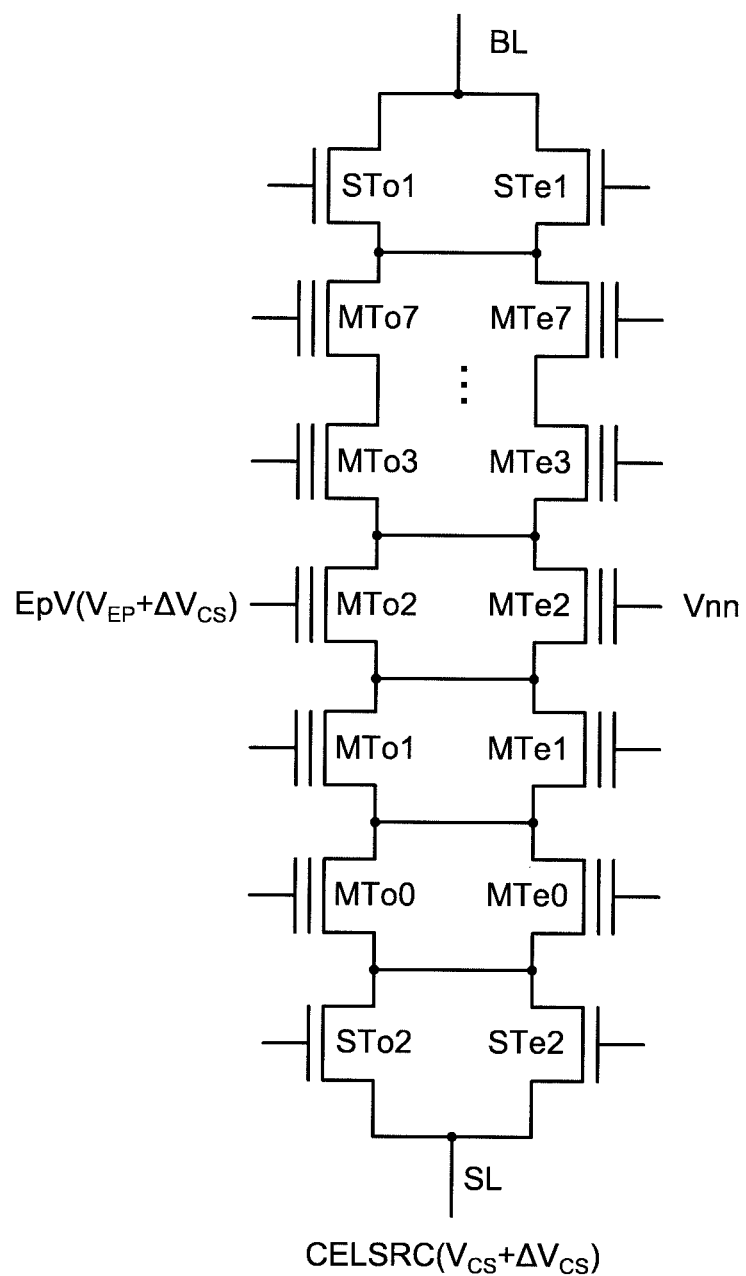
FIG. 18 is a diagram for explaining a third preliminary program operation in a semiconductor memory device according to an embodiment.

The third preliminary program operation will be described with reference to FIG. 18. FIG. 18 is a diagram for explaining a third preliminary program operation in a semiconductor memory device according to an embodiment. Although the third preliminary program operation is similar to the second preliminary program operation, the voltages supplied to the memory cell transistors MTo2 and MTe2 are reversed. That is, in the third preliminary program operation, a third EP program operation is performed on the memory cell transistor MTo2, and then a third EP verify operation is performed. The third EP program operation and the third EP verify operation are repeatedly executed until the number of bits to be verify failing in the third EP verify operation is equal to or less than a predetermined number. In the third preliminary program operation, neither the third EP program operation nor the third EP verify operation is performed on the memory cell transistor MTe2. FIG. 18 shows a condition in which the third EP verify operation is executed. As will be described in detail later, the widths of the threshold voltages of the memory cell transistors MTo2 (the second memory cells) in the erased state are reduced by the third EP program operation.

As shown in FIG. 18, the gate of the memory cell transistor MTo2 is supplied with an EP verification voltage, and the gate of the memory cell transistor MTe2 is supplied with the voltage Vnn. The cell source CELSRC is supplied to the source line SL. In the third verify operation, the EP verify voltage is "$V_{EP}+\Delta V_{CS}$", and the third voltage "$V_{CS}+\Delta V_{CS}$" is supplied as the cell source CELSRC. In the present embodiment, the third voltage is the same voltage as the first voltage and the second voltage, but they may be different voltages.

[1-11-4. Fourth Preliminary Program Operation]

Figure 19:
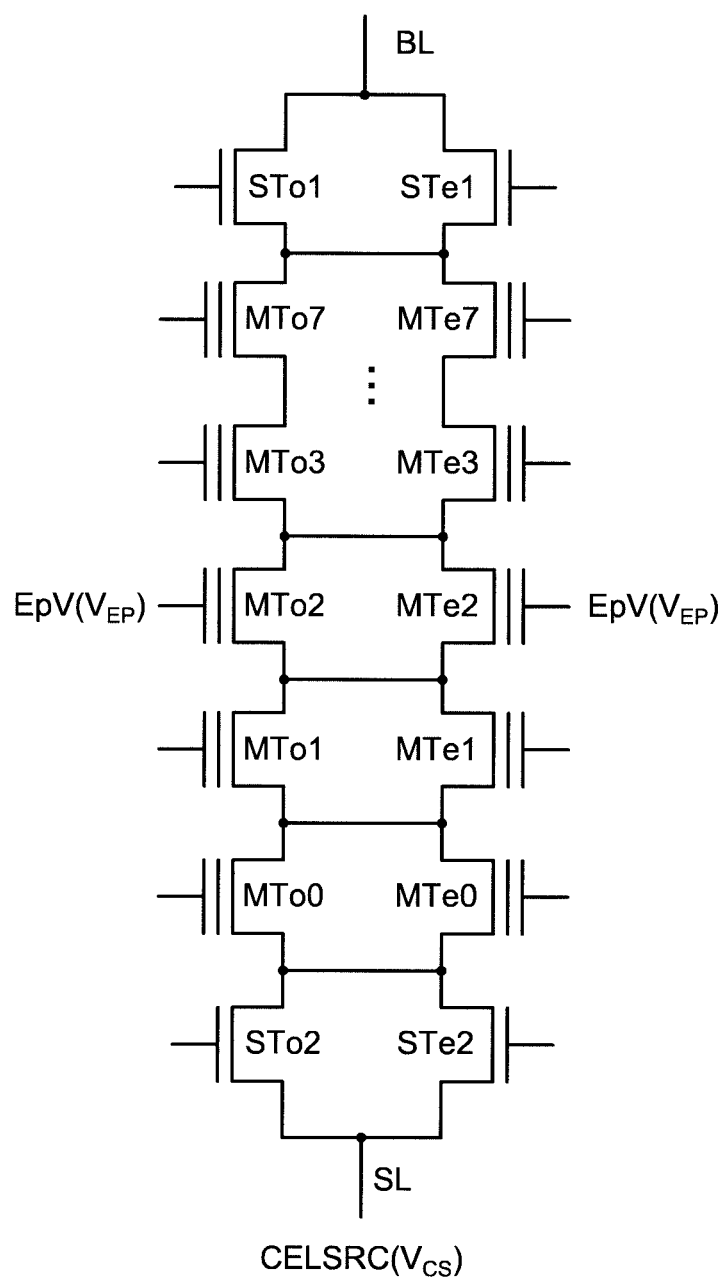
FIG. 19 is a diagram for explaining a fourth preliminary program operation in a semiconductor memory device according to an embodiment.

The fourth preliminary program operation will be described with reference to FIG. 19. FIG. 19 is a diagram for explaining a fourth preliminary program operation in a semiconductor memory device according to an embodiment. Although the fourth preliminary program operation is similar to the first preliminary program operation, the voltage supplied to the cell source CELSRC is different from the first preliminary program operation. That is, in the fourth preliminary program operation, a fourth EP program operation is performed collectively on the memory cell transistors MTo2 and MTe2 facing each other, and then a fourth EP verify operation is performed collectively. The fourth EP program operation and the fourth EP verify operation are repeatedly performed until there are no over-erased cells. FIG. 19 shows a condition in which the fourth EP verify operation is executed.

As shown in FIG. 19, each gate of the memory cell transistors MTo2 and MTe2 is supplied with the EP verification voltage EpV, and the source line SL is supplied with the cell source CELSRC. In the fourth EP verify operation, the EP verify voltage EpV is "$V_{EP}$", and the fourth voltage $V_{CS}$ is supplied as the cell source CELSRC. The fourth voltage is a voltage lower than the first voltage to the third voltage.

After the fourth preliminary program operation, a write operation or a read operation is performed in response to a write request received from the host device. In these operations, the voltage supplied to the source line SL is the fourth voltage.

[1-11-5. Change in Memory Cell Threshold-Voltage Distributions by EP Operation]

Figure 20:
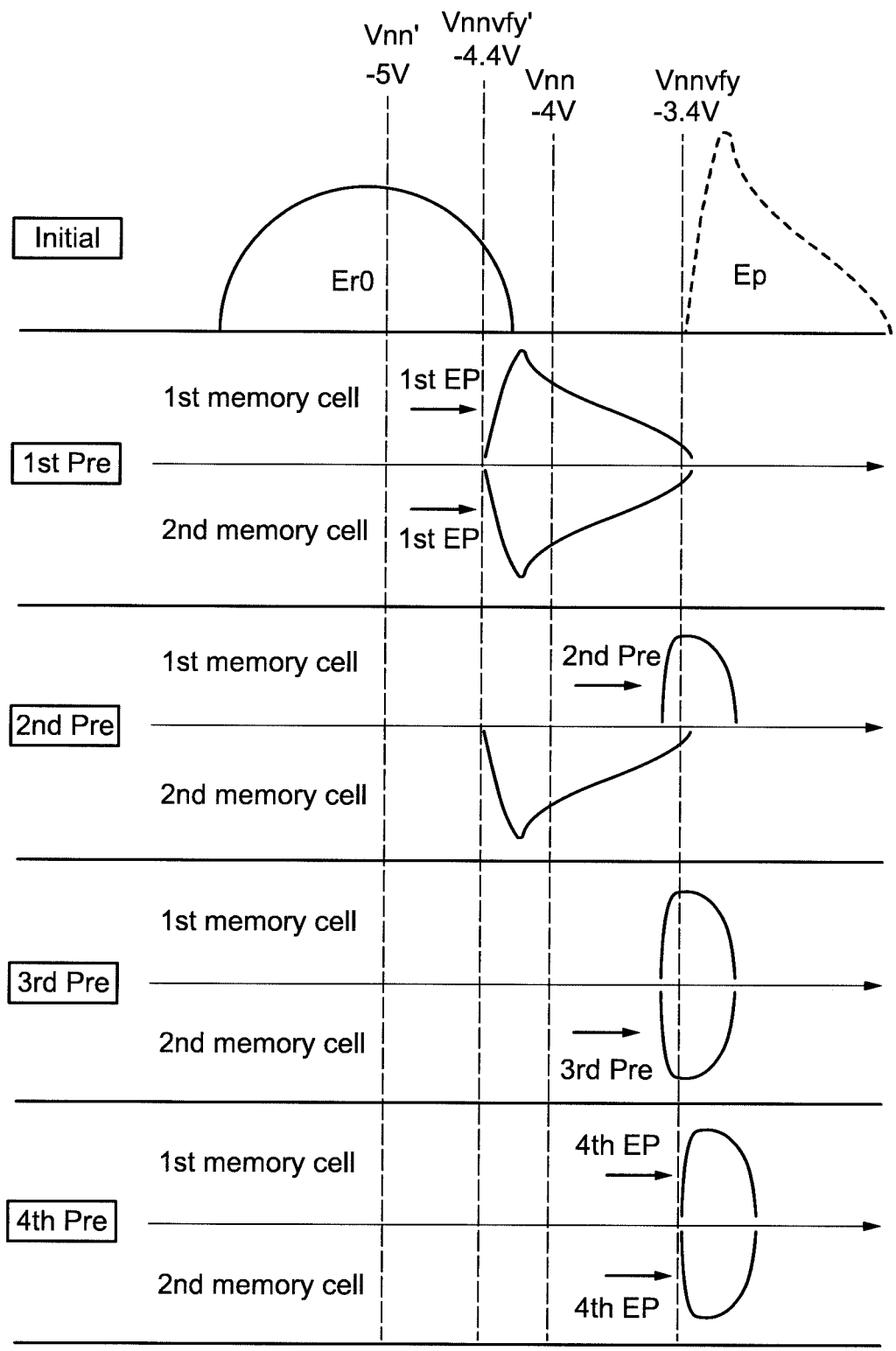
FIG. 20 is a diagram showing a threshold voltage distribution of a memory cell transistor after a program operation in a semiconductor memory device according to an embodiment.

FIG. 20 is a diagram for explaining a threshold voltage distribution of a memory cell transistor after a program operation in a semiconductor memory device according to an embodiment. In FIG. 20, in the EP operation shown in FIG. 16 to FIG. 19, the threshold voltage distribution of the initial state (Initial), the state after the first preliminary program operation (1st Pre), the state after the second preliminary program operation (2nd Pre), the state after the third preliminary program operation (3rd Pre), and the state after the fourth preliminary program operation (4th Pre) is shown.

As the threshold voltage distribution of the initial state (Initial), the threshold voltage distribution of the over-erased state (Er0) is displayed as a solid line, as a reference, and the threshold voltage distribution of the erase state after the conventional EP operation (Ep) is indicated by a dotted line. As the threshold voltage distribution of the first to fourth preliminary program operations (1st Pre to 4th Pre), the threshold voltage distribution of the memory cell transistor MTe2 (1st memory cell) is shown in the upper stage, and the threshold voltage distribution of the memory cell transistor MTo2 (2nd memory cell) is shown in the lower stage.

In FIG. 20, a case where the lowest voltage Vnn that can be generated in the semiconductor memory device is −4V will be described. In this example, the conventional EP verify operation is performed while the voltage "$V_{CS}$" is supplied as the cell source CELSRC and Vnnvfy (−3.4V) is supplied as the EP verify voltage EpV. The lower limit (Vnnvfy) of the threshold voltage profile after the EP operation, a constant margin (+0.6V) is ensured from the voltage Vnn (−4V), is set to −3.4V. In the case of the conventional EP verify operation, the threshold voltage distribution after the EP operation was a broad profile displayed by dotted lines as the threshold voltage distribution of the initial state (Initial) in FIG. 20 because the threshold voltage distribution is made higher by the EP operation from the over-erased state (Er0) to the erase state (Ep).

On the other hand, in the present embodiment, as shown in FIG. 17, Vnn (−4V) is supplied to the gate of the memory cell transistor MTo2, and the voltage "$V_{CS}+\Delta V_{CS}$" is supplied as the cell sources CELSRC. For example, when "$\Delta V_{CS}$" is 1V, the potential difference (VGS=Vnn−($V_{CS}+\Delta V_{CS}$)) between the source and the gate of the memory cell transistors MTo2 is 1V larger than that of VGS (Vnn−$V_{CS}$) when the voltage "$V_{CS}$" is supplied as the cell source CELSRC as in the conventional operation. Therefore, in the present embodiment, since the VGS of the memory cell transistor MTo2 can be increased by "$\Delta V_{CS}$" compared with the conventional VGS, the memory cell transistor MT can be forcibly turned OFF when the threshold voltage distribution is equal to or higher than the threshold voltage distribution of "Vnn−$\Delta V_{CS}$".

In other words, when the voltage "$V_{CS}+\Delta V_{CS}$" is supplied as the cell source CELSRC, Vnnvfy', which is the effective EP verify voltage EpV, becomes Vnnvfy−$\Delta V_{CS}$ (−4.4V), and the lower limit value (Vnnvfy') of the threshold voltage distribution after the EP operation becomes −4.4V. Consequently, a threshold voltage distribution with −4.4V as the lower limit is obtained as the threshold voltage distribution of the memory cell transistors MTo2 and MTe2 after the first preliminary program operation, as shown in "1st Pre" in FIG. 20.

In Initial, it is not possible to determine which of the memory cell transistors MTo2 and MTe2 is the over-erased cell. However, if the voltage "$V_{CS}+\Delta V_{CS}$" is supplied as the cell source CELSRC in the "1st Pre" state, the lower limit of the threshold voltage distribution after the first preliminary program operation (1st Pre) becomes equal to or higher than the threshold voltage distribution Vnnvfy'. Therefore, in the second preliminary program operation (2nd Pre) and the third preliminary program operation (3rd Pre), the memory cell facing the EP verify operation can be controlled to the OFF state by applying Vnn' to the memory cell facing the memory cell to be subjected to the EP verify operation. Consequently, the threshold voltage distribution formed by the second preliminary program operation (2nd Pre) and the third preprogram operation (3rd Pre) is not affected by the opposing memory cells and is constrained by the program voltage width applied to the memory cell performing the EP verify operation. Consequently, as shown in "2nd Pre" and "3rd Pre" in FIG. 20, it is possible to obtain a threshold voltage distribution having a narrower width than the threshold voltage distribution after the first preliminary program operation.

The threshold voltage distribution when the voltage "$V_{CS}+\Delta V_{CS}$" is supplied as the cell source CELSRC may be different from the threshold voltage distribution when the voltage "$V_{CS}$" is supplied during the read operation. For example, when the voltage "$V_{CS}+\Delta V_{CS}$" is supplied as the cell source CELSRC, even if the lower limit value (Vnnvfy) of the threshold voltage distribution is −3.4V or more by the EP verify operation, the lower limit value (Vnnvfy) when the voltage "$V_{CS}$" is supplied as the cell source CELSRC may be smaller than −3.4V. In such cases, the fourth preliminary program operation is executed with the voltage "$V_{CS}$" supplied to the cell source CELSRC (see FIG. 19). By the first preliminary program operation to the fourth preliminary program operation described above, as shown in FIG. 20, it is possible to obtain a threshold voltage distribution, having a narrow width, wherein the lower limit value is −3.4V. By the EP operation described above, since the over-erase cell does not exist and the erased state in which the width of the threshold voltage distribution is narrow can be obtained, the accuracy of the subsequent write operation can be improved. As a result, it is possible to improve the accuracy of the read operation.

2. Second Embodiment

A memory system according to a second embodiment will be described with reference to FIG. 21 to FIG. 29. In the second embodiment, a specific configuration for realizing the EP operation shown in the first embodiment will be described. In the first embodiment, when the EP operation is performed, the voltage of the cell source CELSRC needs to be high ($\Delta V_{CS}$). In such cases, the voltage of the bit-line BL must be increased by increasing the voltage of the cell source CELSRC. The voltage of the bit line BL is supplied from a power supply line VDD (see FIG. 21), considering the operation of the other circuits, it is not easy to increase the voltage supplied to the power line VDD. In the following description, a method for increasing the voltage of the bit line BL and a verify method in this case will be described.

2-1. Circuit Configuration of Sense Amplifier Unit

Figure 21:
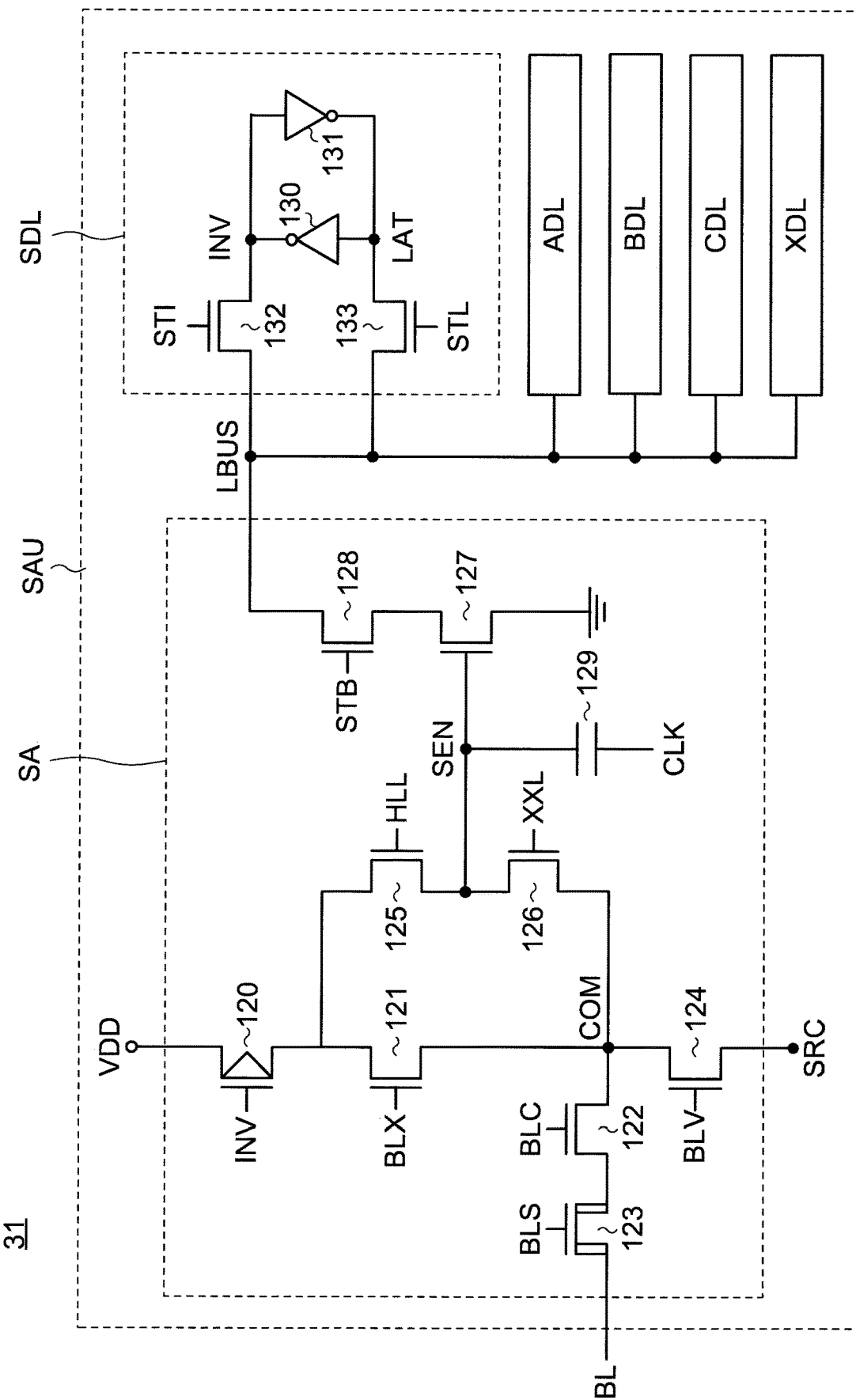
FIG. 21 is a diagram showing a circuit configuration of a sense amplifier of a semiconductor memory device according to an embodiment.

FIG. 21 is a diagram showing a circuit configuration of a sense amplifier of a semiconductor memory device according to an embodiment. The circuit configuration of a sense amplifier unit SAU shown in FIG. 21 is an example, and the circuit configuration of the sense amplifier unit SAU of the semiconductor memory device according to this embodiment is not limited to the configuration shown in FIG. 21.

The sense amplifier 31 shown in FIG. 21 includes a plurality of sense amplifier units SAU each associated with bit lines BL0 to BLm (m is a natural number of one or more, for example, corresponding to BL0 to BL7 of FIG. 4). In FIG. 21, the circuit configuration of one sense amplifier unit SAU is extracted and shown.

The sense amplifier unit SAU temporarily holds, for example, the data read from the memory cell transistor MT provided for the corresponding bit line BL. The sense amplifier unit SAU can perform a logical operation using the temporarily held data. As will be described in detail later, the semiconductor memory device can execute the read operation according to the present embodiment by using the sense amplifier 31 (the sense amplifier unit SAU).

As shown in FIG. 21, the sense amplifier unit SAU includes a sense amplifier unit SA, and latch circuits SDL, ADL, BDL, CDL, XDL. The sense amplifier section and the latching circuits are connected by a bus LBUS so that data can be transmitted and received from each other.

For example, in the read operation, by sensing the memory cell transistor MT connected to the bit line BL corresponding to the sense amplifier unit SA, the sense amplifier unit SA reads data from the memory cell transistor MT and determines whether the read data is "0" or "1". The sense amplifier section SA includes, for example, p-channel MOS transistor 120, n-channel MOS transistors 121-128, and capacitor 129.

A first end of the transistor 120 is connected to the power supply line VDD. A gate of the transistor 120 is connected to a node INV in the latch circuit SDL. A first end of the transistor 121 is connected to a second end of the transistor 120. A second end of the transistor 121 is connected to a node COM. A control signal BLX is input to a gate of the transistor 121. A first end of the transistor 122 is connected to the node COM. A control signal BLC is input to the gate of the transistor 122. The transistor 123 is a high breakdown voltage MOS transistor. A first end of the transistor 123 is connected to a second end of the transistor 122. A second end of the transistor 123 is connected to a corresponding bit line BL. A control signal BLS is input to the gate of the transistor 123.

A first end of the transistor 124 is connected to the node COM. A second end of the transistor 124 is connected to a node SRC. A control signal BLV is input to the gate of the transistor 124. A first end of the transistor 125 is connected to the second end of the transistor 120 and the first end of the transistor 121. A second end of the transistor 125 is connected to a node SEN. A control signal HLL is input to the gate of the transistor 125. A first end of the transistor 126 is connected to the node SEN. A second end of the transistor 126 is connected to the node COM. A control signal XXL is input to a gate of the transistor 126. The node SEN may be referred to as a sense node.

A first end of the transistor 127 is grounded. A gate of the transistor 127 is connected to the node SEN. A first end of the transistor 128 is connected to a second end of the transistor 127. A second end of the transistor 128 is connected to the bus LBUS. A control signal STB is input to a gate of the transistor 128. A first end of the capacitor 129 is connected to the node SEN. A clock CLK is input to a second end of the capacitor 129.

The control signals BLX, BLC, BLS, BLV, HLL, XXL, and STB are generated by the sequencer 27 shown in FIG. 2, for example. For example, a voltage VHSA, which is an internal power supply voltage of the semiconductor memory device, is applied to the power supply line VDD connected to the first end of the transistor 120. For example, a voltage VSS, which is a ground voltage of the semiconductor memory device, is applied to the node SRC.

The latch circuits SDL, ADL, BDL, CDL, and XDL temporarily hold the read data. For example, the latch circuit XDL is connected to the register 26 and is used for the input and output of data between the sense amplifier unit SAU and the input/output circuit 22.

The latch circuit SDL includes, for example, inverters 130, 131 and n-channel MOS transistors 132, 133. An input node of the inverter 130 is connected to a node LAT. An output node of the inverter 130 is connected to the node INV. An input node of the inverter 131 is connected to the node INV. An output node of the inverter 131 is connected to the node LAT. A first end of the transistor 132 is connected to the node INV. A second end of the transistor 132 is connected to the bus LBUS. A control signal STI is input to a gate of the transistor 132. A first end of the transistor 133 is connected to the node LAT. A second end of the transistor 133 is connected to the bus LBUS. A control signal STL is input to a gate of the transistor 133. For example, data held at the node LAT corresponds to data held in the latch circuit SDL. The data held at the node INV corresponds to the inverted data of the data held at the node LAT. Since the circuit configuration of the latch circuits ADL, BDL, CDL and XDL are the same as the circuit configuration of the latch circuit SDL, a description thereof will be omitted.

In the above sense amplifier 31, the timing at which each of the sense amplifier units SAU determines the data read to the bit line BL is determined based on the timing at which the control signal STB is asserted. In the present embodiment, "the sequencer 27 asserts the control signal STB" means that the sequencer 27 changes the control signal STB from "L" level to "H" level.

The configuration of the sense amplifier 31 according to the present embodiment is not limited to the above configuration. For example, in the sense amplifier unit SAU, the transistor 128 in which the control signal STB is input to the gate may be constituted by the p-channel MOS transistor. In this case, "the sequencer 27 asserts the control signal STB" means that the sequencer 27 changes the control signal STB from "H" level to "L" level.

The number of the latch circuits included in the sense amplifier unit SAU is arbitrary. The number of the latch circuits is designed based on, for example, the number of bits of the data held by one memory cell transistor MC. A plurality of bit lines BL may be connected to one sense amplifier unit SAU via a selector.

Figure 22:
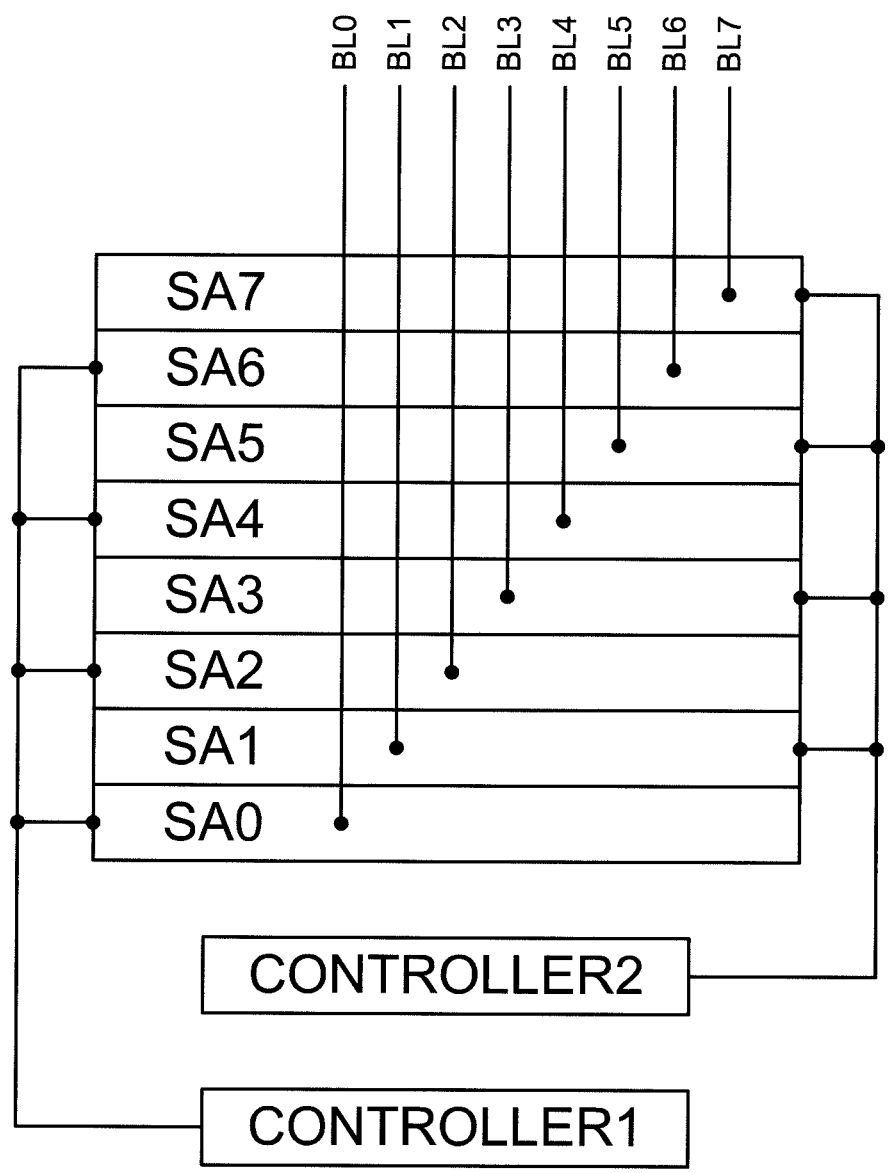
FIG. 22 is a diagram showing a connection relationship between a bit line and a sense amplifier in a semiconductor memory device according to an embodiment.

FIG. 22 is a diagram showing a connection relationship between a bit line and a sense amplifier in a semiconductor memory device according to an embodiment. As shown in FIG. 22, corresponding to the bit lines BL0 to BL7, sense amplifiers SA0 to SA7 are provided. The sense amplifiers SA0 to SA7 are connected to the bit lines BL0 to BL7, respectively. The sense amplifiers SA0, SA2, SA4, SA6 are connected to a first controller (CONTROLLER 1) and are collectively controlled by the first controller (CONTROLLER 1). The sense amplifiers SA1, SA3, SA5, SA7 are connected to a second controller (CONTROLLER 2) and are controlled collectively.

2-2. EP Verify Operation

Figure 23:
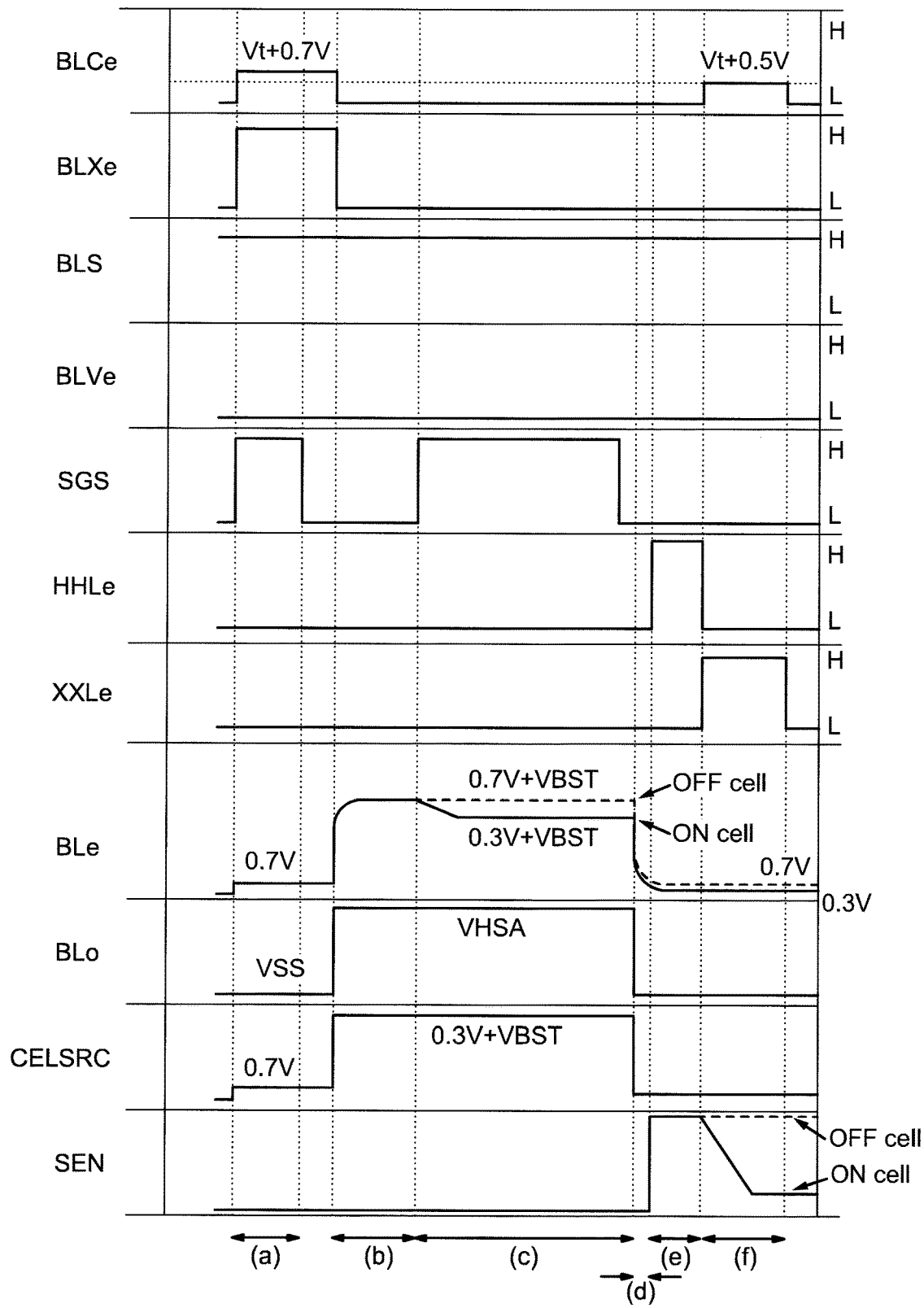
FIG. 23 is a timing chart showing a verify operation in a semiconductor memory device according to an embodiment.

The EP verify operation of the memory system according to the second embodiment will be described with reference to FIG. 23 to FIG. 29. In the present embodiment, an EP verify operation will be described. The verify operation and the read operation in the write operation are also the same as those described below. FIG. 23 is a timing chart showing a verify operation in a semiconductor memory device according to an embodiment. FIG. 24 to FIG. 29 are circuit diagrams for explaining a verify operation in a semiconductor memory device according to an embodiment.

Waveforms of the signals BLCe, BLXe, BLS, BLVe, SGS, HHLe, and XXLe shown in FIG. 23 show a control signal supplied to the gate terminal of the transistor having the same reference numerals as the signal described above in the circuit diagram of FIG. 24 to FIG. 29, respectively. The waveforms of BLe, BLo, CELSRC, and SEN in FIG. 23 show the voltages supplied to adjacent bit lines BLe, BLo (corresponding to, for example, BL0, BL1 in FIG. 4), node CELSRC, and SEN, respectively, in the circuit diagram of FIG. 24 to FIG. 29. In the following embodiments, only the circuit connected to the bit line BLe is shown, a circuit having the same configuration as the circuit mentioned above is connected to the bit line BLo.

Figure 24:
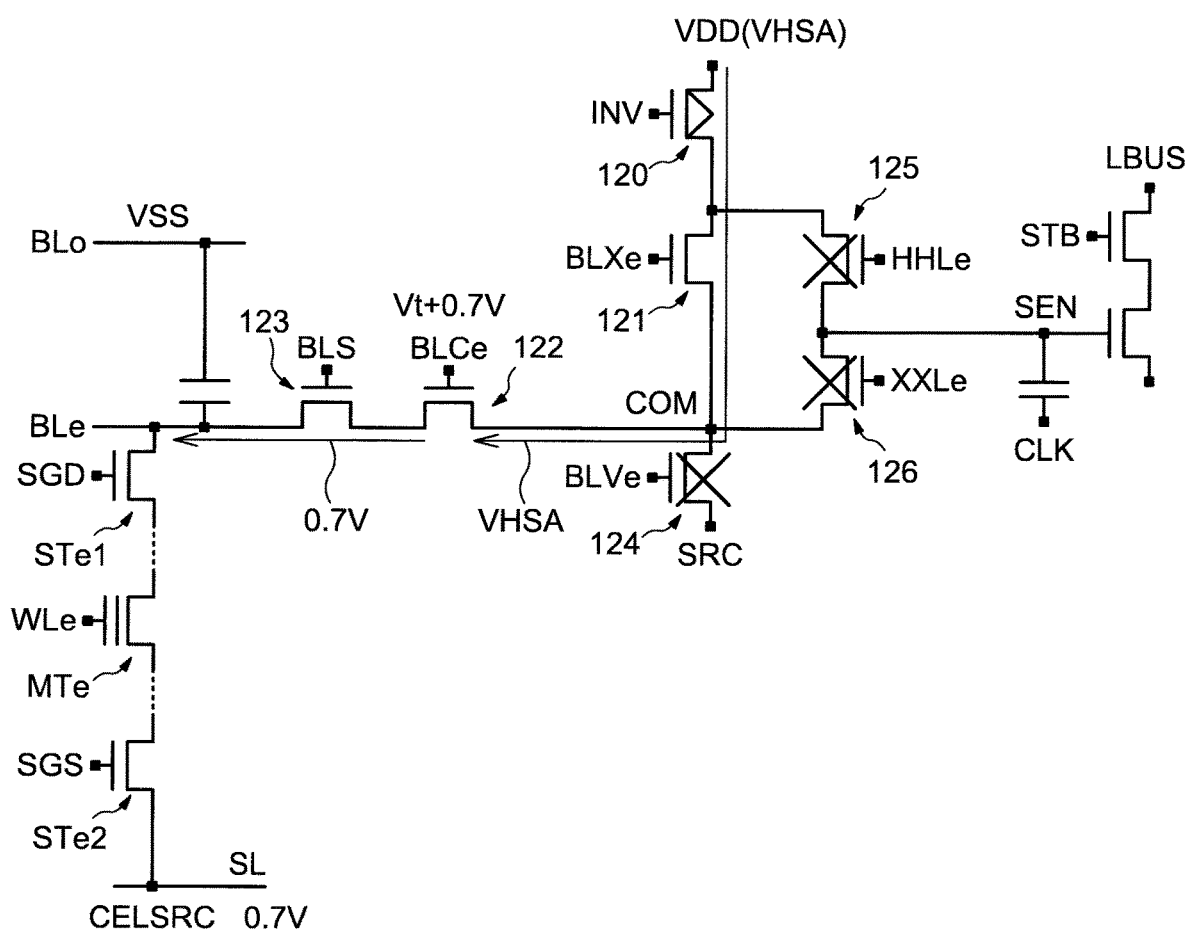
FIG. 24 is a circuit diagram for explaining a verify operation in a semiconductor memory device according to an embodiment.

BLCe, BLXe, BLS, BLVe, HHLe, XXLe, INV, BLe, and STB shown in FIG. 23 to FIG. 29 correspond to BLC, BLX, BLS, BLV, HHL, XXL, INV, BL, and STB shown in FIG. 21, respectively. In FIG. 23, a portion of the control signal shown in FIG. 24 is displayed. It is not necessary to describe the waveform of the control signal in detail, if only the state of the transistor (ON state or OFF state) needs to be explained, "x" is shown for the symbol of the transistor in FIG. 24, the signal waveform in FIG. 23 is omitted.

As described below, the EP verify operation in the present embodiment includes a pre-charge period, a coupling boost period, a sense period, a coupling step-down period, a SEN charge period, and a read period.

[2-2-1. Pre-Charge Period (a)]

A pre-charge period (a) will be described with reference to FIG. 23 and FIG. 24. As shown in FIG. 23, in the pre-charge period (a), the control signal of "Vt+0.7V" is supplied to BLCe, the signals supplied to BLXe, SGS are switched from the OFF signal (signal for controlling the corresponding transistor to the OFF state) to the ON signal (signal for controlling the corresponding transistor to the ON state), and "0.7V" is supplied as the cell source CELSRC. In FIG. 23, the OFF signal corresponds to "L" and the ON signal corresponds to "H". SGD is controlled in accordance with the address of the memory cell where the EP verify operation is performed. The word line WL is supplied with a voltage at which the memory cell transistor MTe is turned ON regardless of the stored charge.

As shown in FIG. 24, in the pre-charge period (a), an ON signal is supplied to INV, BLXe, BLCe, BLS, SGD, and SGS, and an OFF signal is supplied to HHLe, XXLe, and BLVe.

The voltage VHSA supplied from the power line VDD is supplied to the node COM via the transistors 120, 121. That is, the voltage VHSA is supplied to the first end of the transistor 122. The voltage "0.7V" higher than the threshold voltage Vt of the transistor 122 is supplied as BLCe. Therefore, the transistor 122 outputs "0.7V" to the second end based on the voltage VHSA supplied to the first end and the "Vt+0.7V" supplied to the gate. Since the ON signal is supplied to BLS, "0.7V" is supplied to the bit line BLe via the transistor 123 (see waveform of BLe in FIG. 23).

Since "0.7V" is supplied as the cell source CELSRC and an ON signal is supplied to SGS, "0.7V" is supplied to the source and the drain of each memory cell transistors MTe provided in the bit line BLe and the string. In other words, in the pre-charge period (a), the same voltage (0.7V) is supplied to the bit line BL and the source line SL connected to the string subject to the EP verify operation.

In the above example, although the configuration in which "0.7V" is supplied as the cell source CELSRC and "Vt+0.7V" is supplied as BLCe is exemplified, the present invention is not limited to this configuration. For example, a voltage ($\alpha$V) other than 0.7V may be supplied as the cell source CELSRC. In this example, "Vt+$\alpha$V" is supplied as BLCe.

Since the signal supplied to SGS is switched from the ON signal to the OFF signal and the selection transistor STe2 is switched to the OFF state after the pre-charge period (a) is completed, the connection between the bit line BLe and the source line SL is disconnected.

[2-2-2. Coupling Boost Period (b)]

A coupling boost period (b) will be described with reference to FIG. 23 and FIG. 25. As shown in FIG. 23, in the coupling boost period (b), the signal supplied to BLCe, BLXe is switched from the ON signal to the OFF signal. After the OFF signal is supplied to BLCe, BLXe, the bit line BLo adjacent the bit line BLe is boosted from VSS to VHSA. Together with the boost of the bit line BLo, the bit line BLe and the cell source CELSRC are boosted (+VBST).

Figure 25:
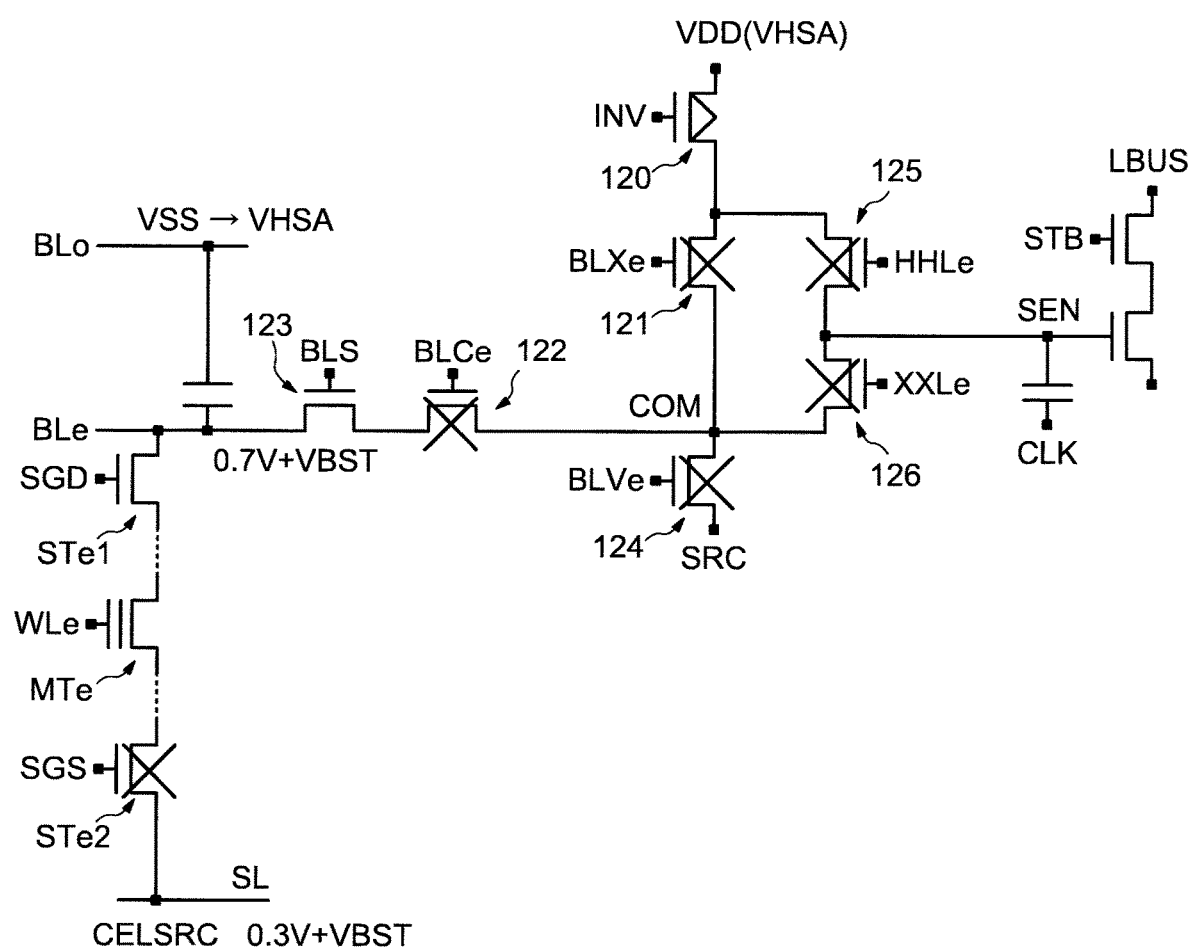
FIG. 25 is a circuit diagram for explaining a verify operation in a semiconductor memory device according to an embodiment.

As shown in FIG. 25, in the coupling boost period (b), while the selection transistor STe2 is switched to the OFF state as described above, the transistors 121 and 122 are switched to the OFF state. Therefore, the bit line BLe becomes a floating state. In this condition, when the bit line BLo adjacent to the bit line BLe is boosted from VSS to VHSA, the bit line BLe is boosted because of capacitively coupling with the bit line BLo. When the voltage to be boosted by the capacitive coupling described above is VBST, the voltage of the bit line BLe is increased to "0.7V+VBST". In order to keep the potential difference between the bit line BLe and the source line SL constant, the cell source CELSRC is changed from "0.7V" to "0.3V+VBST" in accordance with the boosting by the capacitive coupling. In this state, the voltage shown in FIG. 16 to FIG. 18 is applied to the memory hole. The above "VBST" corresponds to the "$\Delta V_{CS}$" of the EP operation in the first embodiment (see FIG. 16 to FIG. 18).

Describing the above configuration in other words, in a state where the potential of the bit line BLe (the first bit line) is floating, the potential of the bit line BLe (the first bit line) is boosted by the voltage of the bit line BLo (the second bit line) being boosted. In this condition, the EP verify operation is executed.

The transistor 122 connected in series between the bit line BLe and the power supply line VDD is referred to as a "ninth transistor". As described above, the potential of the bit line BLe (the first bit line) is in a floating state by controlling both the selection transistor STe2 (the second transistor) and the transistor 122 (the ninth transistor) to the OFF state.

[2-2-3. Sense Period (c)]

A sense period (c) will be described with reference to FIG. 23 and FIG. 26. As shown in FIG. 23, in the sense period (c), while the OFF signal is supplied to BLCe, the signal supplied to SGS is switched from the OFF signal to the ON signal. In other words, the selection transistor STe2 (the second transistor) is switched to the ON state in a state where the voltage of the bit line BLe (the first bit line) is boosted.

Figure 26:
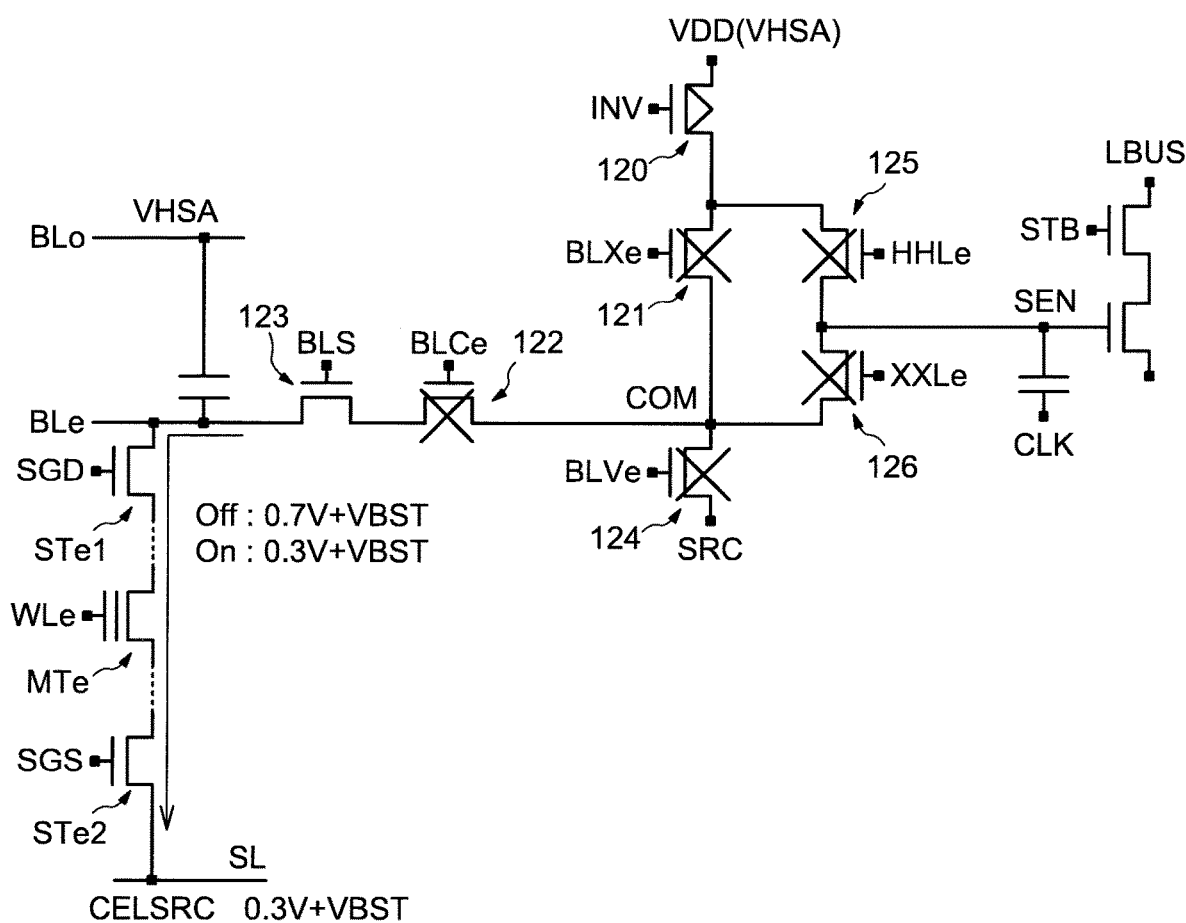
FIG. 26 is a circuit diagram for explaining a verify operation in a semiconductor memory device according to an embodiment.

As shown in FIG. 26, in the sense period (c), the bit line BLe and the source line SL are connected via the string in a state where the bit line BLe and the node COM are disconnected. Among the plurality of memory cell transistors MTe included in the string, the word line WLe of the memory cell transistor MTe which is the target for the EP verify operation, is supplied with a read voltage for reading data held in the memory cell. The other memory cell transistors MTe are supplied with a voltage at which the memory cell transistors MTe are turned ON regardless of the stored charge.

With the above configuration, the charge supplied to the bit line BLe moves to the source line SL through the memory cell transistor MTe selected by the word line WL. Therefore, when the memory cell transistor MTe is in the ON state, since the bit line BLe and the source line SL are electrically connected, the voltage of the bit line BLe is stepped down to "0.3V+VBST" based on the voltage supplied to the cell source CELSRC. On the other hand, when the memory cell transistor MTe is in the OFF state, the bit line BLe and the source line SL are not electrically connected, so that the voltage of the bit line BLe is maintained at "0.7V+VBST". That is, the voltage of the bit line BLe is determined by the state of the target memory cell transistor MTe.

As the waveform of BLe in (c) of FIG. 23 shows, when the memory cell transistor MTe is turned ON when the read voltage is supplied, that is, when the memory cell transistor MTe is the ON cell, the voltage of the bit line BLe is stepped down to "0.3V+VBST" (solid line). If the memory cell transistor MTe is turned OFF when the read voltage is supplied, that is, when the memory cell transistor MTe is the OFF cell, the voltage of the bit line BLe is maintained at "0.7V+VBST" (dotted line).

As described above, when the target memory cell transistor MTe is in the ON state, after a time sufficient for the voltage of the bit line BLe to stabilize has elapsed, the signal supplied to the SGS is switched from the ON signal to the OFF signal.

[2-2-4. Coupling Step-Down Period (d)]

A coupling step-down period (d) will be described with reference to FIG. 23 and FIG. 27. As shown in FIG. 23, in the coupling step-down period (d), the bit line BLo is stepped down from VHSA to VSS while the OFF signal is supplied to BLCe, SGS. As the voltage of the bit line BLo is lowered, the voltage of the bit line BLe is lowered from "0.7V+VBST" (dotted line) to "0.7V" (dotted line), or from "0.3V+VBST" (solid line) to "0.3V" (solid line). As the voltage of the bit line BLe drops, the cell source CELSRC drops from "0.3V+VBST" to "0.3V".

Figure 27:
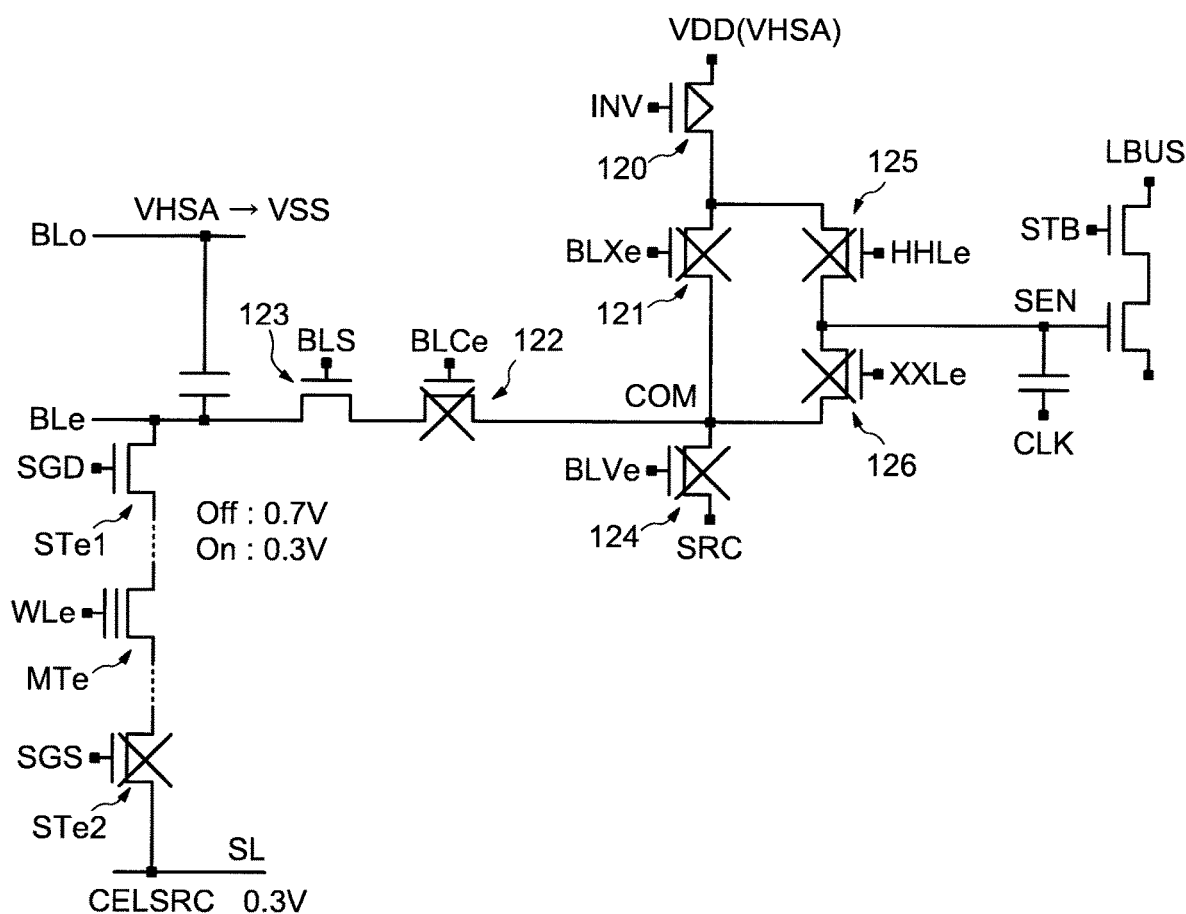
FIG. 27 is a timing chart showing a verify operation in a semiconductor memory device according to an embodiment.

As shown in FIG. 27, in the coupling step-down period (d), the selection transistor STe2 is switched to the OFF state as described above, and the transistor 122 is maintained in the OFF state. Therefore, the bit line BLe becomes a floating state. In this condition, when the bit line BLo drops from VHSA to VSS, the bit line BLe capacitively coupled to the bit line BLo is stepped down. As a result, when the memory cell transistor MTe is the OFF cell, the voltage of the bit line BLe is lowered from "0.7V+VBST" to "0.7V", and when the memory cell transistor MTe is the ON cell, the voltage of the bit line BLe is lowered from "0.3V+VBST" to "0.3V". In order to keep the potential difference between the bit line BLe and the source line SL constant, the cell source CELSRC is changed from "0.7V+VBST" to "0.7V" or from "0.3V+VBST" to "0.3V" in accordance with the step-down by the capacitive coupling.

[2-2-5. SEN Charge Period (e)]

An SEN charge period (e) will be described with reference to FIG. 23 and FIG. 28. As shown in FIG. 23, in the SEN charge period (e), while the OFF signal is supplied to BLXe, the signal supplied to HHLe is switched from the OFF signal to the ON signal. This control increases the voltage of the node SEN. That is, the node SEN is charged by the control described above.

Figure 28:
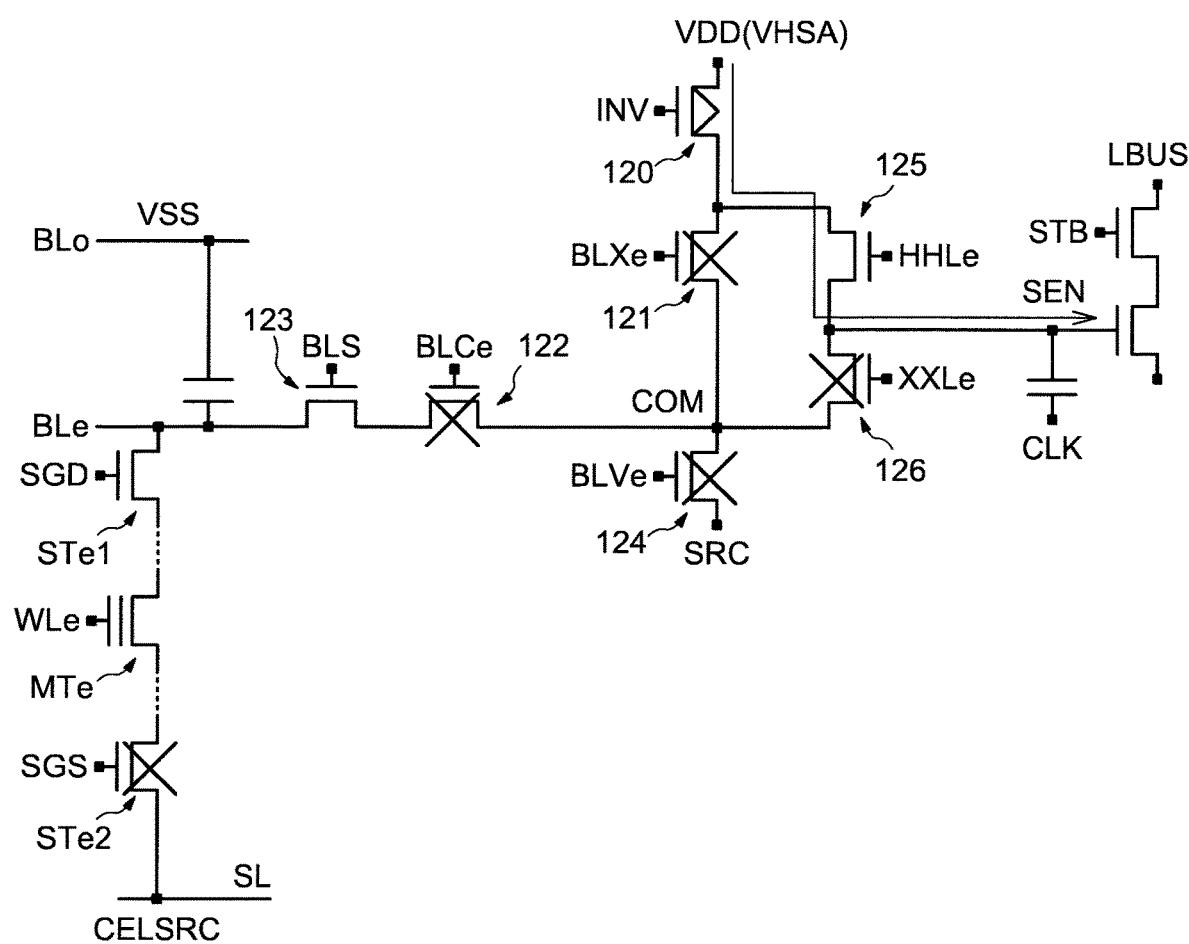
FIG. 28 is a circuit diagram for explaining a verify operation in a semiconductor memory device according to an embodiment.

As shown in FIG. 28, in the SEN charge period (e), the transistor 125 may be switched to the ON state while the transistors 121 and 126 remain in the OFF state. Therefore, the node SEN is charged by supplying the voltage VHSA to the node SEN. After enough time has elapsed to charge the node SEN, the signal supplied to HHLe is switched from the ON signal to the OFF signal.

[2-2-6. Read Period (f)]

A read period (f) will be described with reference to FIG. 23 and FIG. 29. As shown in FIG. 23, in the read period (f), while the OFF signal is supplied to HHLe as described above, the control signal of "Vt+0.5V" is supplied to BLCe, and the signal supplied to XXLe is switched from the OFF signal to the ON signal. By this control, the voltage of the node SEN is gradually lowered. The voltage supplied to BLCe in the read period (f) is lower than the voltage supplied to BLCe in the pre-charge period (a). Specifically, in the pre-charge period (a), "Vt+0.7V" is supplied to BLCe, whereas in the read period (f), "Vt+0.5V" is supplied to BLCe.

Figure 29:
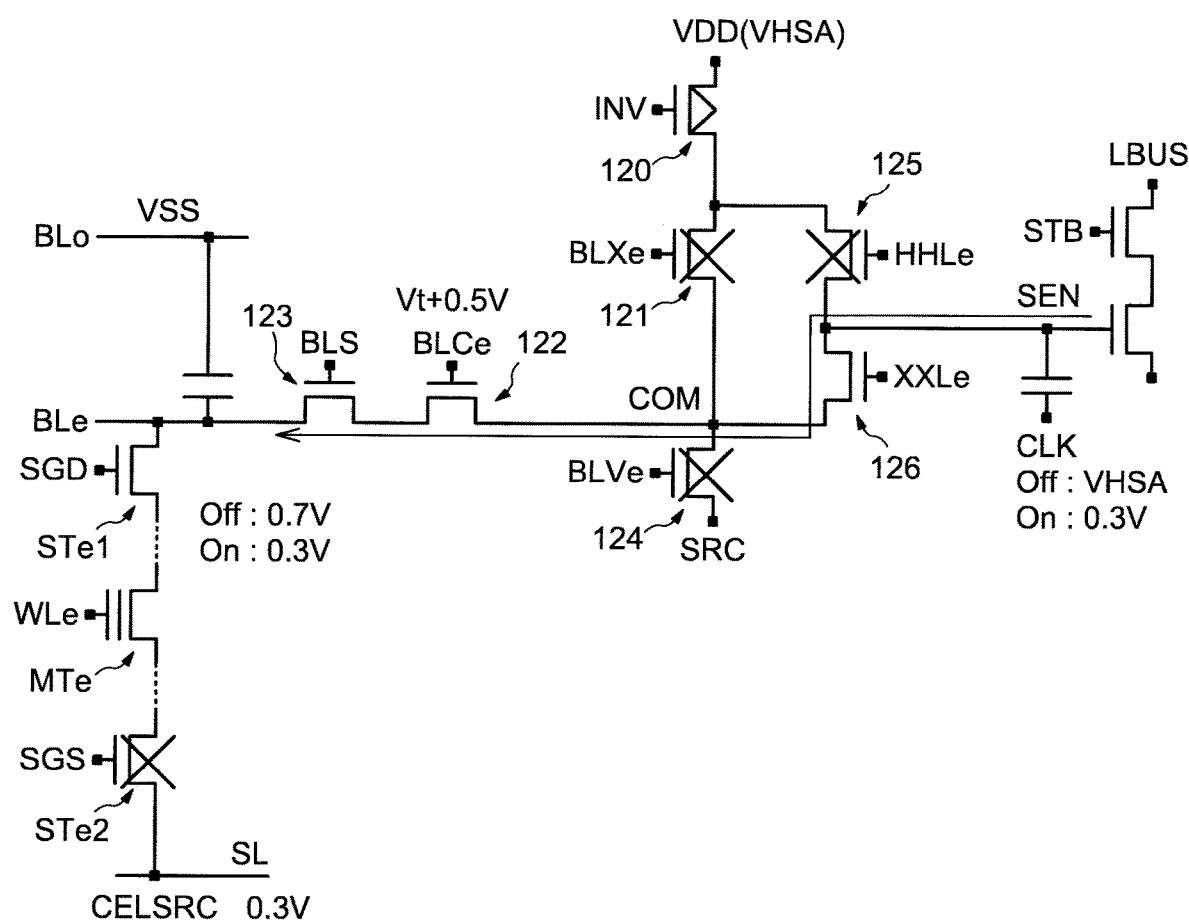
FIG. 29 is a circuit diagram for explaining a verify operation in a semiconductor memory device according to an embodiment.

As shown in FIG. 29, in the read period (f), since the transistors 122, 123, and 126 are turned ON, the node SEN is connected to the bit line BLe. As described above, when the memory cell transistor MTe is in the OFF state, the voltage of the bit line BLe is "0.7V", and when the memory cell transistor MTe is in the ON state, the voltage of the bit line BLe is "0.3V".

If the voltage of the bit line BLe is "0.7V", when "Vt+0.5V" is supplied to BLCe, the transistor 122 is turned OFF because VGS<0. On the other hand, if the voltage of the bit line BLe is "0.3V", when "Vt+0.5V" is supplied to BLCe, the transistor 122 is turned ON because VGS>0. That is, if the memory cell transistor MTe is an OFF cell, the voltage of the node SEN is maintained at VHSA because the transistor 122 is turned OFF. On the other hand, if the memory cell transistor MTe is an ON cell, the voltage of the node SEN is stepped down to "0.3V" because the transistor 122 is turned ON. It is possible to determine whether the memory cell transistor MTe subject to the EP verify operation is an ON cell or an OFF cell by measuring the voltage of the node SEN in this state.

In other words, the transistor 122 (the ninth transistor) is turned ON or OFF in accordance with the data held in the memory cell transistor MTe or MTo (the first memory cell or the second memory cell) by the control signal supplied to the gate of the transistor 122.

As described above, in the present embodiment, it is possible to boost the voltage of the bit line BL by using the capacitive coupling of the adjacent bit lines BL. Therefore, it is possible to boost the bit line BL without changing the voltage supplied to the power line VDD. A boosting method according to the present embodiment may be executed for all of the first preliminary program operation to the third preliminary program operation, or may be executed for a part of the first preliminary program operation to the third preliminary program operation.

In the present embodiment, although the configuration in which the EP verify operation is performed on the memory cell transistor MTe is exemplified, the same EP verify operation as described above can be performed on the memory cell transistor MTo.

3. Third Embodiment

A memory system according to a third embodiment will be described with reference to FIG. 30 to FIG. 36. In the third embodiment, similar to the second embodiment, a specific configuration for realizing the EP operation shown in the first embodiment will be described.

3-1. Circuit Configuration of Sense Amplifier Unit

Figure 30:
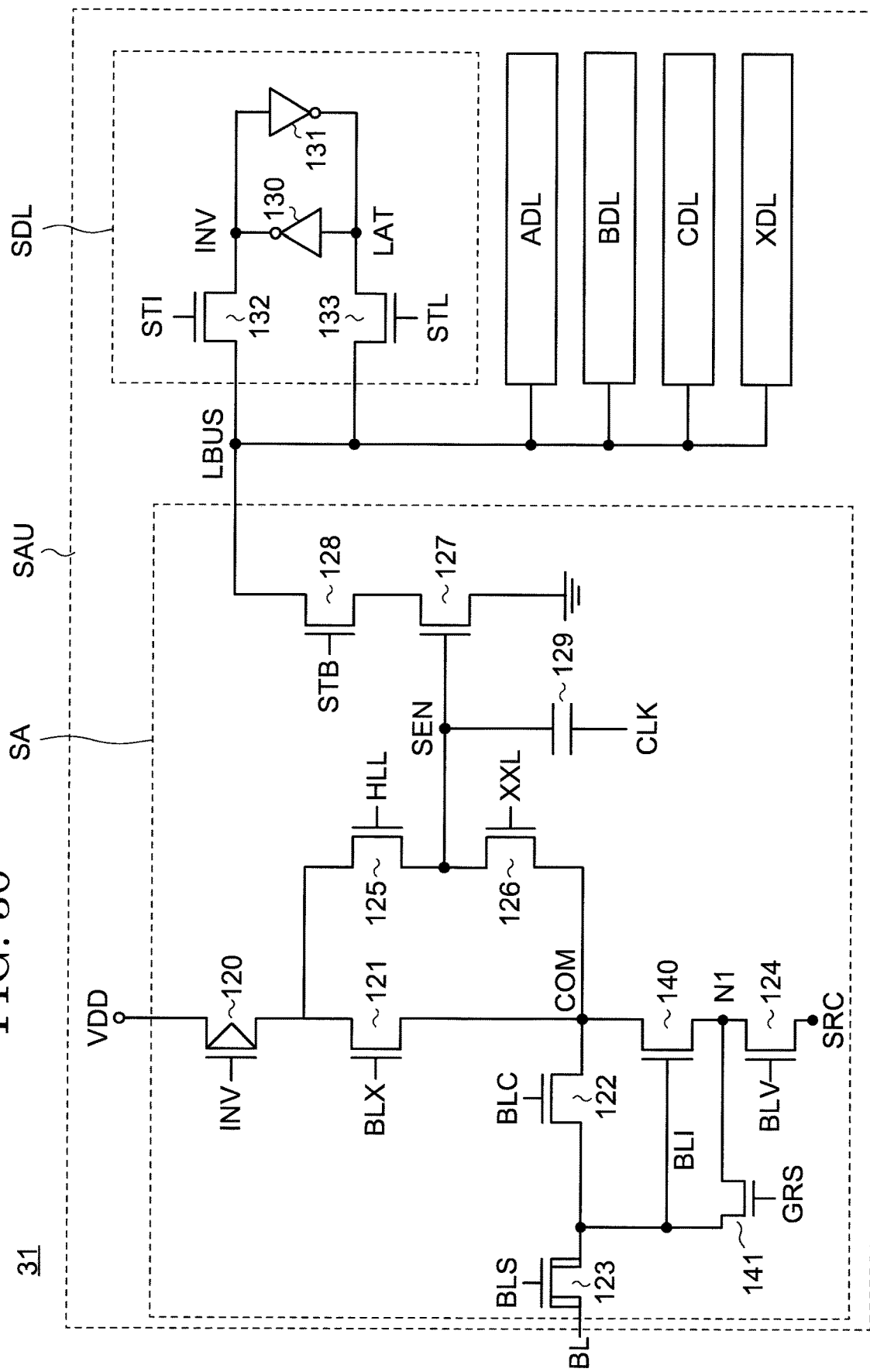
FIG. 30 is a diagram showing a circuit configuration of a sense amplifier of a semiconductor memory device according to an embodiment.

FIG. 30 is a diagram showing a circuit configuration of a sense amplifier of the semiconductor memory device according to an embodiment. Although the sense amplifier shown in FIG. 30 is similar to the sense amplifier shown in FIG. 21, the configurations of the sense amplifier sections SA are different. The sense amplifier shown in FIG. 30 includes transistors 140, 141 in addition to the transistors included in the sense amplifier shown in FIG. 21. In the following description, the same configuration as that of FIG. 21 among the configurations shown in FIG. 30 is omitted, and differences from FIG. 21 will be mainly described.

The transistor 140 is provided between the transistor 124 and the node COM. A first end of the transistor 140 is connected to the node COM. A second end of the transistor 140 is connected to a first end of the transistor 124. A gate of the transistor 140 is connected to a node BLI between the transistor 122 and the transistor 123.

The transistor 141 is provided between a node N1 and the node BLI. The node N1 is a node between the first end of the transistor 124 and the second end of the transistor 140. A first end of the transistor 141 is connected to the node BLI and the gate of transistor 140. A second end of the transistor 141 is connected to the node N1. A control signal GRS is input to a gate of the transistor 141.

In the configuration shown in FIG. 30, the transistor 122 is referred to as the "ninth transistor", the transistor 123 is referred to as a "tenth transistor", and the transistor 140 may be referred to as an "eleventh transistor". The transistor 122 (the ninth transistor) and the transistor 123 (the tenth transistor) are connected in series between the bit line BL (the first bit line) and the power supply line VDD (the first power supply line). The transistor 140 (the eleventh transistor) is connected in series between the power supply line VDD (the first power supply line) and the power supply line (the second power supply line) connected to the node SRC in which a voltage VSS is supplied. A drain of the transistor 140 (eleventh transistor) is connected to a source of the transistor 122 (the ninth transistor).

3-2. EP Verify Operation

Figure 31:
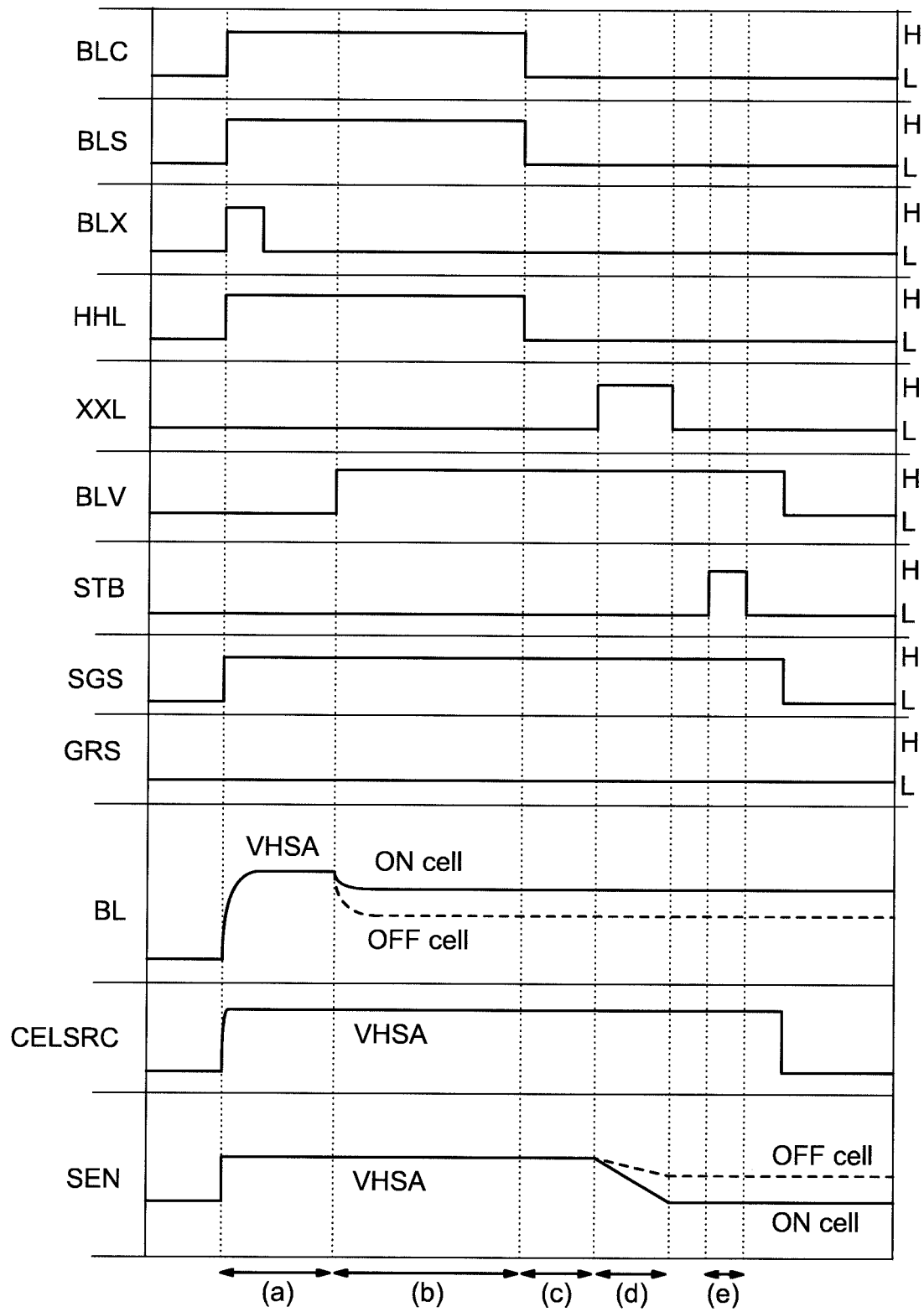
FIG. 31 is a timing chart showing a verify operation in a semiconductor memory device according to an embodiment.

An EP verify operation of the memory system according to the third embodiment will be described with reference to FIG. 31 to FIG. 36. FIG. 31 is a timing chart showing a verify operation in the semiconductor memory device according to the embodiment. FIG. 32 to FIG. 36 are circuit diagrams for explaining a verify operation in a semiconductor memory device according to an embodiment.

The waveforms of the respective signals BLC, BLS, BLX, HHL, XXL, BLV, STB, SGS, and GRS shown in FIG. 31 show the control signals supplied to the gate terminals of the transistors having the same reference numerals as the signals described above in the circuit diagrams of FIG. 32 to FIG. 36, respectively. The waveforms of BL, SEN, and CELSRC of FIG. 31 show the voltages supplied to the bit line BL, node CELSRC, and SEN in the circuit diagrams of FIG. 32 to FIG. 36, respectively.

As shown below, the EP verify operation in the present embodiment includes a pre-charge period, a bit line stabilization period, a BLI voltage holding period, a SEN discharge period, and a read period. In the following EP verify operation, the voltage is supplied from the source line SL to the bit line BL.

[3-2-1. Pre-Charge Period (a)]

A pre-charge period (a) will be described with reference to FIG. 31 and FIG. 32. As shown in FIG. 31, in the pre-charge period (a), the ON signal is supplied to BLC, BLS, BLX, HHL, SGS, and the OFF signal is supplied to XXL, BLV, STB, GRS. In addition, the voltage VHSA is supplied as the cell source CELSRC. According to this control, the voltage supplied to the bit line BL is gradually boosted to reach the voltage VHSA. The voltage supplied to the node SEN is steeply boosted to reach the voltage VHSA as compared with the voltage supplied to the bit line BL.

Figure 32:
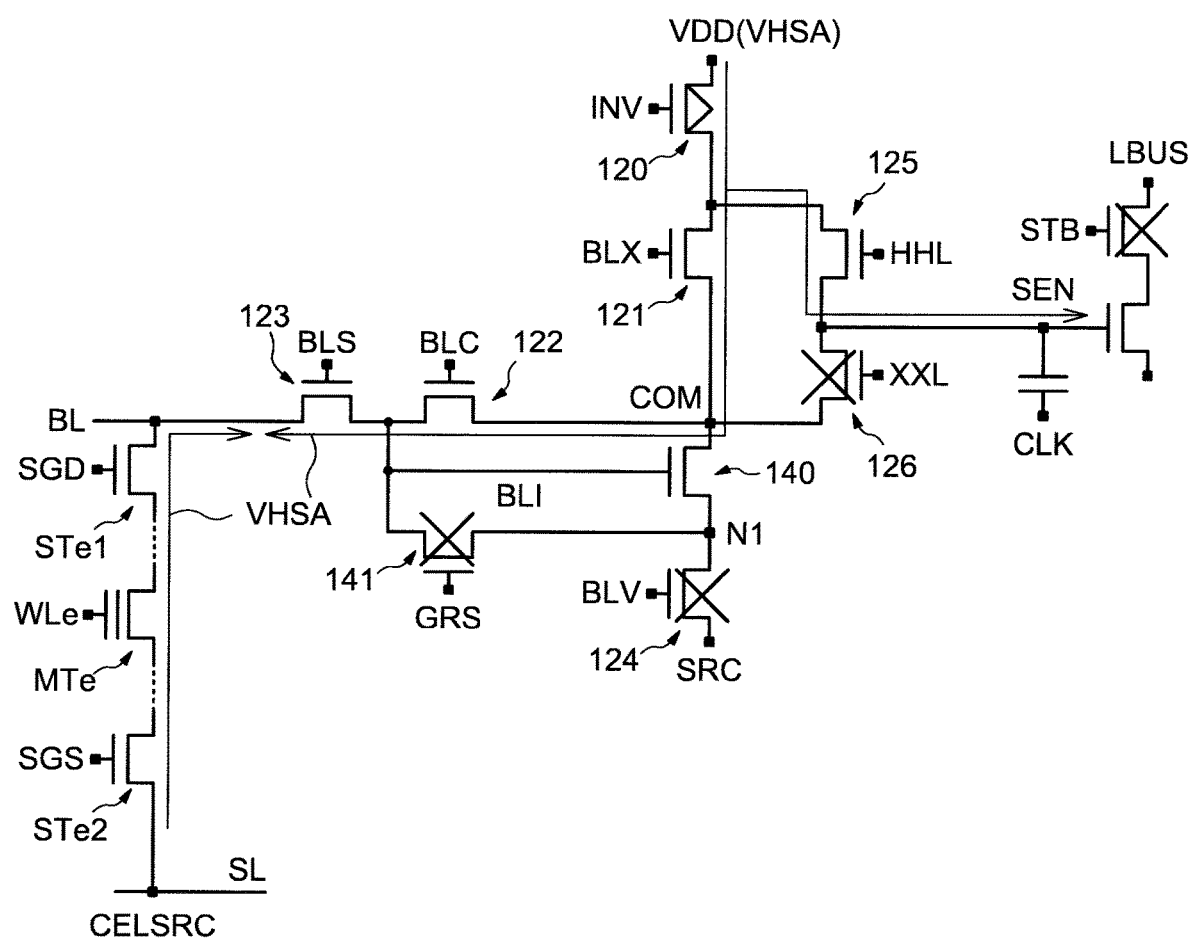
FIG. 32 is a circuit diagram for explaining a verify operation in a semiconductor memory device according to an embodiment.

As shown in FIG. 32, in the pre-charge period (a), the voltage VHSA supplied from the power supply line VDD is supplied to the node SEN via the transistors 120 and 125. Similarly, the voltage VHSA is provided to the bit line BL via transistors 120 to 123. The voltage VHSA supplied from the cell source CELSRC is provided to the bit line BL via the strings (the select transistor STe1, STe2, and the memory cell transistor MTe).

Subsequently, the signal supplied to BLX is switched from the ON signal to the OFF signal, and the supply of the voltage VHSA to the bit line BL through the transistor 121 is cut off. On the other hand, since the ON signal is continuously supplied to SGS, the voltage VHSA is continuously supplied from the cell source CELSRC to the bit line BL.

[3-2-2. Bit Line Stabilization Period (b)]

The bit line stabilization period (b) will be described with reference to FIG. 31 and FIG. 33. As shown in FIG. 31, in the bit line stabilization period (b), the signal supplied to BLV is switched from the OFF signal to the ON signal. According to this control, the voltage of the bit line BL is gradually stepped down and stabilizes at a voltage corresponding to the data held in the memory cell transistor MTe. Specifically, the voltage of the bit line BL after stabilization is lower when the memory cell transistor MTe is an OFF cell (dotted line) than when the memory cell transistor MTe is an ON cell (solid line).

Figure 33:
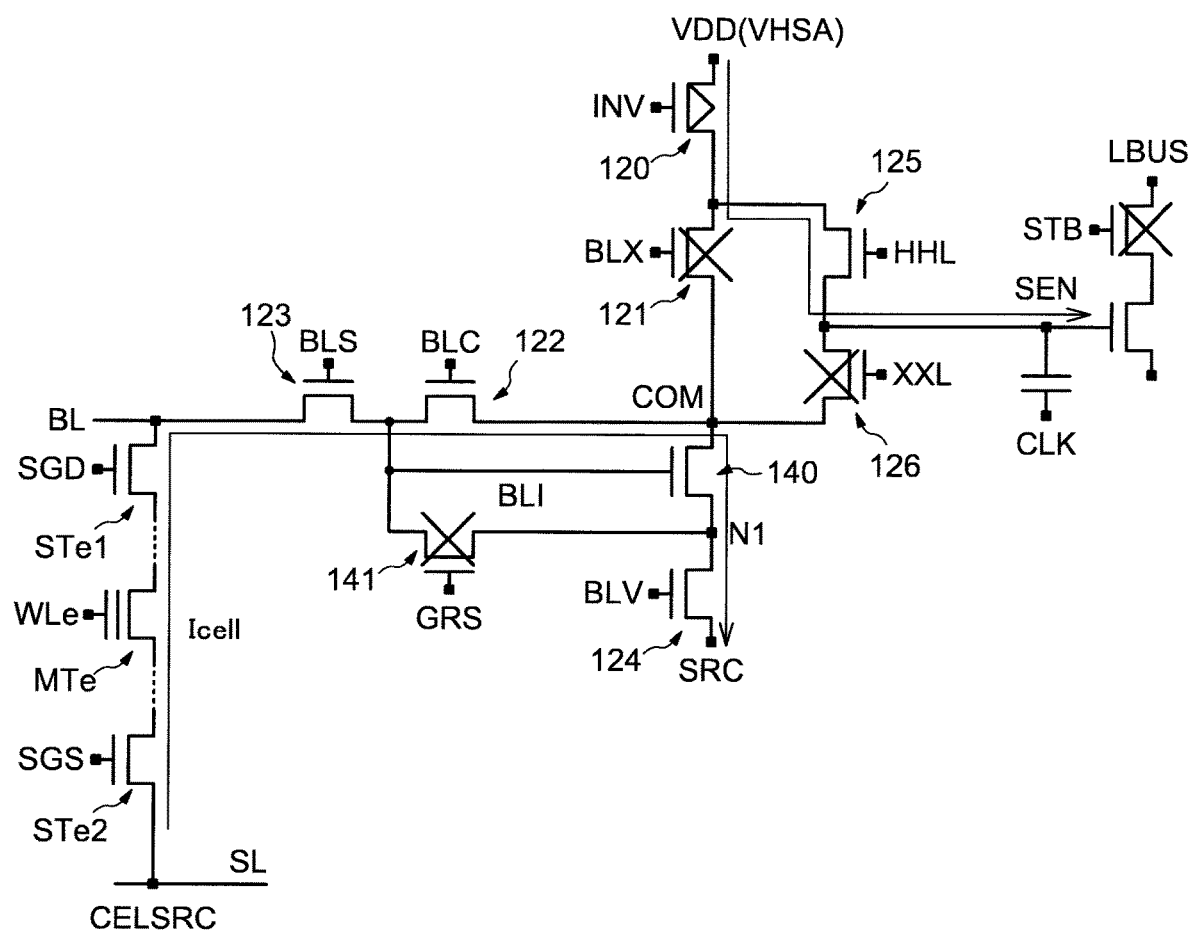
FIG. 33 is a circuit diagram for explaining a verify operation in a semiconductor memory device according to an embodiment.

As shown in FIG. 33, in the bit line stabilization period (b), the transistor 124 is switched to the ON state. Both a drain and a gate of the transistor 140 are connected to the bit line BL (the transistor 140 is diode connected) and the source of the transistor 140 is connected to the node SRC via the transistor 124. Thus, the transistor 140 is turned ON. In other words, current flows from the source line SL to the power supply line connected to the node SRC (the second power supply line), through the selection transistor STe2 (the second transistor), the memory cell transistor MTe (the first memory cells), the selection transistor STe1 (the first transistor), the transistor 123 (the tenth transistor), the transistor 122 (the ninth transistor), and the transistor 140 (the eleventh transistor).

According to the above configuration, a current Icell flowing through the memory cell transistor MTe flows from the cell source CELSRC to the node SRC. The current Icell is the current reflecting the status of the memory cell transistor MTe subject to the EP verify operation. Therefore, the current Icell is determined by the data held in the memory cell transistor MTe.

Consequently, as shown in FIG. 31, in the bit line stabilization period (b), the voltage after stabilization of the bit line BL varies depending on the data (ON cell or OFF cell) held in the memory cell transistor MTe. The current Icell passes through the diode-connected transistor 140. In the above configuration, since the source of the transistor 140 is connected to the gate of the transistor 140, the gate is supplied with the voltage required for the transistor 140 to flow the current Icell.

[3-2-3. BLI Holding Period (c)]

The BLI voltage holding period (c) will be described with reference to FIG. 31 and FIG. 34. As shown in FIG. 31, in the BLI voltage holding period (c), the signal supplied to BLC, BLS, HHL is switched from the ON signal to the OFF signal.

Figure 34:
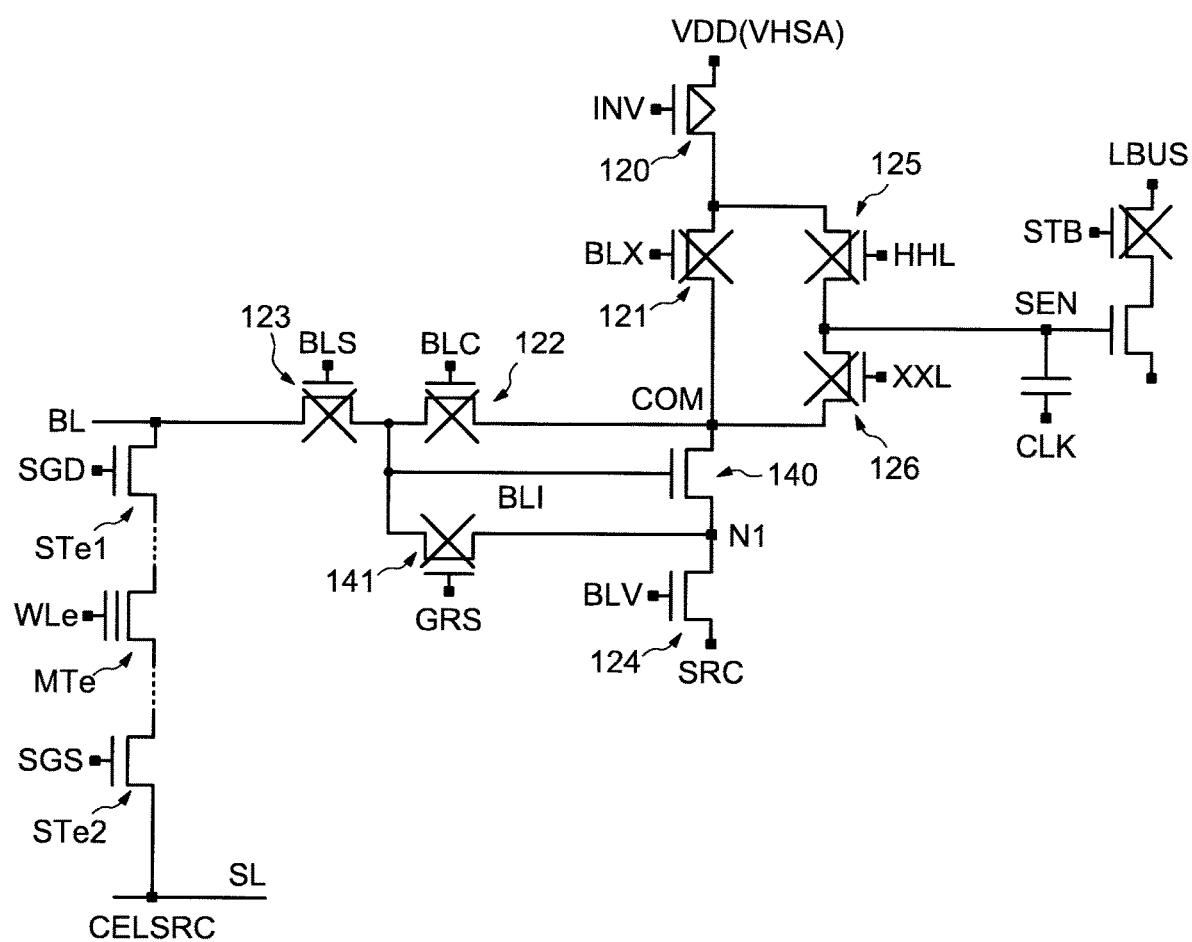
FIG. 34 is a circuit diagram for explaining a verify operation in a semiconductor memory device according to an embodiment.

As shown in FIG. 34, the transistors 122, 123 are switched to the OFF state. The node BLI is in a floating state because the transistor 141 is switched to the OFF state. In other words, since the transistor 122 (the ninth transistor) and the transistor 123 (the tenth transistor) are turned OFF, the potential of the gate of the transistor 140 (the eleventh transistor) is in a floating state. Consequently, the node BLI retains the voltage required for the transistor 140 to carry the current Icell. The node SEN also becomes a floating state by switching the transistor 125 to the OFF state. That is, the node SEN retains the voltage VHSA.

[3-2-4. SEN Discharging Period (d)]

The SEN discharge period (d) will be described with reference to FIG. 31 and FIG. 35. As shown in FIG. 31, in the SEN discharge period (d), the signal supplied to XXL is switched from the OFF signal to the ON signal. When the signals supplied to XXL are switched as described above, the voltage of SEN is gradually lowered from the voltage VHSA. When the signal supplied to XXL is switched from the ON signal to the OFF signal, the step-down of the voltage of the SEN stops. Specifically, the voltage (solid line) held in the node BLI when the memory cell transistor MTe is an ON cell is lower than the voltage (dotted line) held in the node BLI when the memory cell transistor MTe is an OFF cell. Compared to the case where the memory cell transistor MTe is an OFF cell, the voltage drop in the SEN is faster when the memory cell transistor MTe is an ON cell because the transistor 140 flows a relatively large amount of current. As a result, there is a difference in the amount of voltage drop of the SEN in the SEN discharge period (d) according to the state of the memory cell transistor MTe.

Figure 35:
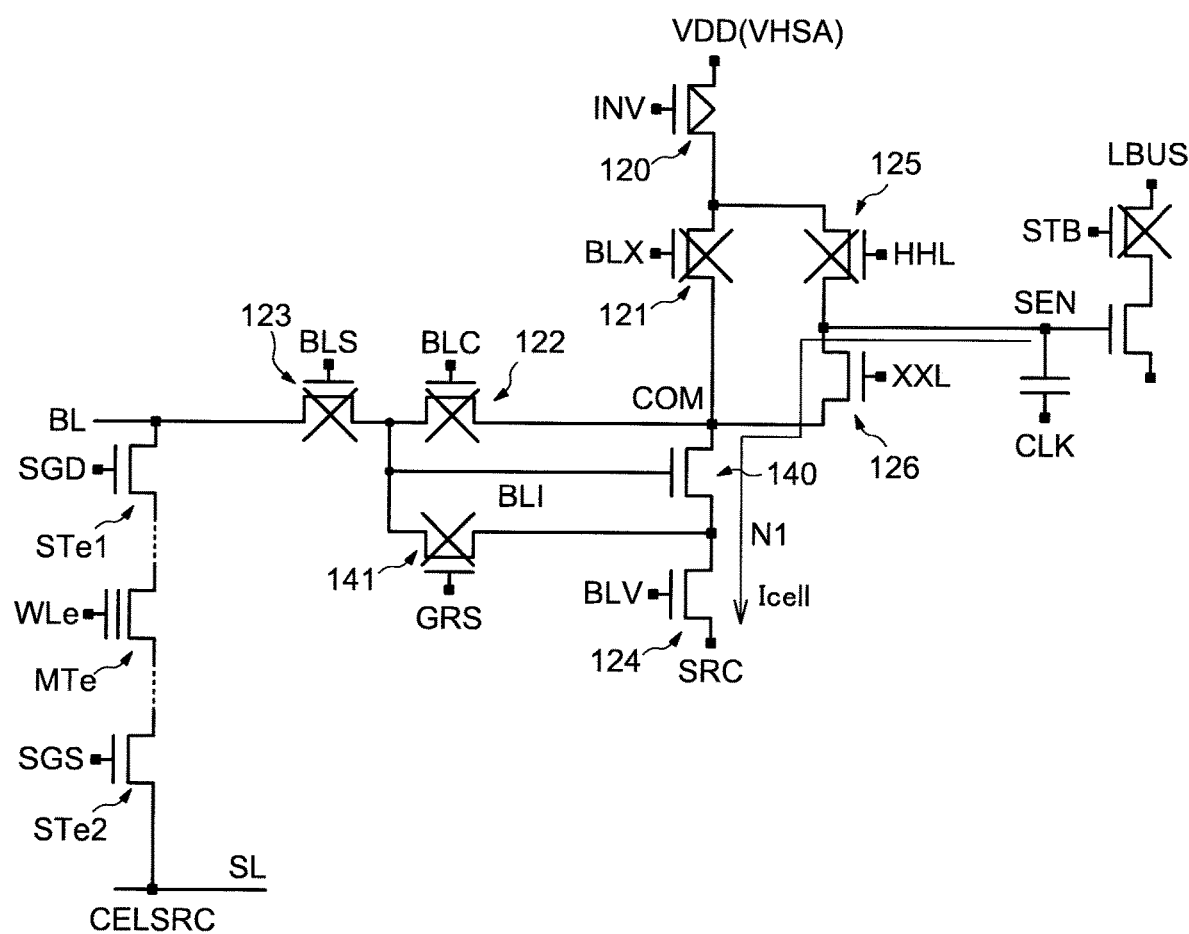
FIG. 35 is a circuit diagram for explaining a verify operation in a semiconductor memory device according to an embodiment.

As shown in FIG. 35, in the SEN discharge period (d), the transistor 126 is switched to the ON state. Since the voltage VHSA is held in the node SEN, the voltage VHSA is supplied to the node COM when the transistor 126 is turned ON. While the potential difference between the node COM and the node N1 is provided as a voltage between the source and drain of the transistor 140, the current flowing between the source and the drain is determined based on the voltage held at the node BLI as described above. Therefore, the current Icell flows through the transistor 140.

As described above, the current Icell is determined by the data held in the memory cell transistor MTe. Specifically, the current Icell is larger and the step-down rate of the node SEN per unit time is faster when the memory cell transistor MTe is an ON cell than when the memory cell transistor MTe is an OFF cell. As a result, there is a difference in the voltage held in the node SEN after the lapse of the SEN discharge period (d). Therefore, it is possible to determine whether the memory cell transistor MTe to be subjected to the EP verify operation is in the ON state or the OFF state by measuring the voltage of the node SEN after the elapse of the SEN discharge period (d) as follows.

[3-2-5. Read Period (e)]

Figure 36:
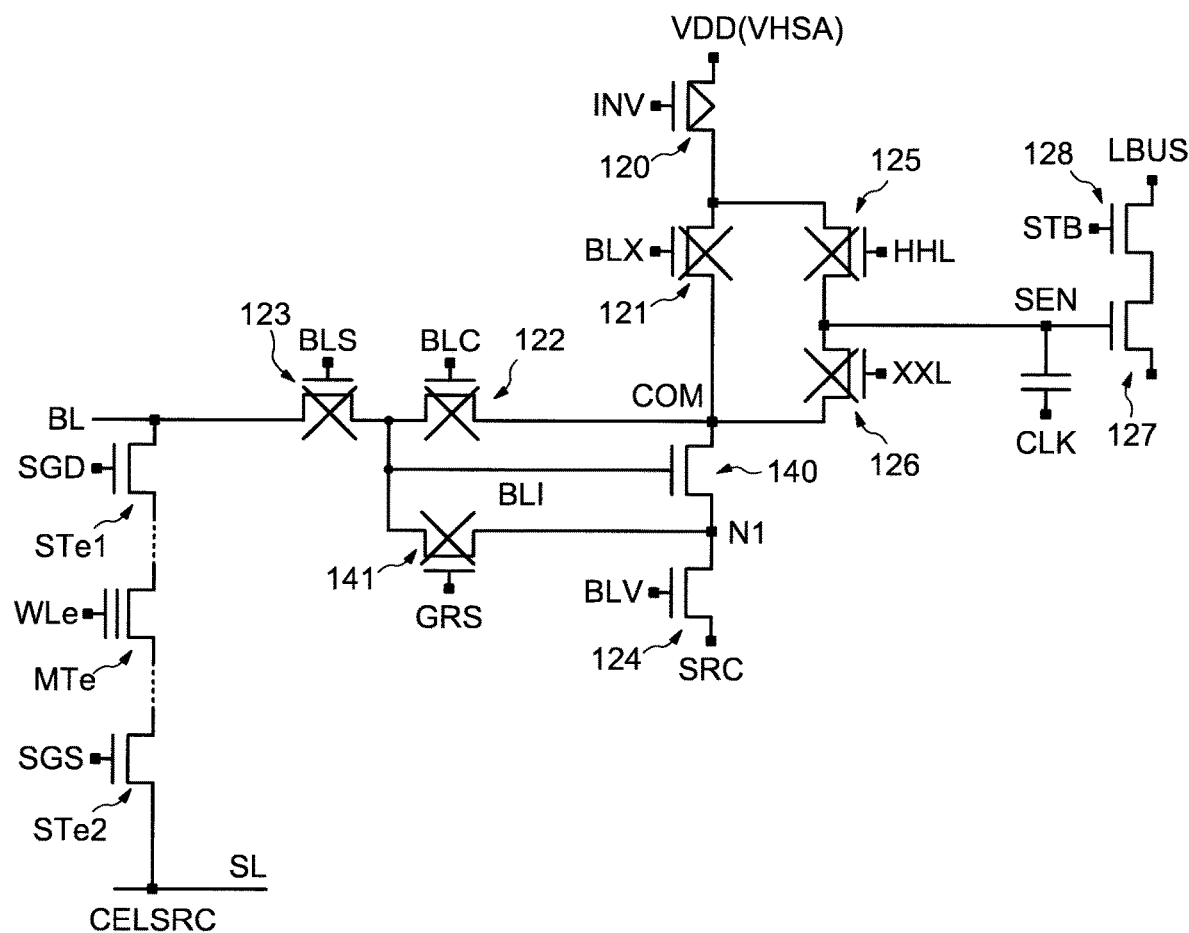
FIG. 36 is a circuit diagram for explaining a verify operation in a semiconductor memory device according to an embodiment.

The read period (e) will be described with reference to FIG. 31 and FIG. 36. As shown in FIG. 31, in the read period (e), the ON signal is supplied to STB. As shown in FIG. 36, VSS is supplied to an INV node (see FIG. 30) via the bus LBUS because the transistor 127 is in the ON state if the voltage of the node SEN is greater than the threshold of the transistor 127. On the other hand, if the voltage of the node SEN is less than the threshold of the transistor 127, the state of INV is maintained because the transistor 127 is in the OFF state. In this manner, the sense result is held by the latch circuit SDL shown in FIG. 30. By such an operation, the state (the ON state or the OFF state) of the target memory cell transistor MTe can be determined.

[3-2-6. Other]

In the EP verify operation described above, an ON signal is not supplied to GRS. For example, in the initialization period of the read operation, when releasing the charge stored in the bit line BL (i.e., when supplying a voltage VSS to the bit line BL), an ON signal is supplied to GRS. Specifically, the voltage VSS is supplied to the bit line BL by forcibly connecting the bit line BL and SRC by supplying an ON signal to GRS and BLV.

As described above, in the present embodiment, voltages can be supplied from the cell sources CELSRC to the bit lines BL. Therefore, it is possible to boost the bit line BL without changing the voltage supplied to the power line VDD. The boosting method according to the present embodiment may be executed for all of the first preliminary program operation to the third preliminary program operation, or may be executed for a part of the first preliminary program operation to the third preliminary program operation.

In the present embodiment, the configuration in which the EP verify operation is performed on the memory cell transistor MTe is exemplified. The same EP verify operation as described above can be performed on the memory cell transistor MTo.

4. Fourth Embodiment

A memory system according to a fourth embodiment will be described with reference to FIG. 37 to FIG. 38. In the fourth embodiment, similar to the second embodiment and the third embodiment, a specific configuration for realizing the EP operation shown in the first embodiment will be described.

4-1. Circuit Configuration of Sense Amplifier Unit

Since a circuit configuration of a sense amplifier according to the present embodiment is the same as the circuit configuration shown in FIG. 21, a description thereof will be omitted.

4-2. EP Verify Operation

The EP verify operation of the memory system according to the fourth embodiment will be described with reference to FIG. 37 and FIG. 38. FIG. 37 is a timing chart showing a verify operation in the semiconductor memory device according to an embodiment. FIG. 38 is a circuit diagram for explaining a verify operation in the semiconductor memory device according to an embodiment.

Figure 37:
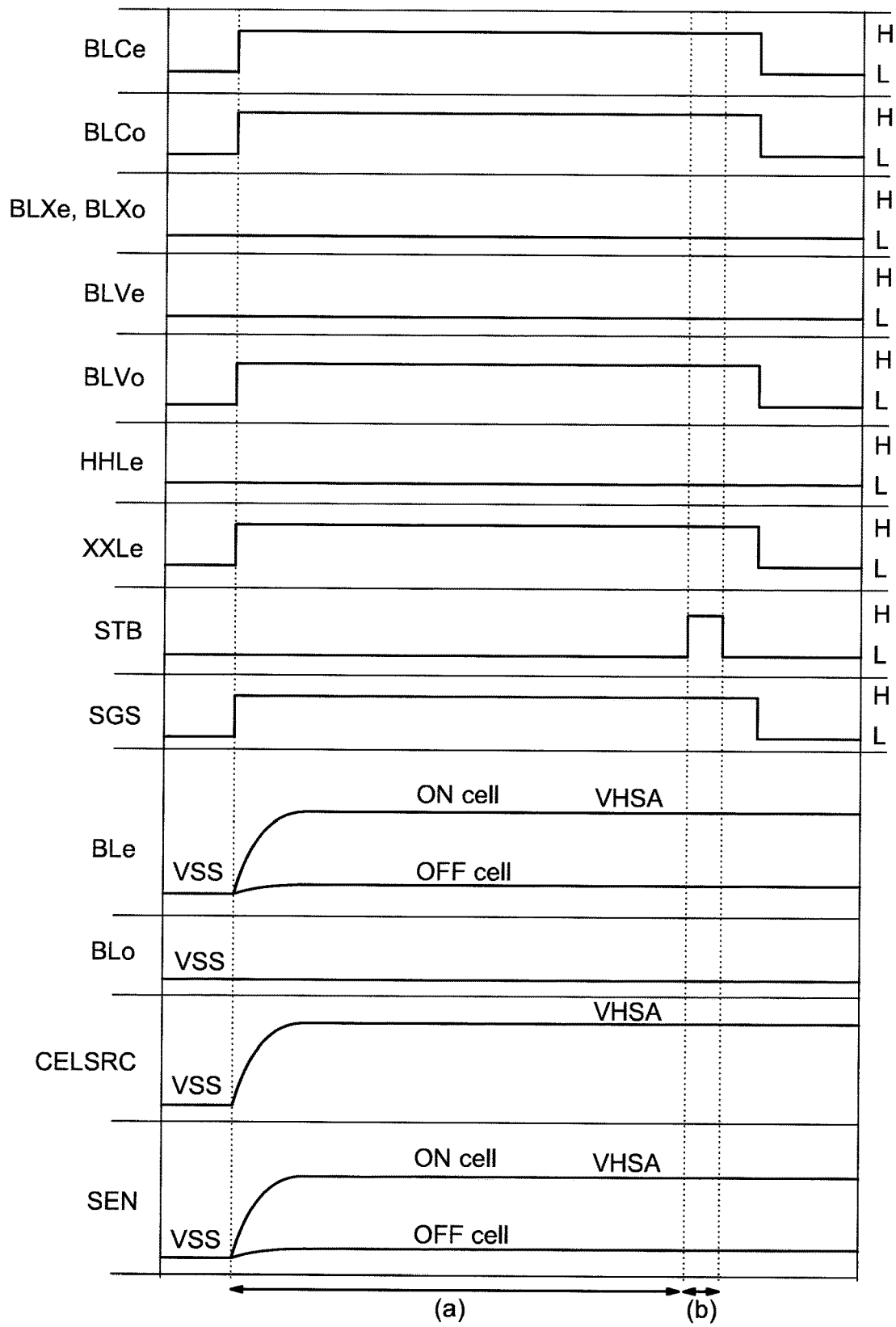
FIG. 37 is a timing chart showing a verify operation in a semiconductor memory device according to the embodiment.
Figure 38:
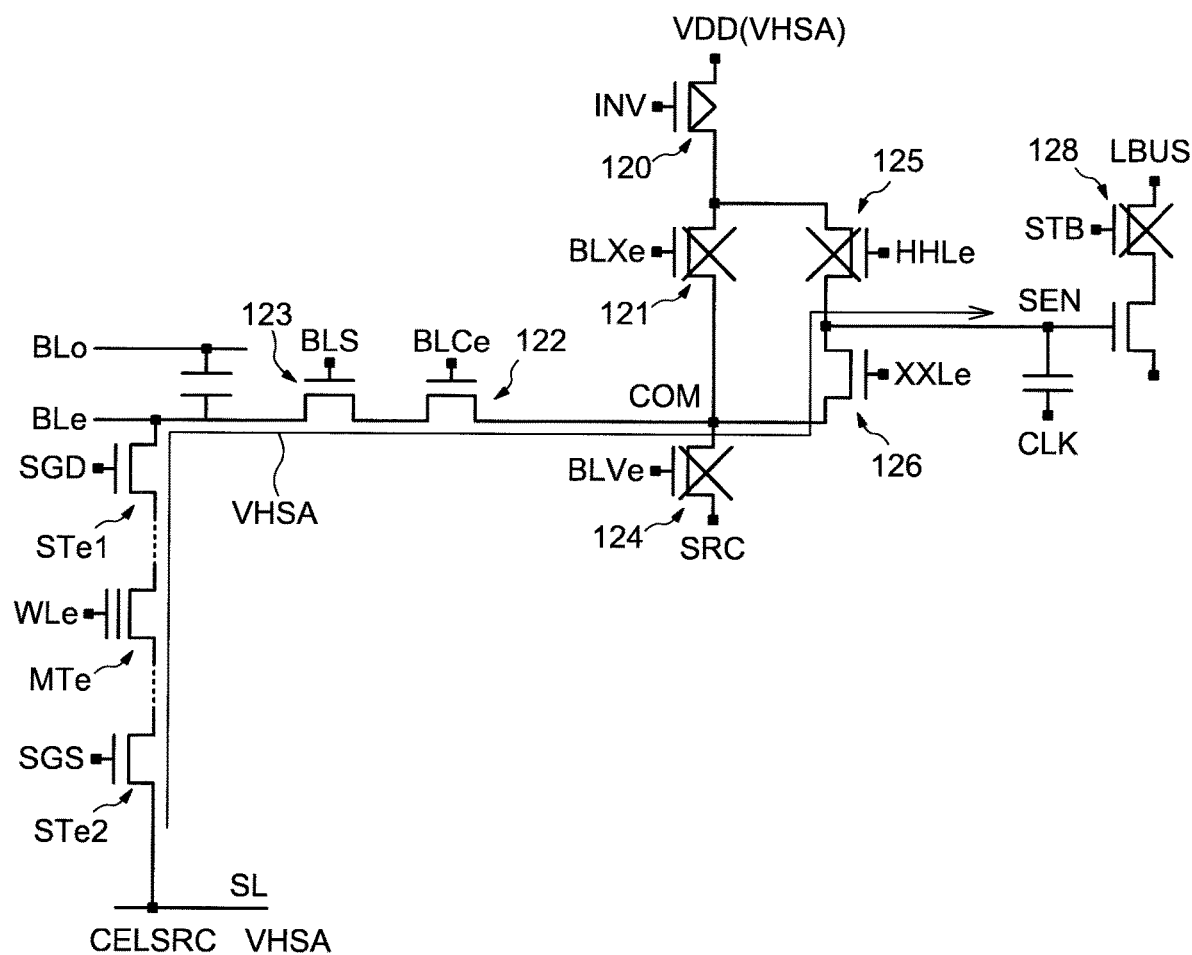
FIG. 38 is a circuit diagram for explaining a verify operation in a semiconductor memory device according to an embodiment.

The waveform of the signal BLCe, BLXe, BLVe, HHLe, XXLe, STB, and SGS shown in FIG. 37 shows a control signal supplied to the gate terminal of the transistor having the same reference numerals as the above signal in the circuit diagram of FIG. 38, respectively. The waveforms of the signal BLCo, BLXo, BLVo are control signals supplied to the transistors corresponding to the transistors 122, 121, 124 connected to the bit line BLo shown in FIG. 38, respectively. The waveforms of BLe, BLo, CELSRC, SEN of FIG. 37, and the adjacent bit lines BLe, BLo (e.g., BL0, BL1 of FIG. 4) in the circuit diagram of FIG. 38 respectively shows the voltage supplied to the bit line BLe, BLo and the node CELSRC, SEN adjacent to each other in the circuit diagram of FIG. 38. In the following embodiments, only the circuit connected to the bit line BLe is shown, and a circuit having the same configuration as the circuit mentioned above is connected to the bit line BLo.

As described below, the EP verify operation in the present embodiment includes a bit line and node SEN charge period and a read period. In the following EP verify operation, the voltage is supplied from the source line SL to the bit line BLe.

[4-2-1. Bit Line and Bode SEN Charging Period (a)]

The bit line and the node SEN charging period (a) will be described with reference to FIG. 37 and FIG. 38. As shown in FIG. 37, in the bit line node SEN charging period (a), the signal supplied to BLCe, XXLe, SGS is switched from the OFF signal to the ON signal, and the voltage supplied to the cell source CELSRC is switched from VSS to VHSA. According to the change in the voltage supplied to the cell source CELSRC, the voltage supplied to the bit line BLe and the node SEN also changes. However, the change varies depending on the status (ON cell or OFF cell) of the memory cell transistor MTe. In order to suppress the voltage of the bit line BLo adjacent to the bit line BLe from changing by capacitive coupling, the signal supplied to BLCo, BLVo is switched from the OFF signal to the ON signal, and the voltage VSS is supplied from SRC to the bit line BLo.

As shown in FIG. 38, the voltage VHSA is provided as the cell source CELSRC. The voltage VHSA supplied to the cell source CELSRC is transmitted to the node SEN via the strings (the select transistor STe1, STe2, and the memory cell transistor MTe), the bit lines BLe, and the transistors 123, 122, 126. Therefore, the voltage transmitted to the node SEN, when the memory cell transistor MTe of the target of the EP verify operation is an ON cell, is different from the voltage transmitted to the node SEN when the memory cell transistor MTe is an OFF cell.

Specifically, if the memory cell transistor MTe, which is a target memory cell transistor, is an ON cell, the voltage VHSA is supplied to the node SEN. Consequently, as shown in FIG. 37, as the cell source CELSRC is boosted from VSS to VHSA, the voltage supplied to the bit line BLe and the node SEN is boosted to VHSA. On the other hand, when the target memory cell transistor MTe is an OFF cell, the voltage VHSA supplied from the cell source CELSRC is stepped down by the voltage drop in the OFF state memory cell transistor MTe. As a result, as shown in FIG. 37, even if the cell source CELSRC is boosted from VSS to VHSA, the voltages supplied to the bit line BLe and the node SEN are not boosted or are only slightly boosted.

In the above configuration, the node SEN may be referred to as a "voltage sense node". In this case, it can be said that a voltage corresponding to the data held in the memory cell transistor MTe (the first memory cells) is supplied to the node SEN (the voltage sense node) connected to the bit line BLe (the first bit line).

[4-2-2. Read Period (b)]

The reading period (b) will be described with reference to FIG. 37 and FIG. 38. As shown in FIG. 37, in the read period (b), the ON signal is supplied to STB. As shown in FIG. 38, VSS is supplied to the INV node (see FIG. 21) via the bus LBUS because the transistor 127 is in the ON state if the voltage of the node SEN is greater than the threshold of the transistor 127. On the other hand, if the voltage of the node SEN is less than the threshold of the transistor 127, the state of INV is maintained because the transistor 127 is in the OFF state. In this manner, the sense result is held by, for example, the latch circuit SDL shown in FIG. 21. By such an operation, the state (the ON state or the OFF state) of the target memory cell transistor MTe, can be determined. In other words, the voltage of the node SEN (the voltage sense node) is sensed while being controlled so that a current flows from the source line SL to the node SEN (the voltage sense node) through the selection transistor STe2 (the second transistor), the memory cell transistor MTe (the first memory cells), and the select transistor STe1 (the first transistor).

As described above, in the present embodiment, voltages can be supplied from the cell sources CELSRC to the bit lines BL. Therefore, it is possible to boost the bit line BL without changing the voltage supplied to the power line VDD. The boosting method according to the present embodiment may be executed for all of the first preliminary program operation to the third preliminary program operation, or may be executed for a part of the first preliminary program operation to the third preliminary program operation.

In the present embodiment, the configuration in which the EP verify operation is performed on the memory cell transistor MTe is exemplified. The same EP verify operation as described above can be performed on the memory cell transistor MTo.

5. Fifth Embodiment

The memory system according to the fifth embodiment will be described with reference to FIG. 39. In the fifth embodiment, as in the second to fourth embodiments, a specific configuration for realizing the EP operation shown in the first embodiment will be described.

5-1. Circuit Configuration of Sense Amplifier Unit

Figure 39:
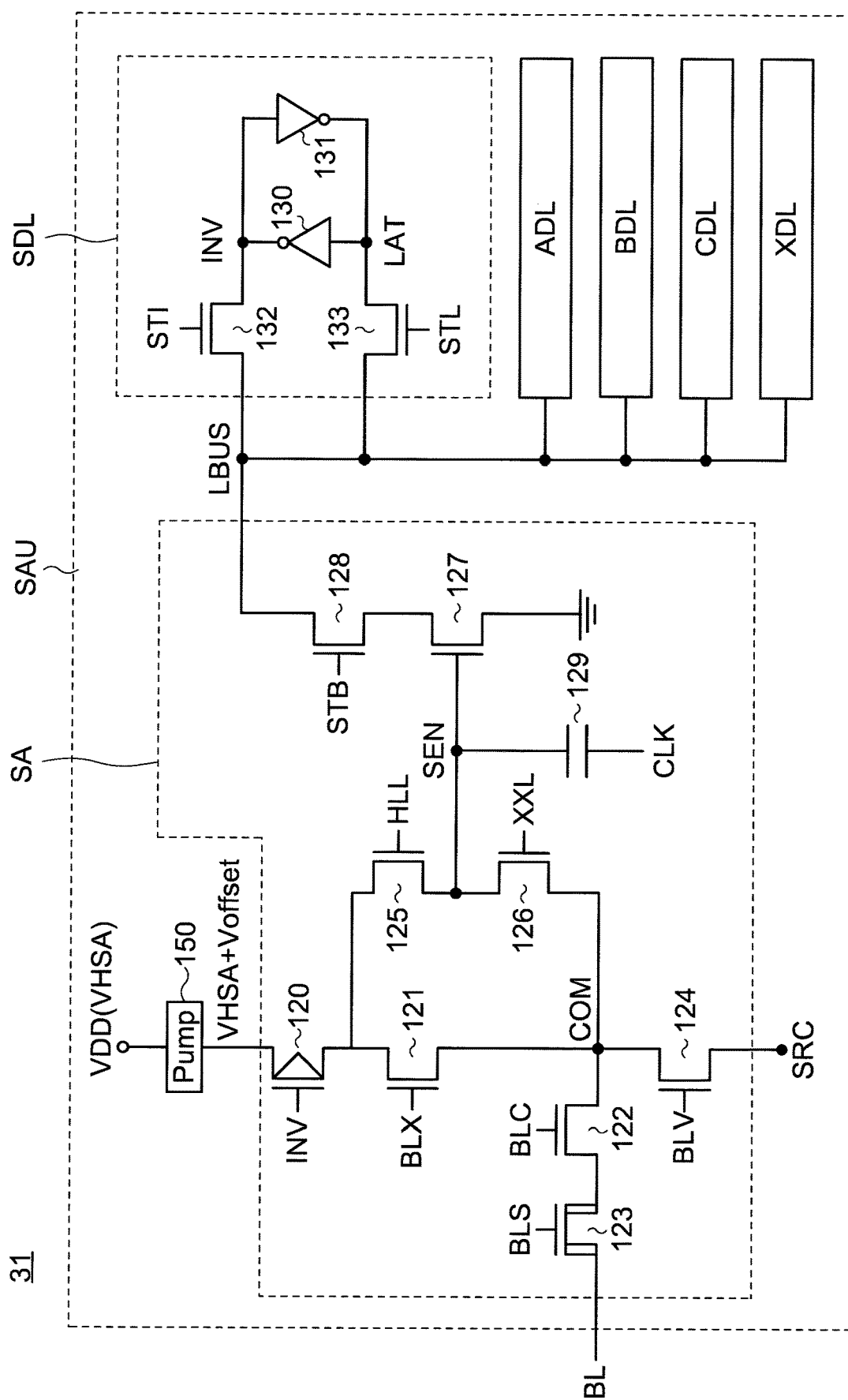
FIG. 39 is a diagram showing a circuit configuration of a sense amplifier of a semiconductor memory device according to an embodiment.

FIG. 39 is a diagram showing a circuit configuration of a sense amplifier of a semiconductor memory device according to an embodiment. Although the sense amplifier shown in FIG. 39 is similar to the sense amplifier shown in FIG. 21, it differs from the sense amplifier shown in FIG. 21 in that it includes a boost circuit (Pump) 150 between the power supply line VDD and the sense amplifier unit SA.

The boost circuit 150, in the EP verify operation, generates a voltage VHSA+Voffset based on the voltage VHSA supplied from the power supply line VDD, and supplies the voltage to the sense amplifier unit SA. On the other hand, in the verify operation and the read operation in the write operation, the boost circuit 150 supplies the voltage VHSA that is not boosted to the sense amplifier section SA. The "Voffset" described above corresponds to the "$\Delta V_{CS}$" of the EP operation in the first embodiment (see FIG. 16 to FIG. 18) in the same manner as the "VBST" described in the second embodiment.

In the EP verify operation in this embodiment, for example, when the first voltage "$V_{CS}+\Delta V_{CS}$" is supplied from the cell source CELSRC to the string in the same manner as in FIG. 24, the boost circuit 150 supplies "VHSA+$\Delta V_{CS}$" to the sense amplifier unit SA. For other operations, the operation method described in Japanese Patent Application No. 2017-142874 can be employed.

As described above, in the present embodiment, the voltage of the bit line BL can be boosted by supplying a voltage to the sense amplifier unit SA using the boost circuit 150. Therefore, it is possible to boost the bit line BL without changing the voltage supplied to the power line VDD. The boosting method according to the present embodiment may be executed for all of the first preliminary program operation to the third preliminary program operation, or may be executed for a part of the first preliminary program operation to the third preliminary program operation.

While the present invention has been described with reference to the accompanying drawings, the present invention is not limited to the above embodiments, and can be appropriately modified without departing from the spirit of the present invention. For example, a memory system of the present embodiment to which a person skilled in the art adds, deletes, or changes the design of components as appropriate based on the memory system of the present embodiment is also included in the scope of the present invention as long as the spirit of the present invention is provided. Furthermore, the embodiments described above can be appropriately combined as long as there is no mutual inconsistency, and technical matters common to the embodiments are included in the embodiments even if they are not explicitly described.

Even if it is other working effects which are different from the working effect brought about by the mode of each above-mentioned embodiment, what is clear from the description in this description, or what can be easily predicted by a person skilled in the art is naturally understood to be brought about by the present invention.

What is claimed is:

1. A memory system, comprising:
a first bit line;
a source line extending in a first direction and a second direction intersecting the first direction;
i-layers, wherein i is an integer equal to or larger than 2, of first word lines adjacent to the source line in a third direction intersecting the first direction and the second direction, the first word lines being stacked in the third direction;
i-layers of second word lines adjacent to the source line in the third direction, the second word lines being stacked in the third direction, positions of i-layers of the second word lines being identical to positions of i-layers of the first word lines in the third direction, respectively;
a first memory pillar between the first word lines and the second word lines, the first memory pillar extending in the third direction, including a first semiconductor layer connected to the first bit line and the source line; and
a control circuit, wherein
the first memory pillar includes a first string provided in a first side of the first memory pillar and a second string provided in a second side of the first memory pillar,
the first string is provided between the first bit line and the source line, and includes a first transistor, a second transistor closer to the source line than the first transistor and i-first memory cells,
the i-first memory cells are provided between the first transistor and the second transistor,
the first transistor, the second transistor, and the i-first memory cells are electrically connected in series,
the i-first memory cells are electrically connected in series, are arranged along the third direction, and are connected to the i-first word lines, respectively,
the second string is provided between the first bit line and the source line, and includes a third transistor, a fourth transistor, and i-second memory cells,
the i-second memory cells are provided between the third transistor and the fourth transistor,
the third transistor, the fourth transistor, and the i-second memory cells are electrically connected in series,
the i-second memory cells are electrically connected in series, are arranged along the third direction, and are connected to the i-second word lines, respectively,
the i-first memory cells and the i-second memory cells share the first semiconductor layer,
the control circuit is configured to
perform a first verify operation to one of the first memory cells and one of the second memory cells corresponding thereto while supplying a first voltage to the source line after a first program operation is performed to the one of the first memory cells and the one of the second memory cells,
perform a second verify operation to the one of the first memory cells while supplying a second voltage to the source line after a second program operation is performed to the one of the first memory cells,
perform a third verify operation to the one of the second memory cells while supplying a third voltage to the source line after a third program operation is performed to the one of the second memory cells, and perform, in accordance with a request from an external device, a write operation or a read operation to the one of the first memory cells or the one of the second memory cells while supplying a fourth voltage lower than the first voltage, the second voltage and the third voltage to the source line, the first memory pillar includes a columnar-shaped semiconductor layer including a first part belonging to the first string and a second part belonging to the second string, and channels of the i-first memory cells and channels of the i-second memory cells share parts of the first memory pillar, wherein the memory system further comprises:
a second bit line adjacent to the first bit line;
i-layers of third word lines adjacent to the source line in the third direction, the third word lines being stacked in the third direction;
i-layers of fourth word lines adjacent to the source line in the third direction, the fourth word lines being stacked in the third direction, positions of i-layers of the third word lines being identical to positions of i-layers of the fourth word lines in the third direction, respectively; and
a second memory pillar between the third word lines and the fourth word lines, the second memory pillar extending in the third direction, and including a second semiconductor layer connected to the second bit line and the source line, wherein the second memory pillar includes a third string provided in a third side of the second memory pillar and a fourth string provided in a fourth side of the second memory pillar, the third string is provided between the second bit line and the source line, and includes a fifth transistor, a sixth transistor, and i-third memory cells, the i-third memory cells are provided between the fifth transistor and the sixth transistor, the fifth transistor, the sixth transistor, and the i-third memory cells are electrically connected in series, the i-third memory cells are electrically connected in series, are arranged along the third direction, and are connected to the i-third word lines, respectively, the fourth string is provided between the second bit line and the source line, and includes a seventh transistor, an eighth transistor, and i-fourth memory cells, the i-fourth memory cells are provided between the seventh transistor and the eighth transistor, the seventh transistor, the eighth transistor, and the i-fourth memory cells are electrically connected in series, the i-fourth memory cells are electrically connected in series, are arranged along the third direction, and are connected to the i-fourth word lines, respectively, the i-third memory cells and the i-fourth memory cells share the second semiconductor layer, and the control circuit is further configured to
boost a voltage of the first bit line by boosting a voltage of the second bit line while maintaining a potential of the first bit line in a floating state, and
perform at least one of the first verify operation, the second verify operation, and the third verify operation.

2. The memory system according to claim 1, wherein the control circuit is further configured to
control the one of the second memory cells into a non-conductive state while the second program operation and the second verify operation are performed to the one of the first memory cells, and
control the one of the first memory cells into a non-conductive state while the third program operation and the third verify operation are performed to the one of the second memory cells.

3. The memory system according to claim 1, wherein
the first program operation is a program operation configured to operate to reduce a width of a threshold voltage distribution in an erase state of the one of the first memory cells and the one of the second memory cells,
the second program operation is a program operation configured to operate to reduce a width of a threshold voltage distribution in an erase state of each of the first memory cells, and
the third program operation is a program operation configured to operate to reduce a width of a threshold voltage distribution in an erase state of each of the second memory cells.

4. The memory system according to claim 1, wherein the control circuit is further configured to perform
a fourth program operation to the one of the first memory cells and the one of the second memory cells corresponding thereto after the third verify operation is performed, and
a fourth verify operation to the one of the first memory cells and the one of the second memory cells while supplying the fourth voltage to the source line.

5. The memory system according to claim 1, further comprising a sense amplifier unit connected to the first bit line, wherein
the sense amplifier unit includes a ninth transistor connected in series between the first bit line and a power supply line connected to the sense amplifier unit, and
the control circuit is further configured to maintain a potential of the first bit line in a floating state by turning the second transistor and the ninth transistor to an OFF state.

6. The memory system according to claim 5, wherein the control circuit is further configured to:
supply a voltage different from the first bit line to the source line while controlling the second transistor to an OFF state,
turn the second transistor on while maintaining a voltage of the boosted first bit line, and
supply a control signal to a gate of the ninth transistor, the control signal determining an ON state or an OFF state of the ninth transistor in accordance with data stored by the first memory cell or the second memory cell.

7. The memory system according to claim 1, wherein the control circuit is further configured to perform at least one of the first verify operation, the second verify operation, and the third verify operation by supplying a voltage from the source line to the first bit line.

8. A memory system, comprising:
a first bit line;
a source line extending in a first direction and a second direction intersecting the first direction;
i-layers, wherein i is an integer equal to or larger than 2, of first word lines adjacent to the source line in a third direction intersecting the first direction and the second direction, the first word lines being stacked in the third direction;
i-layers of second word lines adjacent to the source line in the third direction, the second word lines being stacked in the third direction, positions of i-layers of the second word lines being identical to positions of i-layers of the first word lines in the third direction, respectively;

a first memory pillar between the first word lines and the second word lines, the first memory pillar extending in the third direction, including a first semiconductor layer connected to the first bit line and the source line; and a control circuit, wherein the first memory pillar includes a first string provided in a first side of the first memory pillar and a second string provided in a second side of the first memory pillar, the first string is provided between the first bit line and the source line, and includes a first transistor, a second transistor closer to the source line than the first transistor and i-first memory cells, the i-first memory cells are provided between the first transistor and the second transistor, the first transistor, the second transistor, and the i-first memory cells are electrically connected in series, the i-first memory cells are electrically connected in series, are arranged along the third direction, and are connected to the i-first word lines, respectively, the second string is provided between the first bit line and the source line and includes a third transistor, a fourth transistor, and i-second memory cells, the i-second memory cells are provided between the third transistor and the fourth transistor, the third transistor, the fourth transistor, and the i-second memory cells are electrically connected in series, the i-second memory cells are electrically connected in series, are arranged along the third direction, and are connected to the i-second word lines, respectively, the i-first memory cells and the i-second memory cells share the first semiconductor layer, the control circuit is configured to
  perform a first verify operation to one of the first memory cells and one of the second memory cells corresponding thereto while supplying a first voltage to the source line after a first program operation is performed to the one of the first memory cells and the one of the second memory cells,
  perform a second verify operation to the one of the first memory cells while supplying a second voltage to the source line after a second program operation is performed to the one of the first memory cells,
  perform a third verify operation to the one of the second memory cells while supplying a third voltage to the source line after a third program operation is performed to the one of the second memory cells, and
  perform, in accordance with a request from an external device, a write operation or a read operation to the one of the first memory cells or the one of the second memory cells while supplying a fourth voltage lower than the first voltage, the second voltage and the third voltage to the source line,
  the first memory pillar includes a columnar-shaped semiconductor layer including a first part belonging to the first string and a second part belonging to the second string, and
  channels of the i-first memory cells and channels of the i-second memory cells share parts of the first memory pillar, wherein the control circuit is further configured to perform at least one of the first verify operation, the second verify operation, and the third verify operation by supplying a voltage from the source line to the first bit line, wherein the memory system further comprises a sense amplifier unit connected to the first bit line, wherein the sense amplifier unit includes
  a ninth transistor and a tenth transistor connected in series between the first bit line and a first power supply line connected to the sense amplifier unit, and
  an eleventh transistor connected in series between the first power supply line and a second power supply line supplying a voltage different from the first power supply line, wherein a gate of the eleventh transistor is connected to a node between the ninth transistor and the tenth transistor, and a drain of the eleventh transistor is connected to a source of the ninth transistor.

9. The memory system according to claim 8, wherein the control circuit is further configured to:
  perform a control so that a current flows from the source line to the second power supply line through the second transistor, the first memory cell, the first transistor, the tenth transistor, the ninth transistor and the eleventh transistor, and
  maintain a potential of a gate of the eleventh transistor in a floating state by turning the ninth transistor and the tenth transistor to an OFF state.

10. The memory system according to claim 7, further comprising a sense amplifier unit connected to the first bit line and including a voltage sense node to be supplied with a voltage in accordance with data stored by the one of the first memory cells,
  wherein the control circuit is further configured to sense a voltage of the voltage sense node while controlling a current flowing from the source line to the voltage sense node through the second transistor, the one of the first memory cells, and the first transistor.

11. A memory system, comprising:
  a first bit line;
  a source line extending in a first direction and a second direction intersecting the first direction;
  i-layers, wherein i is an integer equal to or larger than 2, of first word lines adjacent to the source line in a third direction intersecting the first direction and the second direction, the first word lines being stacked in the third direction;
  i-layers of second word lines adjacent to the source line in the third direction, the second word lines being stacked in the third direction, positions of i-layers of the second word lines being identical to positions of i-layers of the first word lines in the third direction, respectively;
  a first memory pillar between the first word lines and the second word lines, the first memory pillar extending in the third direction, including a first semiconductor layer connected to the first bit line and the source line; and
  a control circuit, wherein
  the first memory pillar includes a first string provided in a first side of the first memory pillar and a second string provided in a second side of the first memory pillar,
  the first string is provided between the first bit line and the source line, and includes a first transistor, a second transistor closer to the source line than the first transistor and i-first memory cells,
  the i-first memory cells are provided between the first transistor and the second transistor,
  the first transistor, the second transistor, and the i-first memory cells are electrically connected in series, the i-first memory cells are electrically connected in series, are arranged along the third direction, and are connected to the i-first word lines, respectively, the second string is provided between the first bit line and the source line, and includes a third transistor, a fourth transistor, and i-second memory cells, the i-second memory cells are provided between the third transistor and the fourth transistor, the third transistor, the fourth transistor, and the i-second memory cells are electrically connected in series, the i-second memory cells are electrically connected in series, are arranged along the third direction, and are connected to the i-second word lines, respectively, the i-first memory cells and the i-second memory cells share the first semiconductor layer, the control circuit is configured to
- perform a first verify operation to one of the first memory cells and one of the second memory cells corresponding thereto while supplying a first voltage to the source line after a first program operation is performed to the one of the first memory cells and the one of the second memory cells,
- perform a second verify operation to the one of the first memory cells while supplying a second voltage to the source line after a second program operation is performed to the one of the first memory cells,
- perform a third verify operation to the one of the second memory cells while supplying a third voltage to the source line after a third program operation is performed to the one of the second memory cells, and
- perform, in accordance with a request from an external device, a write operation or a read operation to the one of the first memory cells or the one of the second memory cells while supplying a fourth voltage lower than the first voltage, the second voltage and the third voltage to the source line, the first memory pillar includes a columnar-shaped semiconductor layer including a first part belonging to the first string and a second part belonging to the second string, and channels of the i-first memory cells and channels of the i-second memory cells share parts of the first memory pillar, wherein the memory system further comprises:
- a sense amplifier unit connected to the first bit line; and
- a charge pump circuit provided between the sense amplifier unit and a first power supply line, and wherein the charge pump circuit is configured to supply a voltage higher than a voltage supplied to the first power supply line to the sense amplifier unit when the first voltage, the second voltage, or the third voltage is supplied to the source line.

12. A memory system, comprising:

a first bit line;

a source line extending in a first direction and a second direction intersecting the first direction;

i-layers, wherein i is an integer equal to or larger than 2, of first word lines adjacent to the source line in a third direction intersecting the first direction and the second direction, the first word lines being stacked in the third direction;

i-layers of second word lines adjacent to the source line in the third direction, the second word lines being stacked in the third direction, positions of i-layers of the second word lines being identical to positions of i-layers of the first word lines in the third direction, respectively;

a first memory pillar between the first word lines and the second word lines, the first memory pillar extending in the third direction, including a first semiconductor layer connected to the first bit line and the source line; and a control circuit, wherein the first memory pillar includes a first string provided in a first side of the first memory pillar and a second string provided in a second side of the first memory pillar, the first string is provided between the first bit line and the source line, and includes a first transistor, a second transistor closer to the source line than the first transistor and i-first memory cells, the i-first memory cells are provided between the first transistor and the second transistor, the first transistor, the second transistor, and the i-first memory cells are electrically connected in series, the i-first memory cells are electrically connected in series, are arranged along the third direction, and are connected to the i-first word lines, respectively, the second string is provided between the first bit line and the source line, and includes a third transistor, a fourth transistor, and i-second memory cells, the i-second memory cells are provided between the third transistor and the fourth transistor, the third transistor, the fourth transistor, and the i-second memory cells are electrically connected in series, the i-second memory cells are electrically connected in series, are arranged along the third direction, and are connected to the i-second word lines, respectively, the i-first memory cells and the i-second memory cells share the first semiconductor layer, the control circuit is configured to
- perform a first verify operation to one of the first memory cells and one of the second memory cells corresponding thereto while supplying a first voltage to the source line after a first program operation is performed to the one of the first memory cells and the one of the second memory cells,
- perform a second verify operation to the one of the first memory cells while supplying a second voltage to the source line after a second program operation is performed to the one of the first memory cells,
- perform a third verify operation to the one of the second memory cells while supplying a third voltage to the source line after a third program operation is performed to the one of the second memory cells, and
- perform, in accordance with a request from an external device, a write operation or a read operation to the one of the first memory cells or the one of the second memory cells while supplying a fourth voltage lower than the first voltage, the second voltage and the third voltage to the source line, wherein the memory system further includes
- a sense amplifier unit connected to the first bit line; and
- a charge pump circuit provided between the sense amplifier unit and a first power supply line, and wherein the charge pump circuit is configured to supply a voltage higher than a voltage supplied to the first power supply line to the sense amplifier unit when the first voltage, the second voltage, or the third voltage is supplied to the source line.

\* \* \* \* \*